(12) United States Patent
Nagatsuka et al.

(10) Patent No.: US 9,048,105 B2
(45) Date of Patent: Jun. 2, 2015

(54) SEMICONDUCTOR INTEGRATED CIRCUIT

(75) Inventors: Shuhei Nagatsuka, Kanagawa (JP); Yuto Yakubo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 369 days.

(21) Appl. No.: 13/472,708

(22) Filed: May 16, 2012

(65) Prior Publication Data

US 2012/0292680 A1 Nov. 22, 2012

(30) Foreign Application Priority Data

May 20, 2011 (JP) ................................. 2011-113651

(51) Int. Cl.
*H01L 27/108* (2006.01)
*H01L 27/06* (2006.01)
*H01L 27/12* (2006.01)
*H01L 27/105* (2006.01)

(52) U.S. Cl.
CPC ............ *H01L 27/06* (2013.01); *H01L 27/1225* (2013.01); *H01L 27/1052* (2013.01)

(58) Field of Classification Search
CPC ...................... H01L 27/1025; H01L 27/10805; H01L 27/10847; H01L 27/11206
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,043,521 A * | 3/2000 | Shibutani et al. ............. 257/206 |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Kyoung Lee
(74) *Attorney, Agent, or Firm* — Fish & Richardson P.C.

(57) ABSTRACT

To reduce power consumption of a memory device. To reduce the area of a memory device. To reduce the number of transistors included in a memory device. The memory device includes a comparator comparing a first output signal with a second output signal, a first memory portion including a first oxide semiconductor transistor and a first silicon transistor, a second memory portion including a second oxide semiconductor transistor and a second silicon transistor, and an output potential determiner determining a potential of the first output signal and a potential of the second output signal. One of a source and a drain of the first oxide semiconductor transistor is electrically connected to a gate of the first silicon transistor. One of a source and a drain of the second oxide semiconductor transistor is electrically connected to a gate of the second silicon transistor.

23 Claims, 39 Drawing Sheets

(56) References Cited

U.S. PATENT DOCUMENTS

| | | | |
|---|---|---|---|
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0101351 A1 | 5/2011 | Yamazaki |
| 2011/0102018 A1 | 5/2011 | Shionoiri et al. |
| 2011/0121878 A1 | 5/2011 | Kato et al. |
| 2011/0148463 A1 | 6/2011 | Kato et al. |
| 2011/0187410 A1 | 8/2011 | Kato et al. |
| 2011/0249487 A1 | 10/2011 | Saito et al. |
| 2011/0254523 A1 | 10/2011 | Ito et al. |
| 2012/0033510 A1 | 2/2012 | Nagatsuka et al. |
| 2012/0049889 A1 | 3/2012 | Hatano |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-236355 A | 9/2005 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-Bo Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al. "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 IN. QVGA AMOLED Display Using In—Ga—Zn—Oxide TFTS With a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTs and Their Application for Large Size AMOLED." AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by The Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Mohamed W. Allam et al., "Dynamic Current Mode Logic (DyCML): A New Low-Power High-Performance Logic Style", IEEE Journal of Solid-State Circuits, Mar. 1, 2001, vol. 36, No. 3, pp. 550-558.

\* cited by examiner

● In
☾ Sn
ᴗ Zn
• O

● In
● Ga
● Zn
● O

● : In
○ : Ga or Zn
● : O

● : In
○ : Ga
○ : Zn
● : O

SEMICONDUCTOR INTEGRATED CIRCUIT

BACKGROUND OF THE INVENTION

1. Field of the Invention

One embodiment of the disclosed invention relates to a semiconductor integrated circuit including an oxide semiconductor layer.

2. Description of the Related Art

Signal processing units such as central processing units (CPUs) vary in structure depending on the intended use. The signal processing unit generally has a main memory for storing data or program and other memory circuits such as a register and a cache memory. The register has a function of temporarily holding a data signal to carry out arithmetic processing, holding a program execution state, or the like. The cache memory, which is located between the arithmetic unit and the main memory, is provided to reduce access to the low-speed main memory and speed up the arithmetic processing.

A latch circuit is used as a circuit included in the register (see Patent Document 1). As an example of a specific configuration of a latch circuit, a latch circuit including two clocked inverters and one inverter can be given, for example.

A latch circuit including a ferroelectric capacitor is known (see Patent Document 1).

REFERENCE

[Patent Document 1] Japanese Published Patent Application No. 2005-236355

SUMMARY OF THE INVENTION

There is a plurality of paths of leakage current between a power supply potential Vx that is a high-level reference potential and a low-level reference potential (e.g., a ground potential GND) in the latch circuit. Thus, power consumption is high when the latch circuit is in a standby state.

In view of the problem, an object of one embodiment of the disclosed invention is to reduce power consumption in a memory device.

Another object of one embodiment of the disclosed invention is to reduce the area of a memory device.

Further, another object of one embodiment of the disclosed invention is to reduce the number of transistors included in a memory device.

A memory device of one embodiment of the disclosed invention includes a first transistor, a second transistor, a third transistor, a fourth transistor, a fifth transistor, a sixth transistor, a seventh transistor, an eighth transistor, and a ninth transistor.

As the first transistor and the second transistor, transistors whose channels are formed in oxide semiconductor layers (oxide semiconductor transistors) are used, for example. The oxide semiconductor transistor has an advantage of an extremely small leakage current (also referred to as off-state current). Note that the oxide semiconductor transistor is an n-channel transistor.

As the third transistor, the fourth transistor, the fifth transistor, the sixth transistor, the seventh transistor, the eighth transistor, and the ninth transistor, transistors whose channels are formed in silicon layers (silicon transistors) are used, for example. As the third transistor, the fourth transistor, the fifth transistor, and the sixth transistor, p-channel transistors are used. As the seventh transistor, the eighth transistor, and the ninth transistor, n-channel transistors are used.

A gate of the first transistor is supplied with a signal CLKB whose phase is the inverse of that of a clock signal CLK and is electrically connected to a gate of the second transistor. One of a source and a drain of the first transistor is supplied with an input signal A. The other of the source and the drain of the first transistor is electrically connected to a gate of the seventh transistor. Note that a connection portion between the other of the source and the drain of the first transistor and the gate of the seventh transistor is a node M1.

A gate of the second transistor is supplied with the signal CLKB whose phase is the inverse of that of the clock signal CLK and is electrically connected to the gate of the first transistor. One of a source and a drain of the second transistor is supplied with a signal AB whose phase is the inverse of that of the input signal A. The other of the source and the drain of the second transistor is electrically connected to a gate of the eighth transistor. Note that a connection portion between the other of the source and the drain of the second transistor and the gate of the eighth transistor is a node M2.

A gate of the third transistor is supplied with the clock signal CLK. One of a source and a drain of the third transistor is supplied with a power supply potential and is electrically connected to one of a source and a drain of the fourth transistor, one of a source and a drain of the fifth transistor, and one of a source and a drain of the sixth transistor. The other of the source and the drain of the third transistor outputs an output signal OUT2. The other of the source and the drain of the third transistor is electrically connected to the other of the source and the drain of the fourth transistor, a gate of the fifth transistor, and one of a source and a drain of the seventh transistor.

A gate of the fourth transistor outputs an output signal OUT1. The gate of the fourth transistor is electrically connected to the other of the source and the drain of the fifth transistor, the other of the source and the drain of the sixth transistor, and one of a source and a drain of the eighth transistor. One of a source and a drain of the fourth transistor is supplied with the power supply potential and is electrically connected to the one of the source and the drain of the third transistor, the one of the source and the drain of the fifth transistor, and the one of the source and the drain of the sixth transistor. The other of the source and the drain of the fourth transistor outputs the output signal OUT2. The other of the source and the drain of the fourth transistor is electrically connected to the other of the source and the drain of the third transistor, the gate of the fifth transistor, and the one of the source and the drain of the seventh transistor.

A gate of the fifth transistor outputs the output signal OUT2. The gate of the fifth transistor is electrically connected to the other of the source and the drain of the third transistor, the other of the source and the drain of the fourth transistor, and the one of the source and the drain of the seventh transistor. The one of the source and the drain of the fifth transistor is supplied with the power supply potential and is electrically connected to the one of the source and the drain of the third transistor, the one of the source and the drain of the fourth transistor, and the one of the source and the drain of the sixth transistor. The other of the source and the drain of the fifth transistor outputs the output signal OUT1. The other of the source and the drain of the fifth transistor is electrically connected to the gate of the fourth transistor, the other of the source and the drain of the sixth transistor, and the one of the source and the drain of the eighth transistor.

A gate of the sixth transistor is supplied with the clock signal CLK. The one of the source and the drain of the sixth transistor is supplied with the power supply potential and is electrically connected to the one of the source and the drain of the third transistor, the one of the source and the drain of the fourth transistor, and the one of the source and the drain of the fifth transistor. The other of the source and the drain of the sixth transistor outputs the output signal OUT1. The other of the source and the drain of the sixth transistor is electrically connected to the gate of the fourth transistor, the other of the source and the drain of the fifth transistor, and the one of the source and the drain of the eighth transistor.

The gate of the seventh transistor is electrically connected to the other of the source and the drain of the first transistor. The one of the source and the drain of the seventh transistor outputs the output signal OUT2. The one of the source and the drain of the seventh transistor is electrically connected to the other of the source and the drain of the third transistor, the other of the source and the drain of the fourth transistor, and the gate of the fifth transistor. The other of the source and the drain of the seventh transistor is electrically connected to the other of the source and the drain of the eighth transistor and the one of the source and the drain of the ninth transistor.

The gate of the eighth transistor is electrically connected to the other of the source and the drain of the second transistor. The one of the source and the drain of the eighth transistor outputs the output signal OUT1. The one of the source and the drain of the eighth transistor is electrically connected to the gate of the fourth transistor, the other of the source and the drain of the fifth transistor, and the other of the source and the drain of the sixth transistor. The other of the source and the drain of the eighth transistor is electrically connected to the other of the source and the drain of the seventh transistor and the one of the source and the drain of the ninth transistor.

A gate of the ninth transistor is supplied with the clock signal CLK. The one of the source and the drain of the ninth transistor is electrically connected to the other of the source and the drain of the seventh transistor and the other of the source and the drain of the eighth transistor. The other of the source and the drain of the ninth transistor is supplied with a low-level reference potential (e.g., a ground potential GND).

There is only one path of leakage current between the power supply potential that is a high-level reference potential and the low-level reference potential in the memory device. Thus, power consumption can be reduced when the memory device is in a standby state.

Another memory device of one embodiment of the disclosed invention includes a first transistor, a second transistor, a third transistor, a fourth transistor, a fifth transistor, a sixth transistor, a seventh transistor, an eighth transistor, and a ninth transistor.

As the first transistor and the second transistor, oxide semiconductor transistors are used, for example.

As the third transistor, the fourth transistor, the fifth transistor, the sixth transistor, the seventh transistor, the eighth transistor, and the ninth transistor, silicon transistors are used, for example. As the third transistor, the fourth transistor, the fifth transistor, and the sixth transistor, n-channel transistors are used. As the seventh transistor, the eighth transistor, and the ninth transistor, p-channel transistors are used.

A gate of the first transistor is supplied with the clock signal CLK and is electrically connected to a gate of the second transistor. One of a source and a drain of the first transistor is supplied with the input signal A. The other of the source and the drain of the first transistor is electrically connected to a gate of the seventh transistor. Note that a connection portion between the other of the source and the drain of the first transistor and the gate of the seventh transistor is a node M3.

A gate of the second transistor is supplied with the clock signal CLK and is electrically connected to the gate of the first transistor. One of a source and a drain of the second transistor is supplied with the signal AB whose phase is the inverse of that of the input signal A. The other of the source and the drain of the second transistor is electrically connected to a gate of the eighth transistor. Note that a connection portion between the other of the source and the drain of the second transistor and the gate of the eighth transistor is a node M4.

A gate of the third transistor is supplied with the clock signal CLK. One of a source and a drain of the third transistor is supplied with a low-level reference potential (e.g., a ground potential GND) and is electrically connected to one of a source and a drain of the fourth transistor, one of a source and a drain of the fifth transistor, and one of a source and a drain of the sixth transistor. The other of the source and the drain of the third transistor outputs an output signal OUT2. The other of the source and the drain of the third transistor is electrically connected to the other of the source and the drain of the fourth transistor, a gate of the fifth transistor, and one of a source and a drain of the seventh transistor.

A gate of the fourth transistor outputs the output signal OUT1. The gate of the fourth transistor is electrically connected to the other of the source and the drain of the fifth transistor, the other of the source and the drain of the sixth transistor, and one of a source and a drain of the eighth transistor. One of a source and a drain of the fourth transistor is supplied with the low-level reference potential (e.g., the ground potential GND) and is electrically connected to the one of the source and the drain of the third transistor, the one of the source and the drain of the fifth transistor, and the one of the source and the drain of the sixth transistor. The other of the source and the drain of the fourth transistor outputs the output signal OUT2. The other of the source and the drain of the fourth transistor is electrically connected to the other of the source and the drain of the third transistor, the gate of the fifth transistor, and the one of the source and the drain of the seventh transistor.

A gate of the fifth transistor outputs the output signal OUT2. The gate of the fifth transistor is electrically connected to the other of the source and the drain of the third transistor, the other of the source and the drain of the fourth transistor, and the one of the source and the drain of the seventh transistor. The one of the source and the drain of the fifth transistor is supplied with the low-level reference potential (e.g., the ground potential GND) and is electrically connected to the one of the source and the drain of the third transistor, the one of the source and the drain of the fourth transistor, and the one of the source and the drain of the sixth transistor. The other of the source and the drain of the fifth transistor outputs the output signal OUT1. The other of the source and the drain of the fifth transistor is electrically connected to the gate of the fourth transistor, the other of the source and the drain of the sixth transistor, and the one of the source and the drain of the eighth transistor.

A gate of the sixth transistor is supplied with the clock signal CLK. The one of the source and the drain of the sixth transistor is supplied with the low-level reference potential (e.g., the ground potential GND) and is electrically connected to the one of the source and the drain of the third transistor, the one of the source and the drain of the fourth transistor, and the one of the source and the drain of the fifth transistor. The other of the source and the drain of the sixth transistor outputs the output signal OUT1. The other of the source and the drain of the sixth transistor is electrically connected to the gate of the fourth transistor, the other of the source and the drain of the fifth transistor, and the one of the source and the drain of the eighth transistor.

The gate of the seventh transistor is electrically connected to the other of the source and the drain of the first transistor.

The one of the source and the drain of the seventh transistor outputs the output signal OUT2. The one of the source and the drain of the seventh transistor is electrically connected to the other of the source and the drain of the third transistor, the other of the source and the drain of the fourth transistor, and the gate of the fifth transistor. The other of the source and the drain of the seventh transistor is electrically connected to the other of the source and the drain of the eighth transistor and the one of the source and the drain of the ninth transistor.

The gate of the eighth transistor is electrically connected to the other of the source and the drain of the second transistor. The one of the source and the drain of the eighth transistor outputs the output signal OUT1. The one of the source and the drain of the eighth transistor is electrically connected to the gate of the fourth transistor, the other of the source and the drain of the fifth transistor, and the other of the source and the drain of the sixth transistor. The other of the source and the drain of the eighth transistor is electrically connected to the other of the source and the drain of the seventh transistor and the one of the source and the drain of the ninth transistor.

A gate of the ninth transistor is supplied with the clock signal CLK. The one of the source and the drain of the ninth transistor is electrically connected to the other of the source and the drain of the seventh transistor and the other of the source and the drain of the eighth transistor. The other of the source and the drain of the ninth transistor is supplied with the power supply potential.

There is only one path of leakage current between the power supply potential that is the high-level reference potential and the low-level reference potential in the memory device. Thus, power consumption can be reduced when the memory device is in a standby state.

In addition, the oxide semiconductor transistor and the silicon transistor overlap with each other, so that the area of the memory device can be reduced.

In addition, the number of transistors included in the memory device is nine, which is smaller than that of the conventional memory device. According to one embodiment of the disclosed invention, the number of transistors included in the memory cell can be reduced.

Note that the memory device according to one embodiment of the disclosed invention is a semiconductor device including an oxide semiconductor or silicon.

One embodiment of the disclosed invention is a semiconductor integrated circuit including a comparator comparing a potential of a first output signal with a potential of a second output signal, a first memory portion including a first oxide semiconductor transistor whose channel formation region is formed in an oxide semiconductor layer and a first silicon transistor whose channel formation region is formed in a silicon layer, a second memory portion including a second oxide semiconductor transistor and a second silicon transistor, and an output potential determiner determining the potential of the first output signal and the potential of the second output signal. One of a source and a drain of the first oxide semiconductor transistor is electrically connected to a gate of the first silicon transistor. One of a source and a drain of the second oxide semiconductor transistor is electrically connected to a gate of the second silicon transistor. The first output signal is output from the comparator and the first memory portion. The second output signal is output from the comparator and the second memory portion.

According to one embodiment of the disclosed invention, the comparator is connected to the high-level power supply potential and the output potential determiner is connected to the low-level reference potential.

According to one embodiment of the disclosed invention, the first silicon transistor and the second silicon transistor are n-channel transistors.

According to one embodiment of the disclosed invention, the comparator is connected to the low-level reference potential and the output potential determiner is connected to the high-level power supply potential.

According to one embodiment of the disclosed invention, the first silicon transistor and the second silicon transistor are p-channel transistors.

One embodiment of the disclosed invention includes a first storage capacitor connected to the one of the source and the drain of the first oxide semiconductor transistor and the gate of the first silicon transistor and a second storage capacitor connected to the one of the source and the drain of the second oxide semiconductor transistor and the gate of the second silicon transistor.

According to one embodiment of the disclosed invention, the first oxide semiconductor transistor and the second oxide semiconductor transistor overlap with the first silicon transistor and the second silicon transistor, respectively.

One embodiment of the disclosed invention is a semiconductor integrated circuit including a comparator connected to a high-level reference potential and comparing a potential of a first output signal with a potential of a second output signal, a first memory portion including a first oxide semiconductor transistor whose channel formation region is formed in an oxide semiconductor layer and a second oxide semiconductor transistor, a second memory portion including a third oxide semiconductor transistor and a fourth oxide semiconductor transistor, and an output potential determiner connected to a low-level reference potential and determining the potential of the first output signal and the potential of the second output signal. One of a source and a drain of the first oxide semiconductor transistor is electrically connected to a gate of the second oxide semiconductor transistor. One of a source and a drain of the third oxide semiconductor transistor is electrically connected to a gate of the fourth oxide semiconductor transistor. The first output signal is output from the comparator and the first memory portion. The second output signal is output from the comparator and the second memory portion.

One embodiment of the disclosed invention includes a first storage capacitor connected to the one of the source and the drain of the first oxide semiconductor transistor and the gate of the second oxide semiconductor transistor and a second storage capacitor connected to the one of the source and the drain of the third oxide semiconductor transistor and the gate of the fourth oxide semiconductor transistor.

According to one embodiment of the disclosed invention, the comparator includes four transistors.

According to one embodiment of the disclosed invention, each of the transistors included in the comparator is a p-channel silicon transistor.

According to one embodiment of the disclosed invention, each of the transistors included in the comparator is an n-channel silicon transistor.

According to one embodiment of the disclosed invention, each of the transistors included in the comparator is an oxide semiconductor transistor.

According to one embodiment of the disclosed invention, the output potential determiner includes one transistor.

According to one embodiment of the disclosed invention, the transistor included in the output potential determiner is an n-channel silicon transistor.

According to one embodiment of the disclosed invention, the transistor included in the output potential determiner is an oxide semiconductor transistor.

According to one embodiment of the disclosed invention, the transistor included in the output potential determiner is a p-channel silicon transistor.

According to one embodiment of the disclosed invention, power consumption in a memory device can be reduced.

According to one embodiment of the disclosed invention, the area of a memory device can be reduced.

According to one embodiment of the disclosed invention, the number of transistors included in a memory device can be reduced.

DETAILED DESCRIPTION OF THE INVENTION

Figure 1:
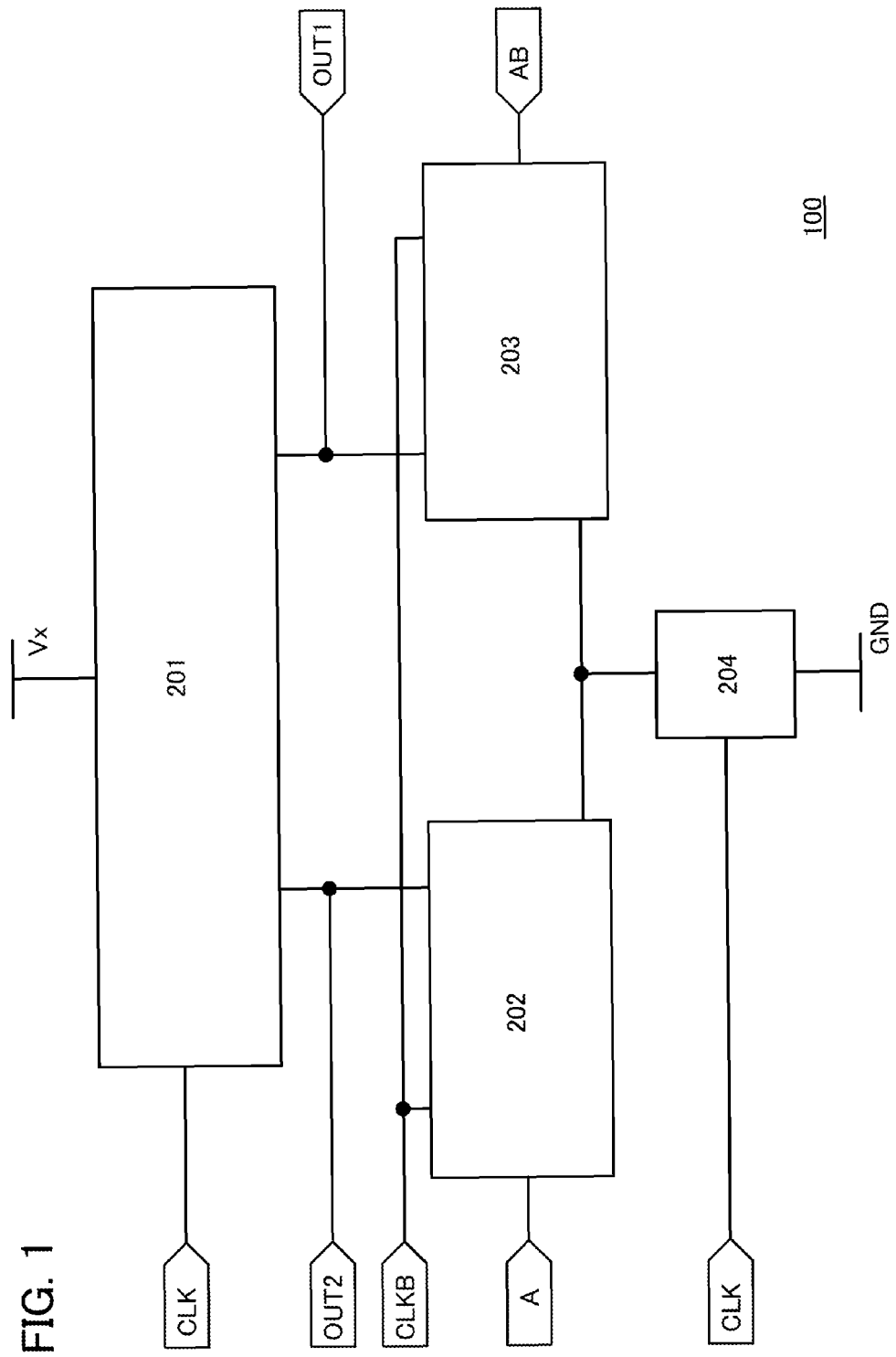
FIG. 1 is a block diagram of a memory device.

Embodiments of the invention disclosed in this specification are hereinafter described with reference to the accompanying drawings. Note that the invention disclosed in this specification can be carried out in a variety of different modes, and it is easily understood by those skilled in the art that the modes and details of the invention disclosed in this specification can be changed in various ways without departing from the spirit and scope thereof. Therefore, the present invention is not construed as being limited to description of the embodiments. Note that, in the drawings hereinafter shown, the same portions or portions having similar functions are denoted by the same reference numerals, and repeated description thereof is omitted.

Note that in the invention disclosed in this specification, a semiconductor device refers to an element or a device which functions by utilizing a semiconductor and includes, in its category, an electric device including an electronic circuit, a display device, a light-emitting device, and the like and an electronic appliance on which the electric device is mounted.

Note that the position, size, range, or the like of each structure shown in the drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

[Embodiment 1]
<Structure of Memory Device>

FIG. 1 is a block diagram of a memory device according to this embodiment. A memory device 100 in FIG. 1 includes a comparator 201, a memory portion 202, a memory portion 203, and an output potential determiner 204.

The comparator 201 has a function of comparing the potential of an output signal OUT1 with the potential of an output signal OUT2. The comparator 201 is supplied with a power supply potential Vx that is a high-level reference potential and a clock signal CLK. In addition, the comparator 201 is electrically connected to the memory portion 202 and outputs the output signal OUT2. Further, the comparator 201 is electrically connected to the memory portion 203 and outputs the output signal OUT1.

When the potential of one of the output signal OUT1 and the output signal OUT2 becomes a low-level potential (VSS), the comparator 201 supplies a high-level potential (VDD) to the other of the output signal OUT1 and the output signal OUT2. Note that the specific operation is described later.

The memory portion 202 has a function of storing data signals. The memory portion 202 is supplied with a signal CLKB whose phase is the inverse of that of the clock signal CLK and an input signal A. In addition, the memory portion 202 is electrically connected to the comparator 201 and outputs the output signal OUT2. Further, the memory portion 202 is electrically connected to the memory portion 203 and the output potential determiner 204.

The memory portion 203 has a function of storing data signals. The memory portion 203 is supplied with the signal CLKB whose phase is the inverse of that of the clock signal CLK and a signal AB whose phase is the inverse of that of the input signal A. In addition, the memory portion 203 is electrically connected to the comparator 201 and outputs the output signal OUT1. Further, the memory portion 203 is electrically connected to the memory portion 202 and the output potential determiner 204.

The output potential determiner 204 has a function of determining a potential of the output signal OUT1 and a potential of the output potential OUT2. The output potential determiner 204 is supplied with the clock signal CLK. In addition, the output potential determiner 204 is electrically connected to the memory portion 202 and the memory portion 203. Further, the output potential determiner 204 is supplied with a low-level reference potential (e.g., a ground potential GND).

Note that in the memory device 100 in this embodiment, the power supply potential Vx that is the high-level reference potential is always the high-level potential (VDD), and the low-level reference potential is the low-level potential (VSS) (e.g., the ground potential GND).

The comparator 201 compares the potential of the output signal OUT1 with the potential of the output signal OUT2. When the potential of the clock signal CLK is the high-level potential (VDD) and the potential of one of the output signal OUT1 and the output signal OUT2 becomes the low-level potential (VSS), the high-level potential (VDD) is supplied from the power supply potential Vx to the other of the output signal OUT1 and the output signal OUT2 through the comparator 201 (see a period T2 and a period T4 which are described later).

When the potential of the clock signal CLK is the low-level potential (VSS), the input signal A and the signal AB are input to the memory portion 202 and the memory portion 203, respectively. Further, the memory portion 202 and the memory portion 203 store the input signal A and the signal AB which are input, respectively (precharge) (see a period T1 and a period T3 which are described later).

In addition, when the potential of the clock signal CLK is the high-level potential (VDD), the memory portion 202 and the memory portion 203 output the input signal A and the signal AB which are input, respectively (see the period T2 and the period T4 which are described later).

The output potential determiner 204 is turned on and supplies the low-level reference potential (e.g., the ground potential GND) to the memory device 100 when the potential of the clock signal CLK is the high-level potential (VDD).

Figure 2:
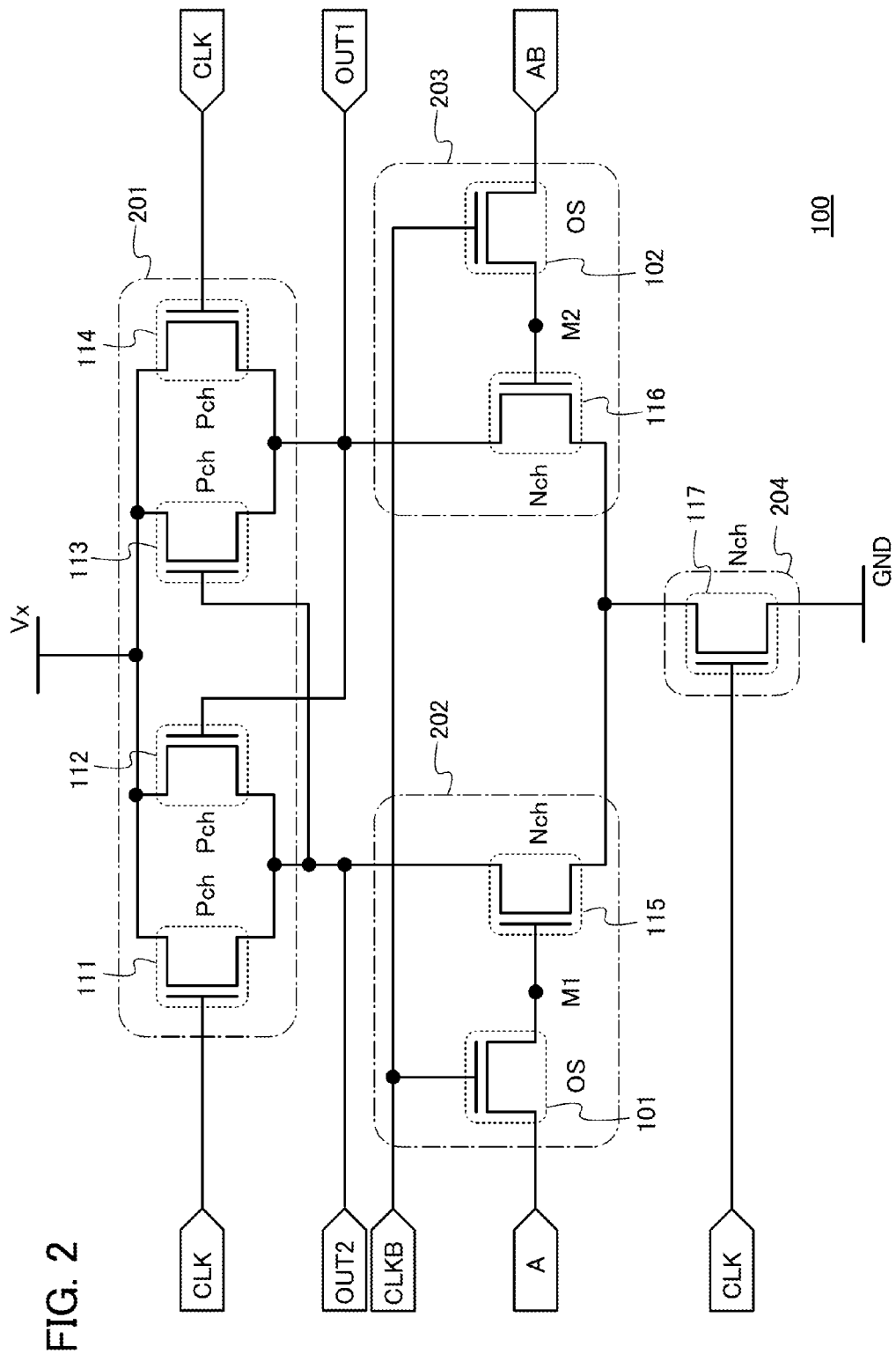
FIG. 2 is a circuit diagram of a memory device.

FIG. 2 is a circuit diagram specifically illustrating the memory device 100 according to this embodiment.

The memory device 100 in FIG. 2 includes a first transistor 101, a second transistor 102, a third transistor 111, a fourth transistor 112, a fifth transistor 113, a sixth transistor 114, a seventh transistor 115, an eighth transistor 116, and a ninth transistor 117.

The comparator 201 includes the third transistor 111, the fourth transistor 112, the fifth transistor 113, and the sixth transistor 114. The memory portion 202 includes the first transistor 101 and the seventh transistor 115. The memory portion 203 includes the second transistor 102 and the eighth transistor 116. The output potential determiner 204 includes the ninth transistor 117.

As the first transistor 101 and the second transistor 102, for example, transistors whose channels are formed in oxide semiconductor layers (oxide semiconductor transistors) are used. The oxide semiconductor transistor has an advantage of an extremely small leakage current (also referred to as off-state current). Note that the oxide semiconductor transistor is an n-channel transistor.

As the third transistor 111, the fourth transistor 112, the fifth transistor 113, the sixth transistor 114, the seventh transistor 115, the eighth transistor 116, and the ninth transistor 117, transistors whose channels are formed in silicon layers (silicon transistors) are used, for example. The silicon layer may be a single crystal silicon layer, a microcrystalline silicon layer, or an amorphous silicon layer. In addition, as the third transistor 111, the fourth transistor 112, the fifth transistor 113, and the sixth transistor 114, p-channel transistors are used. As the seventh transistor 115, the eighth transistor 116, and the ninth transistor 117, n-channel transistors are used.

Note that three n-channel transistors, the seventh transistor 115, the eighth transistor 116, and the ninth transistor 117, are not necessarily silicon transistors and may be oxide semiconductor transistors like the first transistor 101 and the second transistor 102.

A gate of the first transistor 101 is supplied with the signal CLKB whose phase is the inverse of that of the clock signal CLK and is electrically connected to a gate of the second transistor 102. One of a source and a drain of the first transistor 101 is supplied with the input signal A. The other of the source and the drain of the first transistor 101 is electrically connected to a gate of the seventh transistor 115. Note that a connection portion between the other of the source and the drain of the first transistor 101 and the gate of the seventh transistor 115 is a node M1.

A gate of the second transistor 102 is supplied with the signal CLKB whose phase is the inverse of that of the clock signal CLK and is electrically connected to a gate of the first transistor 101. One of a source and a drain of the second transistor 102 is supplied with the signal AB whose phase is the inverse of that of the input signal A. The other of the source and the drain of the second transistor 102 is electrically connected to a gate of the eighth transistor 116. Note that a connection portion between the other of the source and the drain of the second transistor 102 and the gate of the eighth transistor 116 is a node M2.

A gate of the third transistor 111 is supplied with the clock signal CLK. One of a source and a drain of the third transistor 111 is supplied with the power supply potential Vx and is electrically connected to one of a source and a drain of the fourth transistor 112, one of a source and a drain of the fifth transistor 113, and one of a source and a drain of the sixth transistor 114. The output signal OUT2 is output from the other of the source and the drain of the third transistor 111. The other of the source and the drain of the third transistor 111 is electrically connected to the other of the source and the drain of the fourth transistor 112, a gate of the fifth transistor 113, and one of a source and a drain of the seventh transistor 115.

A gate of the fourth transistor 112 outputs the output signal OUT1. The gate of the fourth transistor 112 is electrically connected to the other of the source and the drain of the fifth transistor 113, the other of the source and the drain of the sixth transistor 114, and one of a source and a drain of the eighth transistor 116. One of a source and a drain of the fourth transistor 112 is supplied with the power supply potential Vx and is electrically connected to the one of the source and the drain of the third transistor 111, the one of the source and the drain of the fifth transistor 113, and the one of the source and the drain of the sixth transistor 114. The other of the source and the drain of the fourth transistor 112 outputs the output signal OUT2. The other of the source and the drain of the fourth transistor 112 is electrically connected to the other of the source and the drain of the third transistor 111, the gate of the fifth transistor 113, and the one of the source and the drain of the seventh transistor 115.

A gate of the fifth transistor 113 outputs the output signal OUT2. The gate of the fifth transistor 113 is electrically connected to the other of the source and the drain of the third transistor 111, the other of the source and the drain of the fourth transistor 112, and the one of the source and the drain of the seventh transistor 115. The one of the source and the drain of the fifth transistor 113 is supplied with the power supply potential Vx and is electrically connected to the one of the source and the drain of the third transistor 111, the one of the source and the drain of the fourth transistor 112, and the one of the source and the drain of the sixth transistor 114. The other of the source and the drain of the fifth transistor 113 outputs an output signal OUT1. The other of the source and the drain of the fifth transistor 113 is electrically connected to the gate of the fourth transistor 112, the other of the source and the drain of the sixth transistor 114, and the one of the source and the drain of the eighth transistor 116.

A gate of the sixth transistor 114 is supplied with the clock signal CLK. The one of the source and the drain of the sixth transistor 114 is supplied with the power supply potential Vx and is electrically connected to the one of the source and the drain of the third transistor 111, the one of the source and the drain of the fourth transistor 112, and the one of the source and the drain of the fifth transistor 113. The other of the source and the drain of the sixth transistor 114 outputs an output signal OUT1. The other of the source and the drain of the sixth transistor 114 is electrically connected to the gate of the fourth transistor 112, the other of the source and the drain of the fifth transistor 113, and the one of the source and the drain of the eighth transistor 116.

The gate of the seventh transistor 115 is electrically connected to the other of the source and the drain of the first transistor 101. The one of the source and the drain of the seventh transistor 115 outputs the output signal OUT2. The one of the source and the drain of the seventh transistor 115 is electrically connected to the other of the source and the drain of the third transistor 111, the other of the source and the drain of the fourth transistor 112, and the gate of the fifth transistor 113. The other of the source and the drain of the seventh transistor 115 is electrically connected to the other of the source and the drain of the eighth transistor 116 and the one of the source and the drain of the ninth transistor 117.

The gate of the eighth transistor 116 is electrically connected to the other of the source and the drain of the second transistor 102. The one of the source and the drain of the eighth transistor 116 outputs the output signal OUT1. The one of the source and the drain of the eighth transistor 116 is electrically connected to the gate of the fourth transistor 112, the other of the source and the drain of the fifth transistor 113, and the other of the source and the drain of the sixth transistor 114. The other of the source and the drain of the eighth transistor 116 is electrically connected to the other of the source and the drain of the seventh transistor 115 and the one of the source and the drain of the ninth transistor 117.

A gate of the ninth transistor 117 is supplied with the clock signal CLK. The one of the source and the drain of the ninth transistor 117 is electrically connected to the other of the source and the drain of the seventh transistor 115 and the other of the source and the drain of the eighth transistor 116. The other of the source and the drain of the ninth transistor 117 is supplied with the low-level reference potential (e.g., the ground potential GND).

When the memory device 100 according to this embodiment is in a standby state, there is only one path of leakage current between the power supply potential Vx that is the high-level reference potential and the low-level reference potential (the ground potential GND). There is only one path of leakage current; thus, power consumption of the memory device 100 in a standby state can be reduced.

Figure 3A:
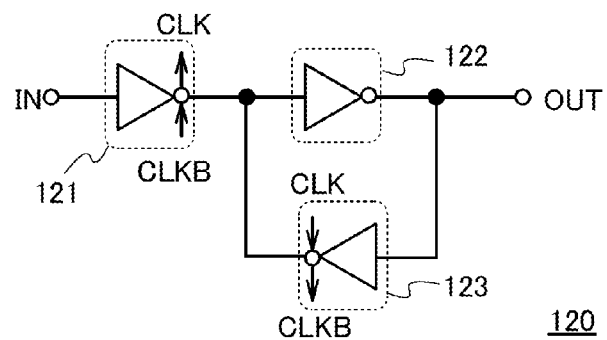
FIGS. 3A to 3C are circuit diagrams of a latch circuit, an inverter, and a clocked inverter, respectively.
Figure 3B:
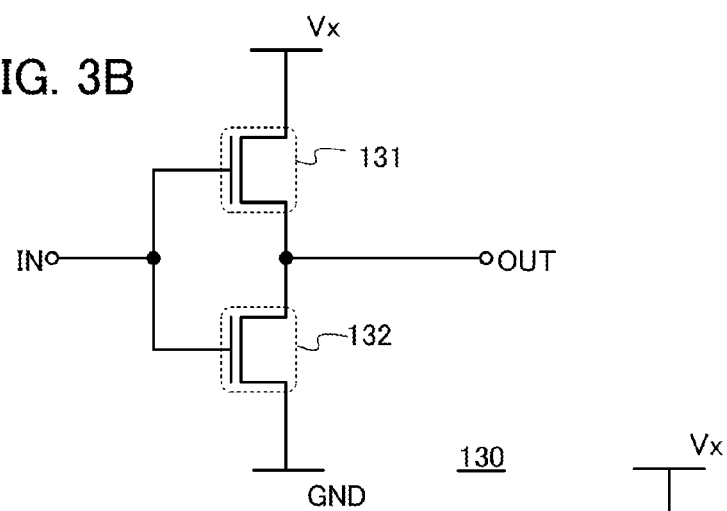
Figure 3C:
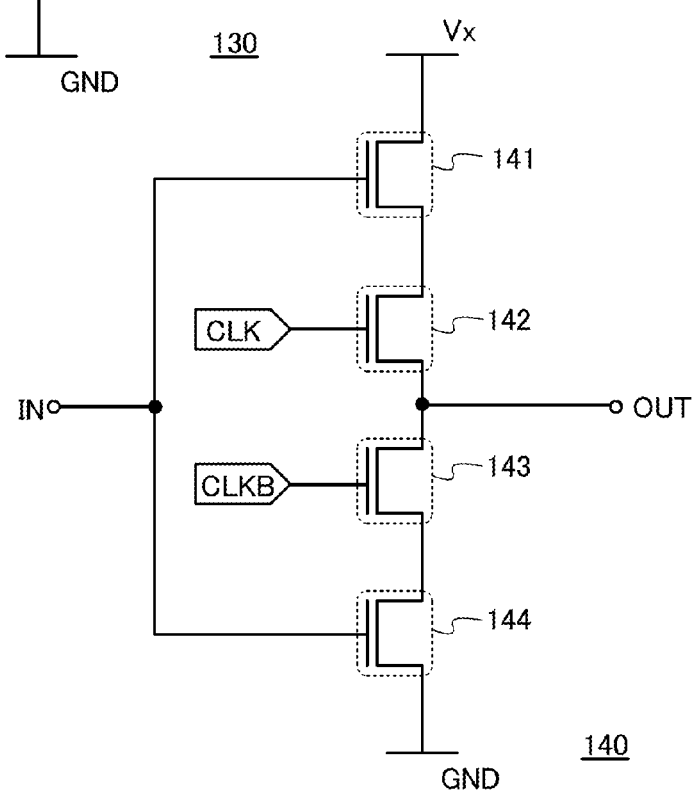

For comparison purposes, a conventional latch circuit is shown in FIGS. 3A to 3C. A latch circuit 120 shown in FIG. 3A includes a clocked inverter 121, an inverter 122, and a clocked inverter 123.

An input terminal of the clocked inverter 121 serves as an input terminal IN of the latch circuit 120. An output terminal of the clocked inverter 121 is electrically connected to an input terminal of the inverter 122 and an output terminal of the clocked inverter 123.

The input terminal of the inverter 122 is electrically connected to the output terminal of the clocked inverter 121 and the output terminal of the clocked inverter 123. An output terminal of the inverter 122 is electrically connected to an input terminal of the clocked inverter 123 and serves as an output terminal OUT of the latch circuit 120.

The input terminal of the clocked inverter 123 is electrically connected to the output terminal of the clocked inverter 122 and serves as the output terminal OUT of the latch circuit 120. The output terminal of the clocked inverter 121 is electrically connected to the input terminal of the inverter 122 and the output terminal of the clocked inverter 123.

An example of a circuit configuration capable of being used for the inverter 122 is shown in FIG. 3B.

An inverter 130 shown in FIG. 3B includes a transistor 131, which is a p-channel transistor, and a transistor 132, which is an n-channel transistor.

A gate of the transistor 131 of the inverter 130 is electrically connected to a gate of the transistor 132 and serves as an input terminal IN of the inverter 130. The power supply potential Vx is supplied to one of a source and a drain of the transistor 131. The other of the source and the drain of the transistor 131 is electrically connected to one of a source and a drain of the transistor 132 and serves as an output terminal OUT of the inverter 130.

The gate of the transistor 132 of the inverter 130 is electrically connected to the gate of the transistor 131 and serves as the input terminal IN of the inverter 130. The one of the source and the drain of the transistor 132 is electrically connected to the other of the source and the drain of the transistor 131 and serves as the output terminal OUT of the inverter 130. The other of the source and the drain of the transistor 132 is supplied with the low-level reference potential (e.g., the ground potential GND).

An example of a circuit configuration capable of being used for each of the clocked inverter 121 and the clocked inverter 123 is shown in FIG. 3C.

A clocked inverter 140 shown in FIG. 3C includes transistors 141 and 142, which are p-channel transistors, and transistors 143 and 144, which are n-channel transistors.

A gate of the transistor 141 is electrically connected to a gate of the transistor 144 and serves as an input terminal IN of the clocked inverter 140. The power supply potential Vx is supplied to one of a source and a drain of the transistor 141.

The other of the source and the drain of the transistor 141 is electrically connected to one of a source and a drain of the transistor 142.

The clock signal CLK is input to a gate of the transistor 142. The one of the source and the drain of the transistor 142 is electrically connected to the other of the source and the drain of the transistor 141. The other of the source and the drain of the transistor 142 is electrically connected to one of a source and a drain of the transistor 143 and serves as an output terminal OUT of the clocked inverter 140.

The signal CLKB whose phase is the inverse of that of the clock signal CLK is input to a gate of the transistor 143. The one of the source and the drain of the transistor 143 is electrically connected to the other of the source and the drain of the transistor 142 and serves as the output terminal OUT of the clocked inverter 140. The other of the source and the drain of the transistor 143 is electrically connected to one of a source and a drain of the transistor 144.

The gate of the transistor 144 is electrically connected to the gate of the transistor 141 and serves as the input terminal IN of the clocked inverter 140. The one of the source and the drain of the transistor 144 is electrically connected to the other of the source and the drain of the transistor 143. The other of the source and the drain of the transistor 144 is supplied with the low-level reference potential (e.g., the ground potential GND).

Figure 4:
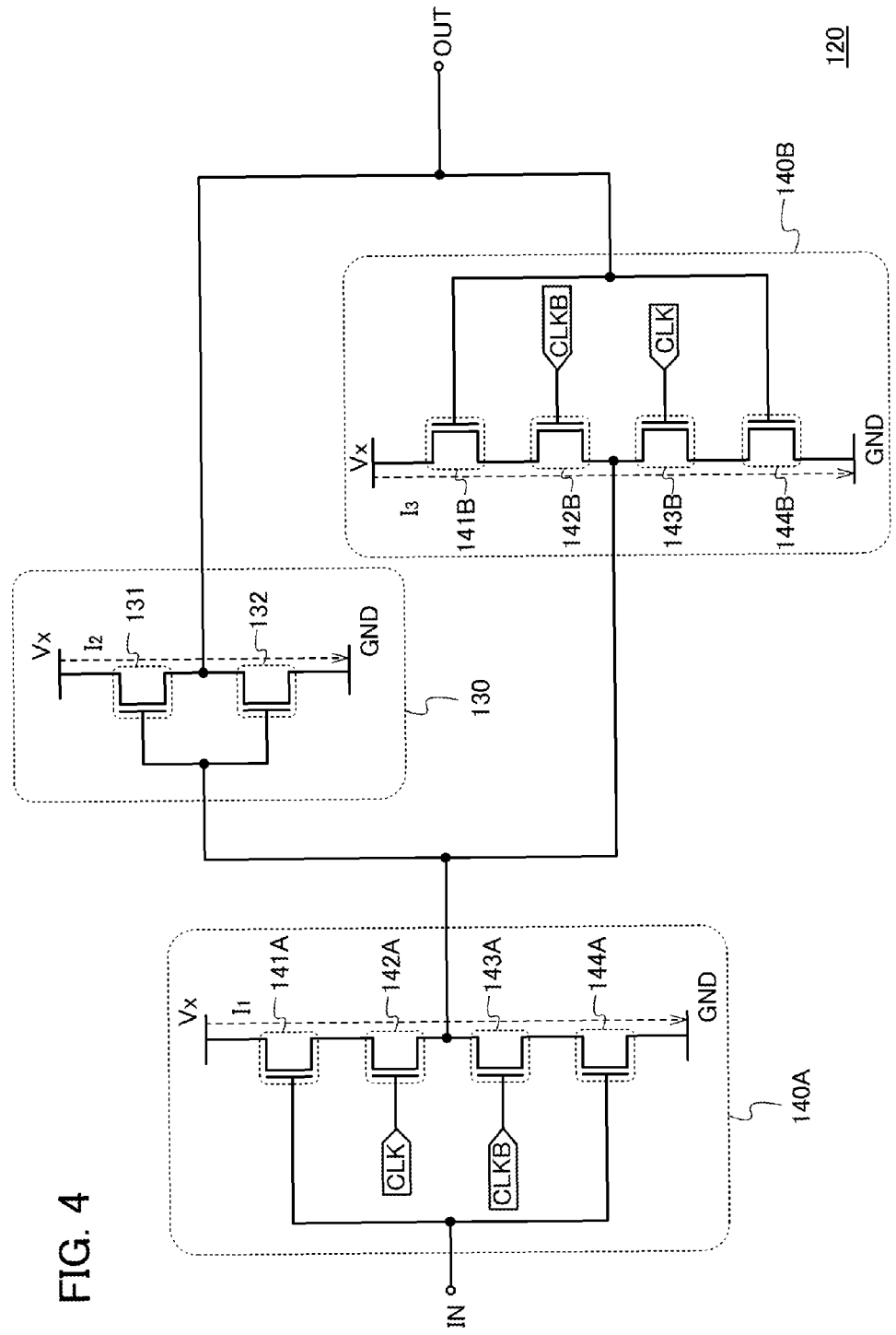
FIG. 4 is a circuit diagram of a latch circuit.

A specific circuit configuration of the latch circuit 120 in which the inverter 130 is used as the inverter 122 and the clocked inverter 140 (a clocked inverter 140A and a clocked inverter 140B) is used as each of the clocked inverter 121 and the clocked inverter 123 is shown in FIG. 4. Note that in FIG. 4, the clocked inverters 140A and 140B and transistors included in the clocked inverters 140A and 140B are similar to the clocked inverter 140 and the transistors included in the clocked inverter 140 and are denoted as the corresponding reference numerals with "A" or "B" added.

As shown in FIG. 4, there are three paths (paths $I_1$, $I_2$, and $I_3$) of leakage current between the power supply potential Vx that is the high-level reference potential and the low-level reference potential (the ground potential GND) in the latch circuit 120. Thus, power consumption of the latch circuit 120 in the standby state might be increased.

In contrast, as described above, there is only one path of leakage current between the power supply potential Vx that is the high-level reference potential and a low-level reference potential (the ground potential GND) in the memory device 100 according to this embodiment. Thus, power consumption of the memory device 100 according to this embodiment in a standby state can be reduced.

In addition, the memory device 100 according to this embodiment includes 9 transistors in total: 2 oxide semiconductor transistors and 7 silicon transistors. In contrast, the latch circuit 120 shown in FIG. 4 includes 10 transistors. Thus, according to this embodiment, the number of transistors included in a memory device can be reduced.

As described above, the oxide semiconductor transistor has an extremely small leakage current. Accordingly, even when supply of a power supply potential to the memory device 100 is stopped, charge held between the other of the source and the drain of the first transistor 101 which is the oxide semiconductor transistor and the gate of the seventh transistor 115 can be maintained. Thus, when the supply of the power supply potential is resumed, it is possible to begin operation before the supply of the power supply potential to the memory device 100 is stopped.

The oxide semiconductor transistors in the memory device 100 according to this embodiment each have characteristics of an extremely small leakage current. Specifically, transistors in which each leakage current is $1 \times 10^{-15}$ A or smaller, preferably $1 \times 10^{-19}$ A or smaller are used as the oxide semiconductor transistors in the memory device 100. When the leakage current is larger than the above value, there is a possibility that nonvolatility of the memory device 100 is lost and fluctuation in data occurs, so that the memory device 100 does not operate properly.

As described above, data is not lost in the memory device 100 even when the supply of the power supply potential is stopped. That is, the memory device 100 according to this embodiment is a nonvolatile memory circuit. Since data is not lost even when the supply of the power supply potential is stopped, the supply of the power supply potential can be stopped when the memory device 100 is in the standby state. Accordingly, when the supply of the power supply potential is stopped in the state where the nonvolatile memory device 100 is in the standby state, power consumption of the memory device 100 can be further reduced.

Further, in the memory device 100 according to this embodiment, the oxide semiconductor transistor can be formed overlapping with the silicon transistor (description is given later). Thus, the area occupied by the memory device 100 can be reduced.

<Driving Method of Memory Device>

Figure 6:
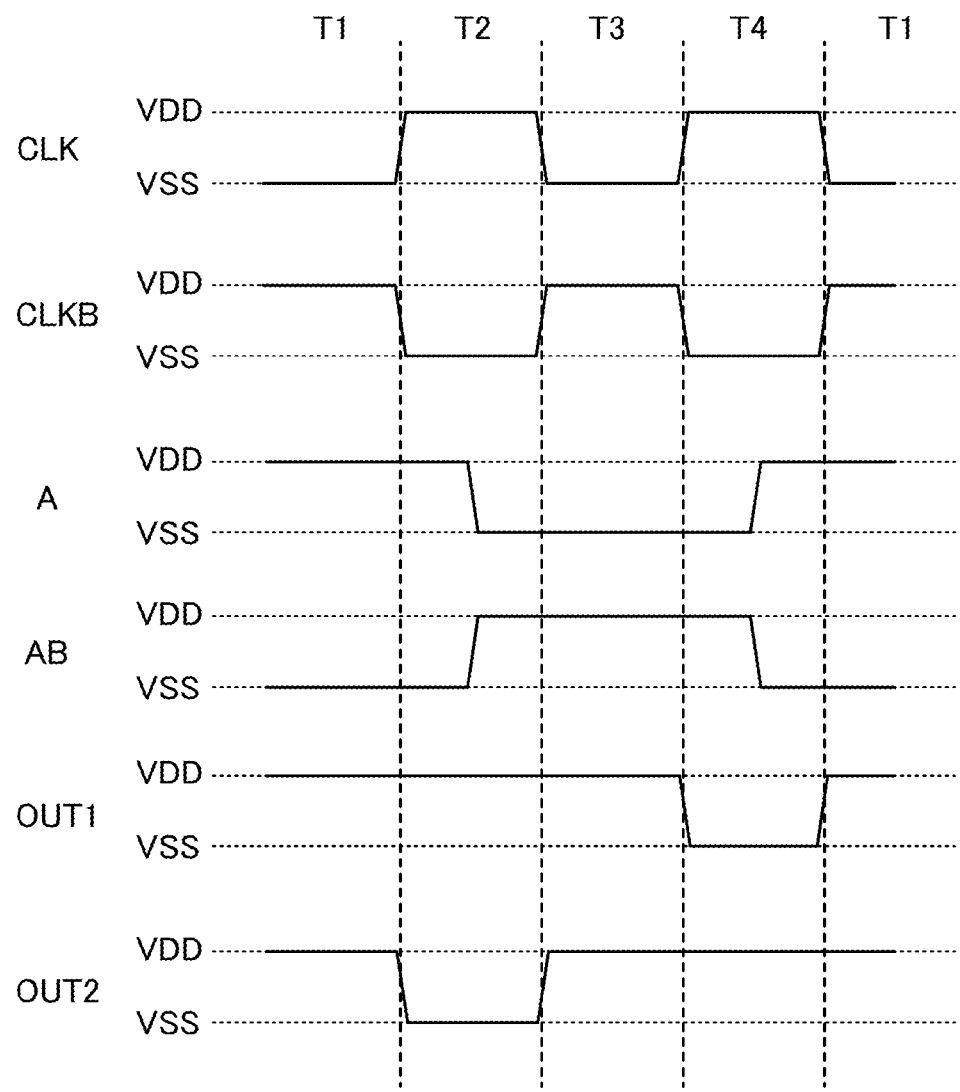
FIG. 6 is a timing chart showing operation of the memory device.

FIG. 6 shows a timing chart for driving the memory device 100 according to this embodiment.

Figure 7:
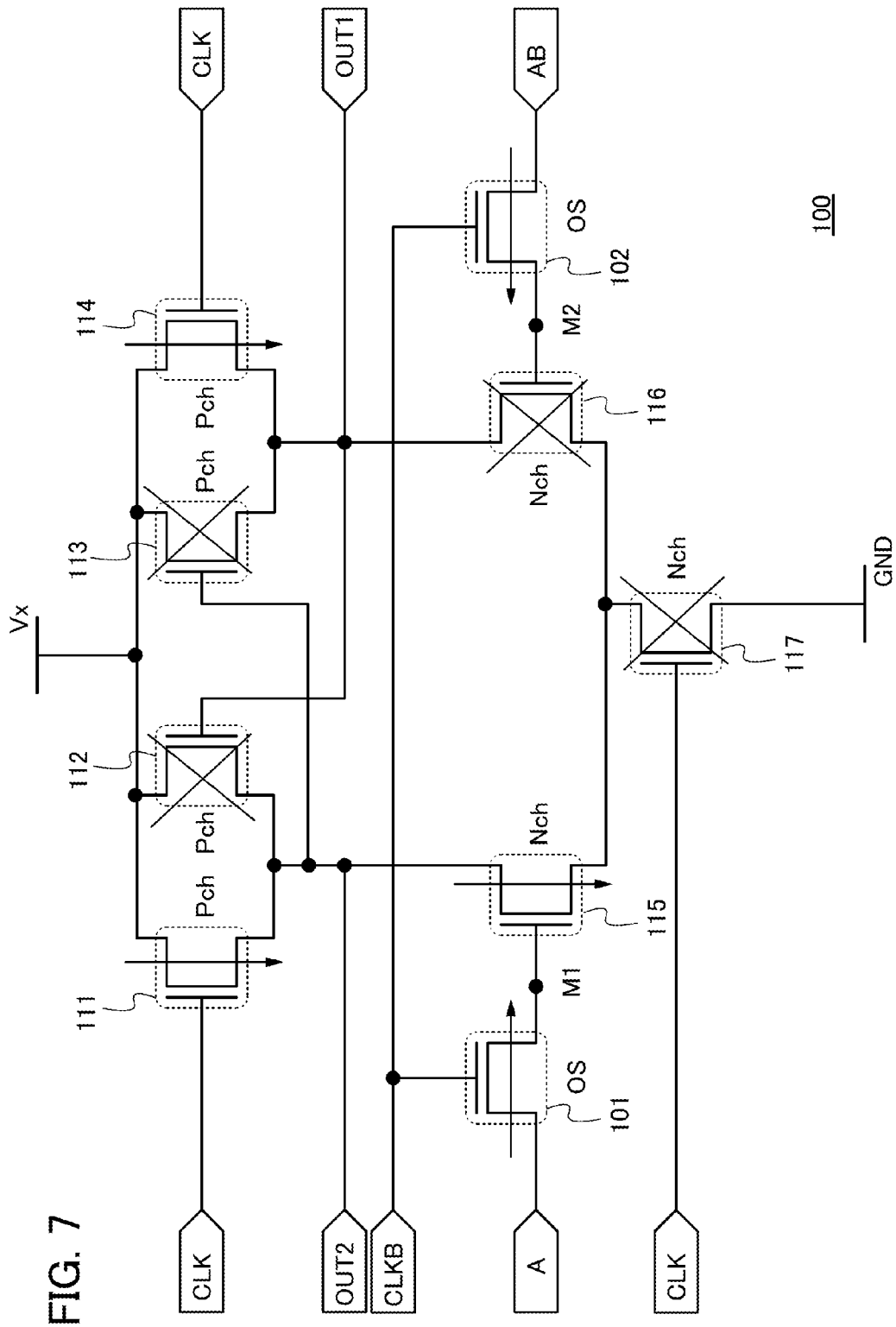
FIG. 7 shows operation of the memory device.

<Period T1 (FIG. 7)>

In the period T1 in FIG. 6, the potential of the clock signal CLK is the low-level potential (VSS), the potential of the signal CLKB is the high-level potential (VDD), the potential of the input signal A is the high-level potential (VDD), and the potential of the signal AB whose phase is the inverse of that of the input signal A is the low-level potential (VSS). Note that in the memory device 100 in this embodiment, the potential of the power supply potential Vx is always the high-level potential (VDD), and the low-level reference potential is the low-level potential (VSS) (e.g., the ground potential GND).

Since the potential of the clock signal CLK is the low-level potential (VSS), the low-level potential (VSS) is supplied to gates of the transistors 111 and 114, which are p-channel transistors; thus, the transistor 111 and the transistor 114 are on. Thus, the potentials of the output signal OUT1 and the output signal OUT2 are the high-level potentials (VDD).

Since the potentials of the output signal OUT1 and the output signal OUT2 are the high-level potentials (VDD), the high-level potentials (VDD) are supplied to gates of the transistors 112 and 113, which are p-channel transistors; thus, the transistors 112 and 113, which are p-channel transistors, are off.

Since the potential of the signal CLKB is the high-level potential (VDD), the oxide semiconductor transistors 101 and 102 (n-channel transistors) are on; thus, the input signal A whose potential is the high-level potential (VDD) in the period T1 is input to the node M1 and the gate of the transistor 115 through the transistor 101. In a similar manner, the signal AB whose potential is the low-level potential (VSS) in the period T1 is input to the node M2 and the gate of the transistor 116 through the transistor 102.

In this embodiment, an operation in which the input signal A and the input signal AB are input to the node M1 and the node M2, respectively, is referred to as precharge. In the period T1, the high-level potential (VDD) and the low-level potential (VSS) are input to the node M1 and the node M2, respectively.

In addition, since the gate of the transistor 115, which is an n-channel transistor, is supplied with the input signal A whose potential is the high-level potential (VDD), the transistor 115 is on. Since the gate of the transistor 116, which is an n-channel transistor, is supplied with the signal AB whose potential is the low-level potential (VSS), the transistor 116 is off. Since the gate of the transistor 117, which is an n-channel transistor, is supplied with the clock signal CLK whose potential is the low-level potential (VSS), the transistor 117 is off.

As described above, in the period T1, the potentials of the output signal OUT1 and the output signal OUT2 are the high-level potentials (VDD). In addition, in the period T1, the input signal A and the signal AB are input to the node M1 and the node M2, respectively.

Figure 8:
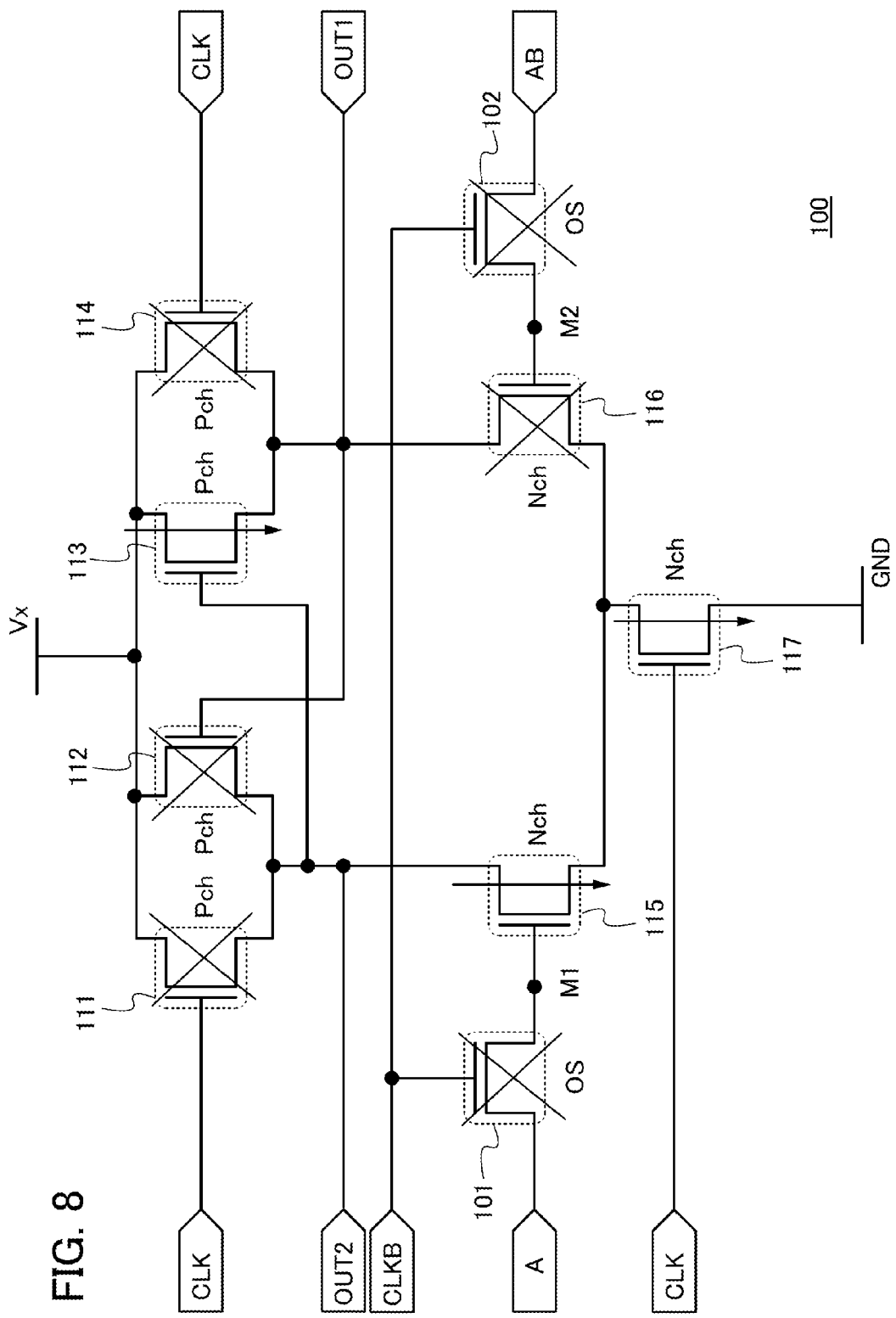
FIG. 8 shows operation of the memory device.

<Period T2 (FIG. 8)>

In the period T2, the potential of the clock signal CLK is changed to the high-level potential (VDD), and the potential of the signal CLKB is changed to the low-level potential (VSS).

Since the potential of the clock signal CLK is the high-level potential (VDD), the transistors 111 and 114, which are p-channel transistors, are turned off; thus, the supply of the power supply potential Vx to the output signal OUT1 and the output signal OUT2 is stopped.

Since the potential of the signal CLKB is the low-level potential (VSS), the oxide semiconductor transistors 101 and 102 (n-channel transistors) are turned off. As described above, the oxide semiconductor transistor has an extremely small leakage current; thus, charges of the node M1 and the node M2 are maintained. In the period T1, since the potentials of the node M1 and the node M2 are the high-level potential (VDD) and the low-level potential (VSS), respectively, the transistor 115 whose gate is supplied with the high-level potential (VDD) remains on and the transistor 116 whose gate is supplied with the low-level potential (VSS) remains off.

Further, the gate of the transistor 117, which is an n-channel transistor, is supplied with the clock signal CLK whose potential is the high-level potential (VDD), whereby the transistor 117 is turned on.

Since the transistor 117 is on, the potential of the source or the drain of the transistor 117 is the low-level reference potential (e.g., the ground potential GND). In this embodiment, as described above, the low-level reference potential is the low-level potential (VSS) (e.g., the ground potential GND); thus, the potential of the source or the drain of the transistor 117 is the low-level potential (VSS).

Since the potential of the one of the source and the drain of the transistor 117 is the low-level potential (VSS), the potential of the other of the source and the drain of the transistor 115 is also the low-level potential (VSS). As described above, since the transistor 115 is on, the potential of the one of the source and the drain of the transistor 115 is also the low-level potential (VSS).

Since the potential of the one of the source and the drain of the transistor 115 is the low-level potential (VSS), the potential of the output signal OUT2 also becomes the low-level potential (VSS).

Since the potential of the one of the source and the drain of the transistor 115 is the low-level potential (VSS), the low-level potential (VSS) is supplied to the gate of the transistor 113, which is a p-channel transistor, whereby the transistor 113 is turned on.

Since the transistor 113 is on, the power supply potential Vx which is the high-level potential (VDD) is output as the output signal OUT1 whose potential is the high-level potential (VDD) through the transistor 113.

Since the potential of the output signal OUT1 is the high-level potential (VDD), the potential of the gate of the transistor 112 is also the high-level potential (VDD); thus, the transistor 112 remains off.

In addition, the potential of the input signal A is changed from the high-level potential (VDD) to the low-level potential (VSS) during the period T2; however, the output signal OUT1 and the output signal OUT2 are not influenced by the change because the transistor 101 is off. Further, the potential of the signal AB is changed from the low-level potential (VSS) to the high-level potential (VDD) in response to the potential of the input signal A: however, the output signal OUT1 and the output signal OUT2 are not influenced by the change because the transistor 102 is off.

In this manner, the memory device 100 is operated according to the input signal A and the signal AB which are input, in the period T1, to the node M1 and the node M2, respectively. In the period T2, the potentials of the output signal OUT1 and the output signal OUT2 are the high-level potential (VDD) and the low-level potential (VSS), respectively.

Note that in the period T2, the transistor 101 and the transistor 102 which are oxide semiconductor transistors are off; however, the output potentials of the output signal OUT1 and the output signal OUT2 are constant. In this specification, such a state in which the memory device 100 constantly outputs signals having a certain potential even when the oxide semiconductor transistor is off is referred to as a standby state. In this embodiment, the memory device 100 is in the standby state in the period T2.

Figure 9:
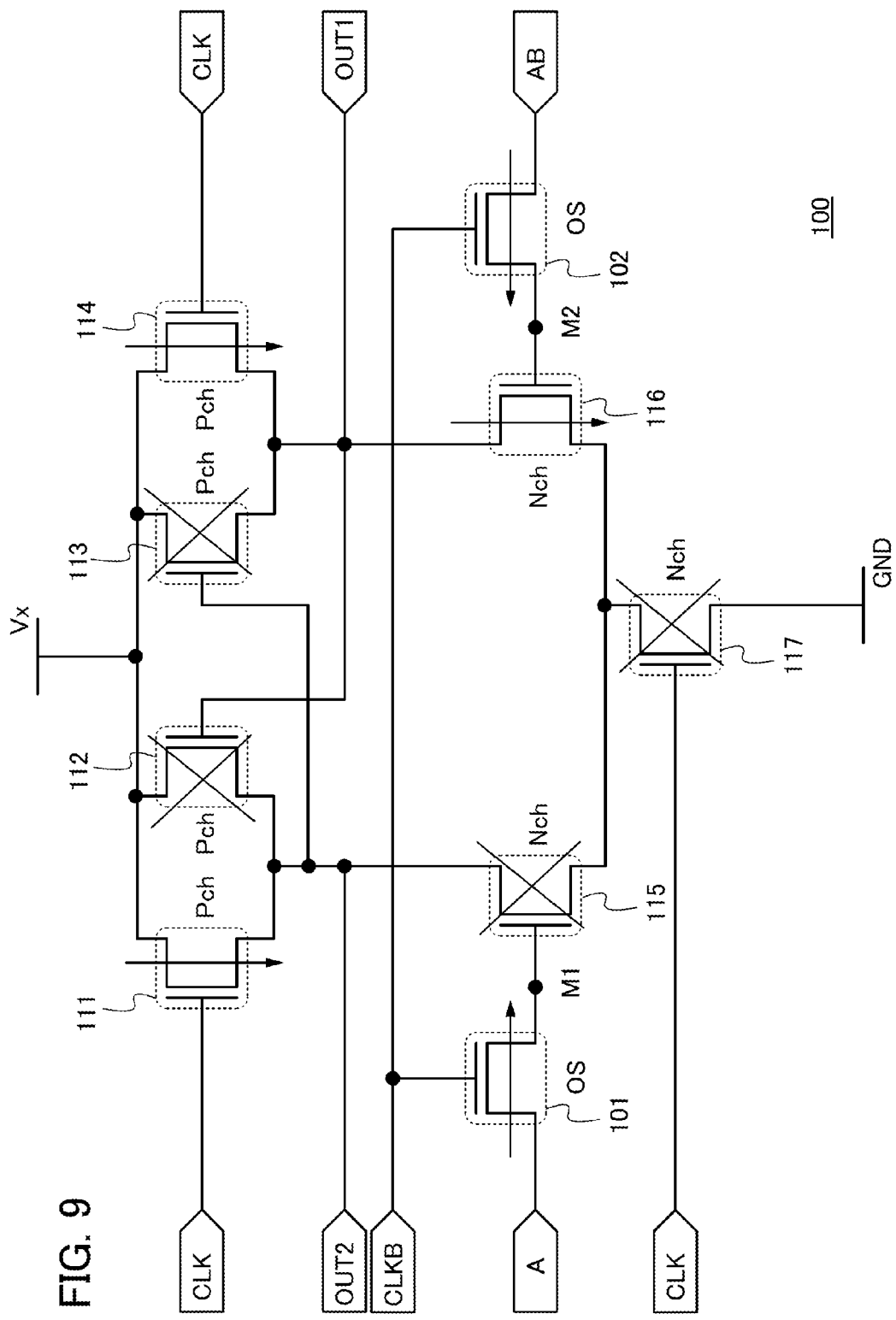
FIG. 9 shows operation of the memory device.

<Period T3 (FIG. 9)>

In the period T3, the potentials of the clock signal CLK and the signal CLKB are the low-level potential (VSS) and the high level potential (VDD), respectively, as in the period T1. Note that in the period T3, the potentials of the input signal A and the signal AB are the low-level potential (VSS) and the high-level potential (VDD), respectively, and have phases which are the inverse of those in the period T1.

Operations of the transistor 101, the transistor 102, the transistor 111, the transistor 112, the transistor 113, the transistor 114, and the transistor 117 in the period T3 are similar to those in the period T1.

The input signal A whose potential is the low-level potential (VSS) is input to the gate of the transistor 115 and the node M1 through the transistor 101 which is on. In addition, the signal AB whose potential is the high-level potential (VDD) is input to the gate of the transistor 116 and the node M2 through the transistor 102 which is on.

That is, in the period T3, the potential whose phase is the inverse of that in the period T1 is input to the node M1 and the node M2 (precharge).

Figure 10:
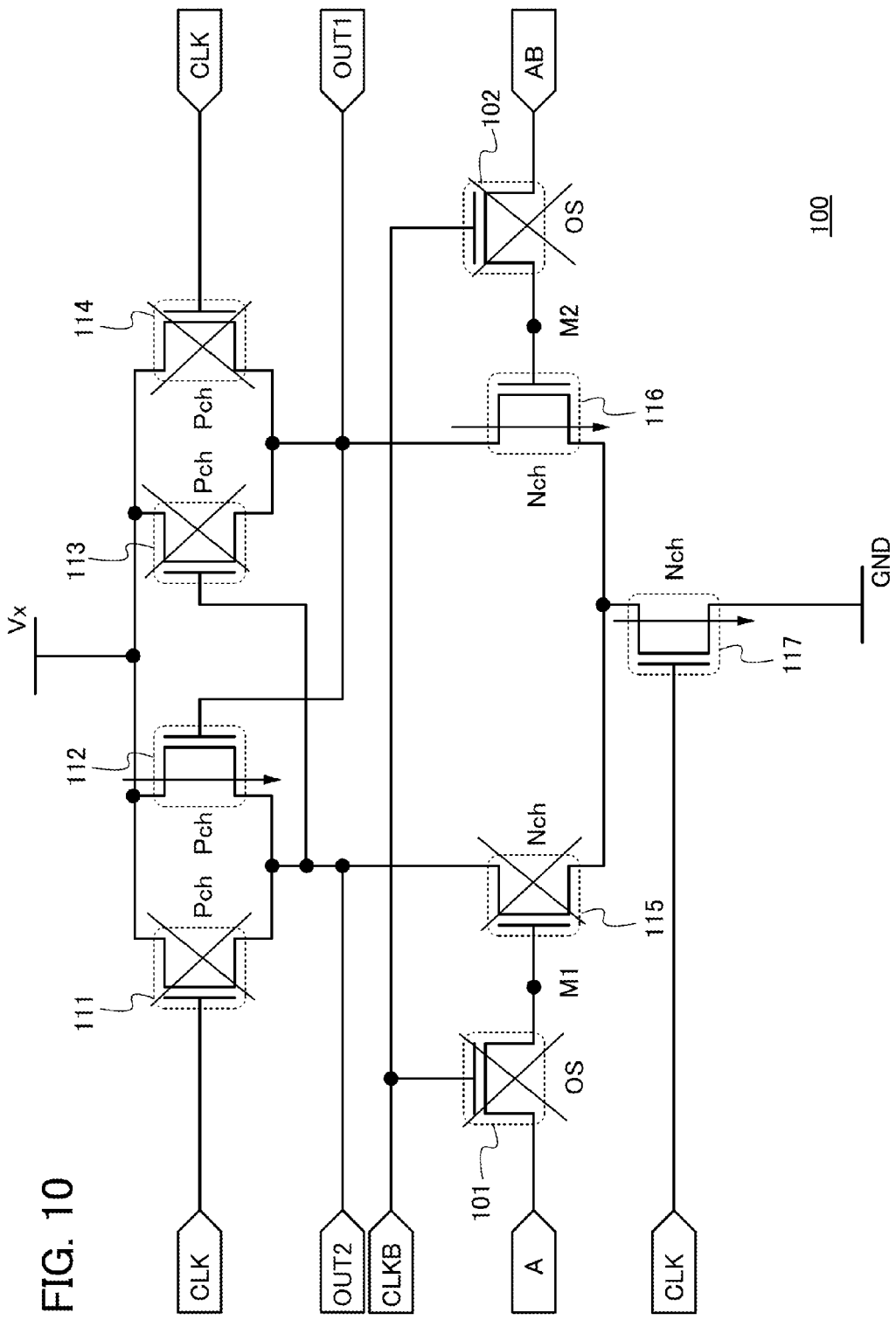
FIG. 10 shows operation of the memory device.

<Period T4 (FIG. 10)>

In the period T4, the potentials of the clock signal CLK and the signal CLKB are the high-level potential (VDD) and the low-level potential (VSS), respectively, as in the period T2. Note that at the end of the period T3, the potentials of the node M1 and the node M2 change to the low-level potential (VSS) and the high-level potential (VDD), respectively.

Operations of the transistor 101, the transistor 102, the transistor 111, the transistor 114, and the transistor 117 in the period T4 are similar to those in the period T2.

In the period T4, the oxide semiconductor transistors 101 and 102 (n-channel transistors) are turned off. As described above, the oxide semiconductor transistor has an extremely small leakage current; thus, charges of the node M1 and the node M2 are maintained.

Since in the period T3, the potentials of the node M1 and the node M2 are the low-level potential (VSS) and the high-level potential (VDD), respectively, also in the period T4, the transistor 115 whose gate is supplied with the low-level potential (VSS) is off and the transistor 116 whose gate is supplied with the high-level potential (VDD) is on.

As in the period T2, the transistor 117 is on. The potential of the one of the source and the drain of the transistor 117 is the low-level potential (VSS); thus, the potential of the other of the source and the drain of the transistor 117 is also the low-level potential (VSS). As described above, since the transistor 116 is on, the potential of the one of the source and the drain of the transistor 116 is also the low-level potential (VSS).

Since the potential of the one of the source and the drain of the transistor 116 is the low-level potential (VSS), the potential of the output signal OUT1 is also the low-level potential (VSS).

Since the potential of the one of the source and the drain of the transistor 116 is the low-level potential (VSS), the low-level potential (VSS) is supplied to the gate of the transistor 112, which is a p-channel transistor, so that the transistor 112 is turned on.

Since the transistor 112 is on, the power supply potential Vx that is the high-level potential (VDD) is output as the output signal OUT2 whose potential is the high-level potential (VDD) through the transistor 112.

Since the potential of the output signal OUT2 is the high-level potential (VDD), the potential of the gate of the transistor 113 is also the high-level potential (VDD); thus, the transistor 113 remains off.

In this manner, the memory device 100 is operated according to the input signal A and the signal AB which are input to the node M1 and the node M2, respectively, in the period T3. In the period T4, the potentials of the output signal OUT1 and the output signal OUT are the low-level potential (VSS) and the high-level potential (VDD), respectively.

Note that also in the period T4, the transistor 101 and the transistor 102 which are oxide semiconductor transistors are off; however, the output potentials of the output signal OUT1 and the output signal OUT2 are constant. Thus, also in the period T4, the memory device 100 is in the standby state.

Figure 5:
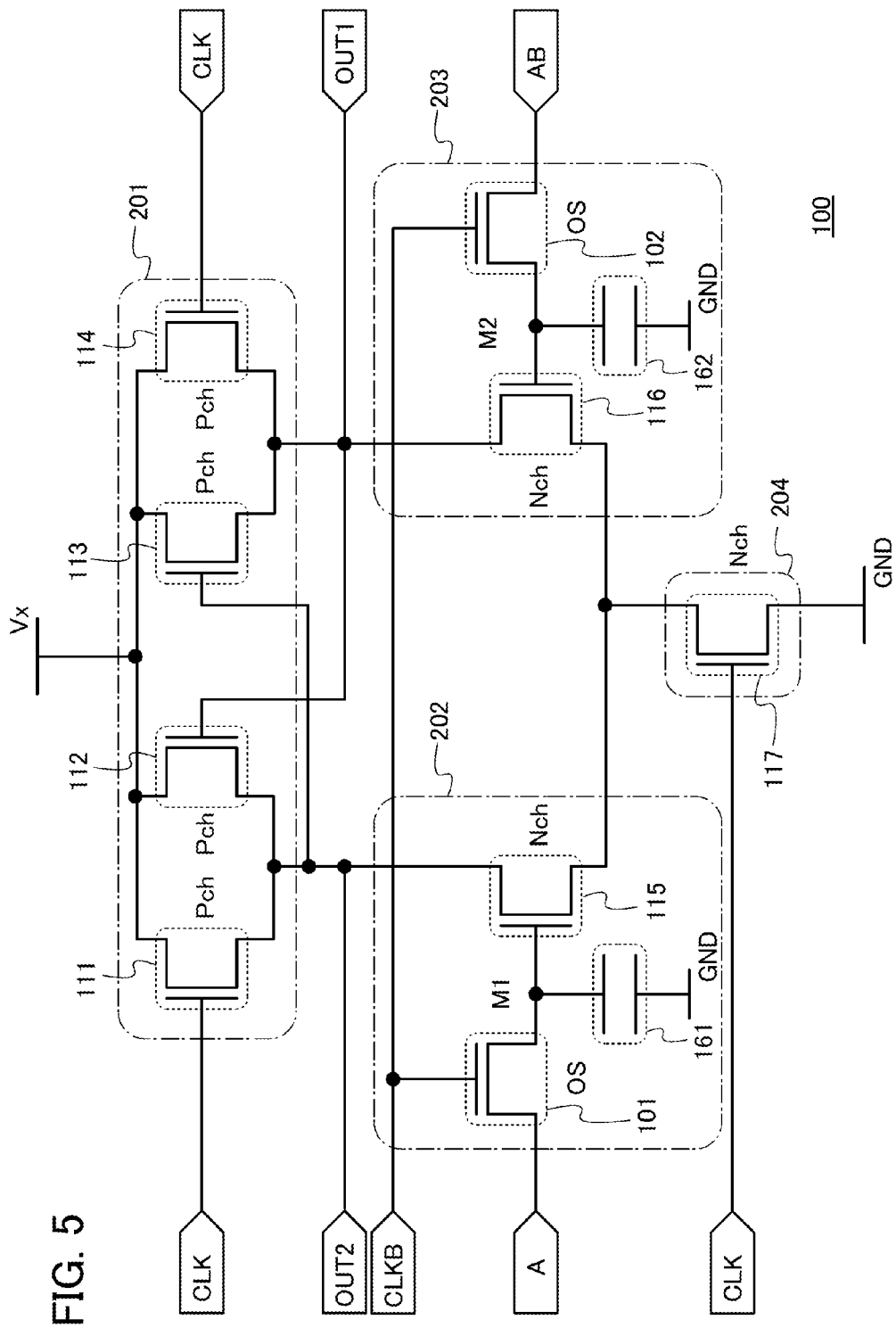
FIG. 5 is a circuit diagram of a memory device.

Note that as shown in FIG. 5, a storage capacitor 161 and a storage capacitor 162 may be provided at the connection portion between the other of the source and the drain of the first transistor 101 and the gate of the seventh transistor 115 (the node M1) and the connection portion between the other of the source and the drain of the second transistor 102 and the gate of the eighth transistor 116 (the node M2), respectively.

In the case where the storage capacitor 161 and the storage capacitor 162 are provided as shown in FIG. 5, when the potential of the clock signal CLK is the low-level potential (VSS), the input signal A and the signal AB are input to the node M1 and the node M2, respectively, and at the same time, are also input to the storage capacitor 161 and the storage capacitor 162, respectively. The input signal A and the signal AB which are input to the storage capacitor 161 and the storage capacitor 162, respectively, are maintained in the storage capacitor 161 and the storage capacitor 162, respectively.

In addition, as in the case of the node M1 and the node M2, the input signal A and the signal AB maintained in the storage capacitor 161 and the storage capacitor 162, respectively, are output to the gate of the transistor 115 and the gate of the transistor 116, respectively, when the potential of the clock signal CLK is the high-level potential (VDD).

The memory device 100 according to this embodiment can operate without the storage capacitor 161 and the storage capacitor 162. Note that the memory device 100 provided with the storage capacitor 161 and the storage capacitor 162 operates more stably than the memory device 100 without the storage capacitor 161 and the storage capacitor 162.

In this manner, paths of leakage current of the memory device can be reduced according to this embodiment.

Further, power consumption of the memory device can be reduced according to this embodiment.

Furthermore, the area of the memory device can be reduced according to this embodiment.

Furthermore, the number of transistors included in the memory device can be reduced according to this embodiment.

[Embodiment 2]
<Structure of Memory Device>

In this embodiment, a memory device that has a different structure from those in Embodiment 1 is described.

Figure 11:
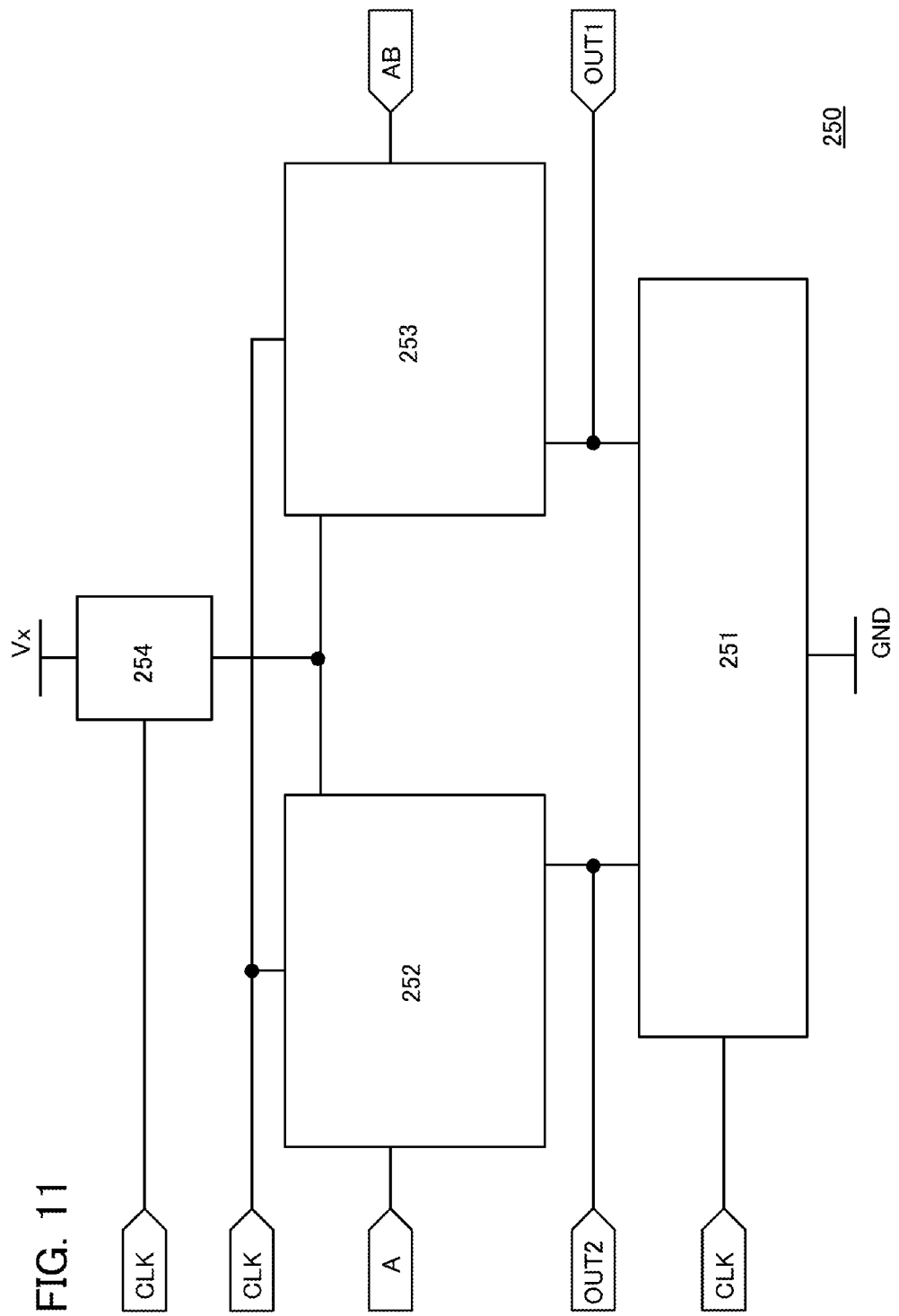
FIG. 11 is a block diagram of a memory device.

FIG. 11 is a block diagram of a memory device according to this embodiment. A memory device 250 in FIG. 11 includes a comparator 251, a memory portion 252, a memory portion 253, and an output potential determiner 254.

The comparator 251 is supplied with a low-level reference potential (e.g., a ground potential GND) and a clock signal CLK. In addition, the comparator 251 is electrically connected to the memory portion 252 and outputs an output signal OUT2. Further, the comparator 251 is electrically connected to the memory portion 253 and outputs an output signal OUT1.

The memory portion 252 is supplied with the clock signal CLK and an input signal A. In addition, the memory portion 252 is electrically connected to the comparator 251 and outputs the output signal OUT2. Further, the memory portion 252 is electrically connected to the memory portion 253 and the output potential determiner 254.

The memory portion 253 is supplied with the clock signal CLK and a signal AB whose phase is the inverse of that of the input signal A. In addition, the memory portion 253 is electrically connected to the comparator 251 and outputs the output signal OUT1. Further, the memory portion 253 is electrically connected to the memory portion 252 and the output potential determiner 254.

The output potential determiner 254 is supplied with the clock signal CLK. In addition, the output potential determiner 254 is electrically connected to the memory portion 252 and the memory portion 253. Further, the output potential determiner 254 is supplied with a power supply potential Vx.

Note that in the memory device 250 in this embodiment, the power supply potential Vx that is the high-level reference potential is always a high-level potential (VDD), and the low-level reference potential is a low-level potential (VSS) (e.g., the ground potential GND).

Figure 12:
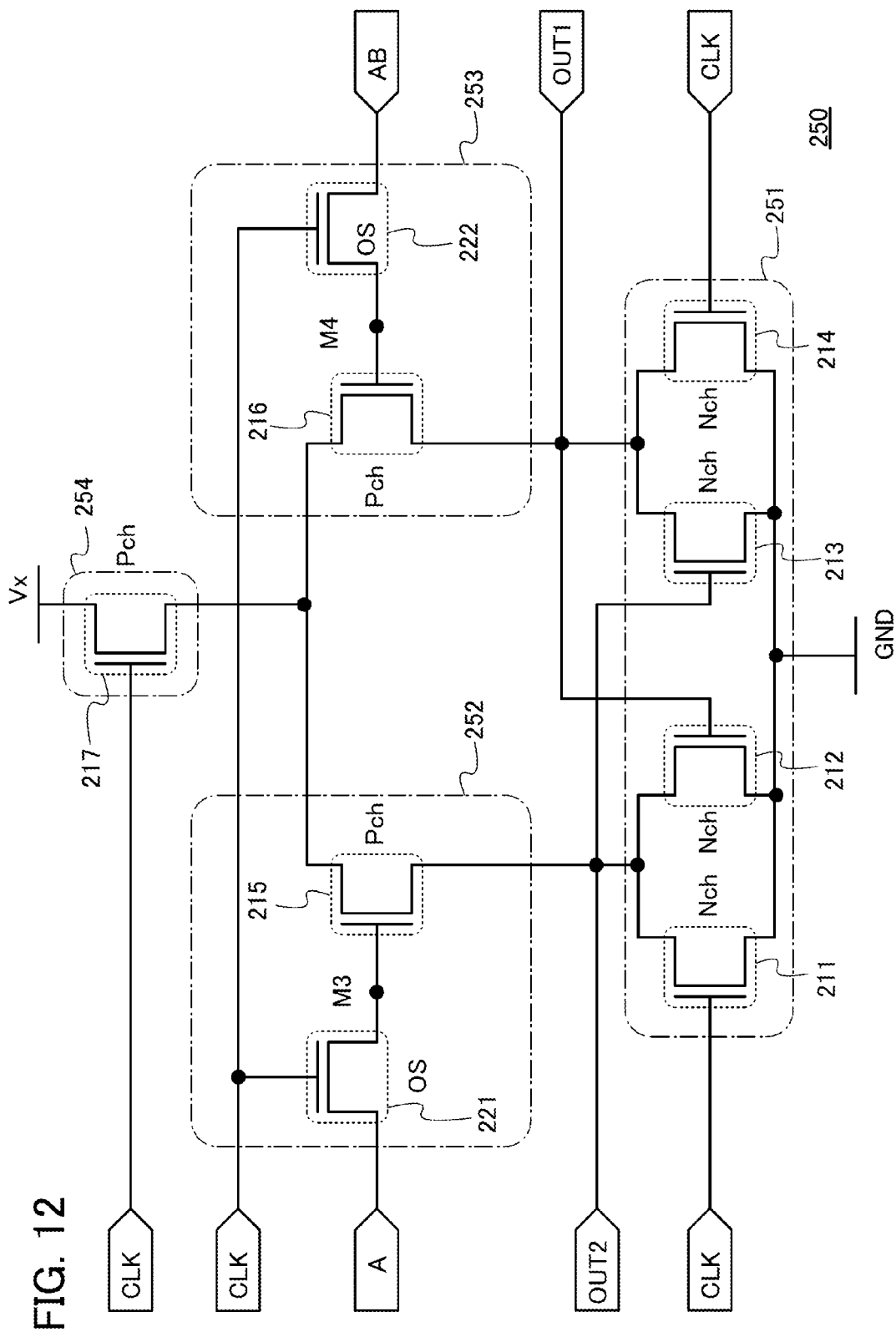
FIG. 12 is a circuit diagram of a memory device.

FIG. 12 is a circuit diagram specifically illustrating the memory device 250 according to this embodiment.

The memory device 250 in FIG. 12 includes a first transistor 221, a second transistor 222, a third transistor 211, a fourth transistor 212, a fifth transistor 213, a sixth transistor 214, a seventh transistor 215, an eighth transistor 216, and a ninth transistor 217.

The comparator 251 includes the third transistor 211, the fourth transistor 212, the fifth transistor 213, and the sixth transistor 214. The memory portion 252 includes the first transistor 221 and the seventh transistor 215. The memory portion 253 includes the second transistor 222 and the eighth transistor 216. The output potential determiner 254 includes the ninth transistor 217.

As the first transistor 221 and the second transistor 222, for example, oxide semiconductor transistors are used. The oxide semiconductor transistor has an advantage of an extremely small leakage current (also referred to as off-state current). Note that the oxide semiconductor transistor is an n-channel transistor.

As the third transistor 211, the fourth transistor 212, the fifth transistor 213, the sixth transistor 214, the seventh transistor 215, the eighth transistor 216, and the ninth transistor 217, silicon transistors are used, for example. In addition, as the third transistor 211, the fourth transistor 212, the fifth transistor 213, and the sixth transistor 214, n-channel transistors are used. As the seventh transistor 215, the eighth transistor 216, and the ninth transistor 217, p-channel transistors are used.

Note that three n-channel transistors, third transistor 211, the fourth transistor 212, the fifth transistor 213, the sixth transistor 214, are not necessarily silicon transistors and may be oxide semiconductor transistors like the first transistor 221 and the second transistor 222.

A gate of the first transistor 221 is supplied with the clock signal CLK and is electrically connected to a gate of the second transistor 222. One of a source and a drain of the first transistor 221 is supplied with the input signal A. The other of the source and the drain of the first transistor 221 is electrically connected to a gate of the seventh transistor 215. Note that a connection portion between the other of the source and the drain of the first transistor 221 and the gate of the seventh transistor 215 is a node M3.

A gate of the second transistor 222 is supplied with the clock signal CLK and is electrically connected to a gate of the first transistor 221. One of a source and a drain of the second transistor 222 is supplied with the signal AB whose phase is the inverse of that of the input signal A. The other of the source and the drain of the second transistor 222 is electrically connected to a gate of the eighth transistor 216. Note that a connection portion between the other of the source and the drain of the second transistor 222 and the gate of the eighth transistor 216 is a node M4.

A gate of the third transistor 211 is supplied with the clock signal CLK. One of a source and a drain of the third transistor 211 is supplied with the low-level reference potential (e.g., the ground potential GND) and is electrically connected to one of a source and a drain of the fourth transistor 212, one of a source and a drain of the fifth transistor 213, and one of a source and a drain of the sixth transistor 214. The output signal OUT2 is output from the other of the source and the drain of the third transistor 211. The other of the source and the drain of the third transistor 211 is electrically connected to the other of the source and the drain of the fourth transistor 212, a gate of the fifth transistor 213, and one of a source and a drain of the seventh transistor 215.

A gate of the fourth transistor 212 outputs the output signal OUT1. The gate of the fourth transistor 212 is electrically connected to the other of the source and the drain of the fifth transistor 213, the other of the source and the drain of the sixth transistor 214, and one of a source and a drain of the eighth transistor 216. One of a source and a drain of the fourth transistor 212 is supplied with the low-level reference potential (e.g., the ground potential GND) and is electrically connected to the one of the source and the drain of the third transistor 211, the one of the source and the drain of the fifth transistor 213, and the one of the source and the drain of the sixth transistor 214. The other of the source and the drain of the fourth transistor 212 outputs the output signal OUT2. The other of the source and the drain of the fourth transistor 212 is electrically connected to the other of the source and the drain of the third transistor 211, the gate of the fifth transistor 213, and the one of the source and the drain of the seventh transistor 215.

A gate of the fifth transistor 213 outputs the output signal OUT2. The gate of the fifth transistor 213 is electrically connected to the other of the source and the drain of the third transistor 211, the other of the source and the drain of the fourth transistor 212, and the one of the source and the drain of the seventh transistor 215. The one of the source and the drain of the fifth transistor 213 is supplied with the low-level reference potential (e.g., the ground potential GND) and is electrically connected to the one of the source and the drain of the third transistor 211, the one of the source and the drain of the fourth transistor 212, and the one of the source and the drain of the sixth transistor 214. The other of the source and the drain of the fifth transistor 213 outputs the output signal OUT1. The other of the source and the drain of the fifth transistor 213 is electrically connected to the gate of the fourth transistor 212, the other of the source and the drain of the sixth transistor 214, and the one of the source and the drain of the eighth transistor 216.

A gate of the sixth transistor 214 is supplied with the clock signal CLK. The one of the source and the drain of the sixth transistor 214 is supplied with the low-level reference potential (e.g., the ground potential GND) and is electrically connected to the one of the source and the drain of the third transistor 211, the one of the source and the drain of the fourth transistor 212, and the one of the source and the drain of the fifth transistor 213. The other of the source and the drain of the sixth transistor 214 outputs the output signal OUT1. The other of the source and the drain of the sixth transistor 214 is electrically connected to the gate of the fourth transistor 212, the other of the source and the drain of the fifth transistor 213, and the one of the source and the drain of the eighth transistor 216.

The gate of the seventh transistor 215 is electrically connected to the other of the source and the drain of the first transistor 221. The one of the source and the drain of the seventh transistor 215 outputs the output signal OUT2. The one of the source and the drain of the seventh transistor 215 is electrically connected to the other of the source and the drain of the third transistor 211, the other of the source and the drain of the fourth transistor 212, and the gate of the fifth transistor 213. The other of the source and the drain of the seventh transistor 215 is electrically connected to the other of the source and the drain of the eighth transistor 216 and the one of the source and the drain of the ninth transistor 217.

The gate of the eighth transistor 216 is electrically connected to the other of the source and the drain of the second transistor 222. The one of the source and the drain of the eighth transistor 216 outputs the output signal OUT1. The one of the source and the drain of the eighth transistor 216 is electrically connected to the gate of the fourth transistor 212, the other of the source and the drain of the fifth transistor 213, and the other of the source and the drain of the sixth transistor 214. The other of the source and the drain of the eighth transistor 216 is electrically connected to the other of the source and the drain of the seventh transistor 215 and the one of the source and the drain of the ninth transistor 217.

A gate of the ninth transistor 217 is supplied with the clock signal CLK. The one of the source and the drain of the ninth transistor 217 is electrically connected to the other of the source and the drain of the seventh transistor 215 and the other of the source and the drain of the eighth transistor 216. The other of the source and the drain of the ninth transistor 217 is supplied with the power supply potential Vx.

When the memory device 250 according to this embodiment is in a standby state, there is only one path of leakage current between the power supply potential Vx that is the high-level reference potential and the low-level reference potential (the ground potential GND). There is only one path of leakage current; thus, power consumption of the memory device 250 in a standby state can be reduced.

In addition, as in Embodiment 1, the memory device 250 according to this embodiment includes 9 transistors in total: 2 oxide semiconductor transistors and 7 silicon transistors. Thus, according to this embodiment, the number of transistors included in a memory device can be reduced.

Figure 13:
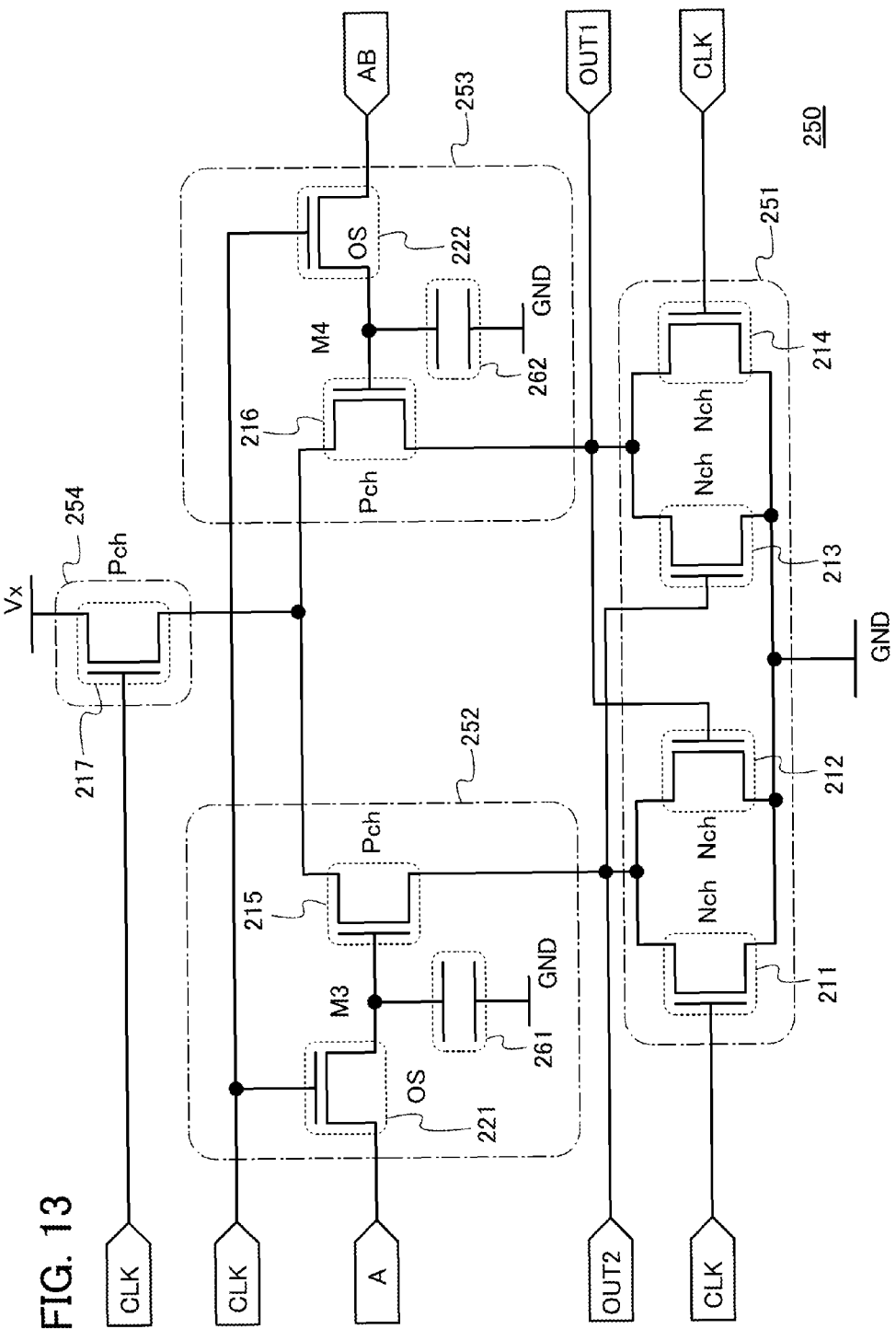
FIG. 13 is a circuit diagram of a memory device.

Note that as shown in FIG. 13, a storage capacitor 261 and a storage capacitor 262 may be provided at the connection portion between the other of the source and the drain of the first transistor 221 and the gate of the seventh transistor 215 (the node M3) and the connection portion between the other of the source and the drain of the second transistor 222 and the gate of the eighth transistor 216 (the node M4), respectively. Operation of the memory device 250 including the storage capacitors 261 and 262 is described later.

<Driving Method of Memory Device>

Figure 14:
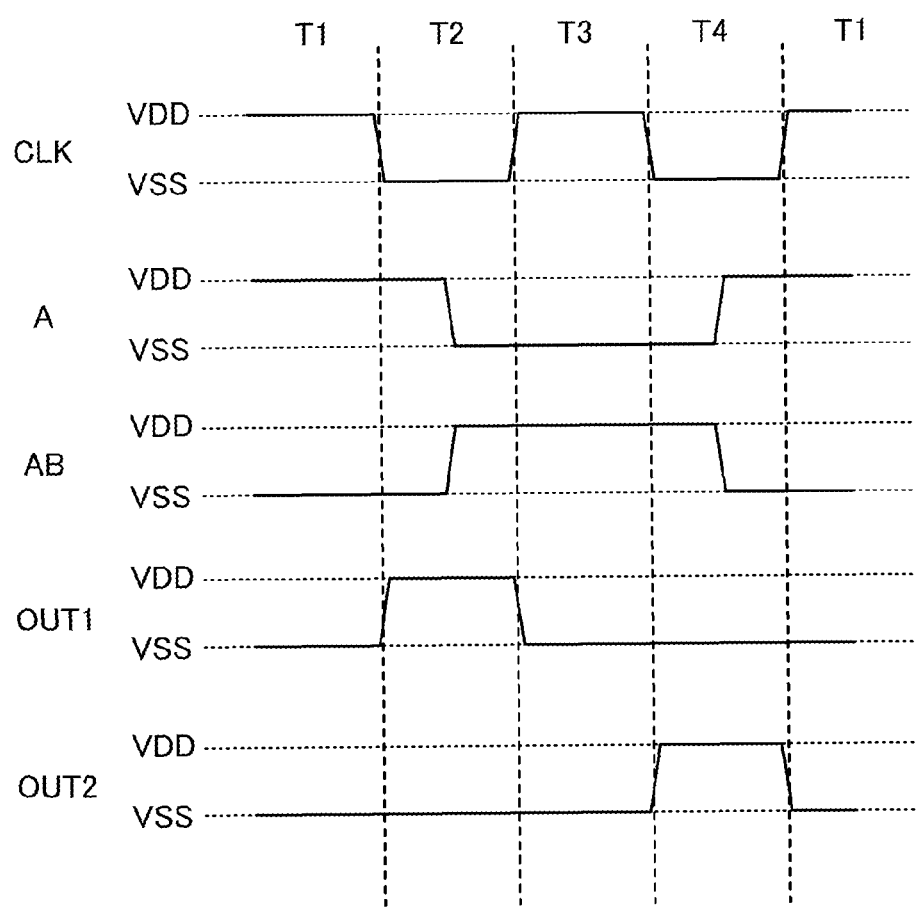
FIG. 14 is a timing chart showing operation of the memory device.

FIG. 14 shows a timing chart for driving the memory device 250 according to this embodiment.

Figure 15:
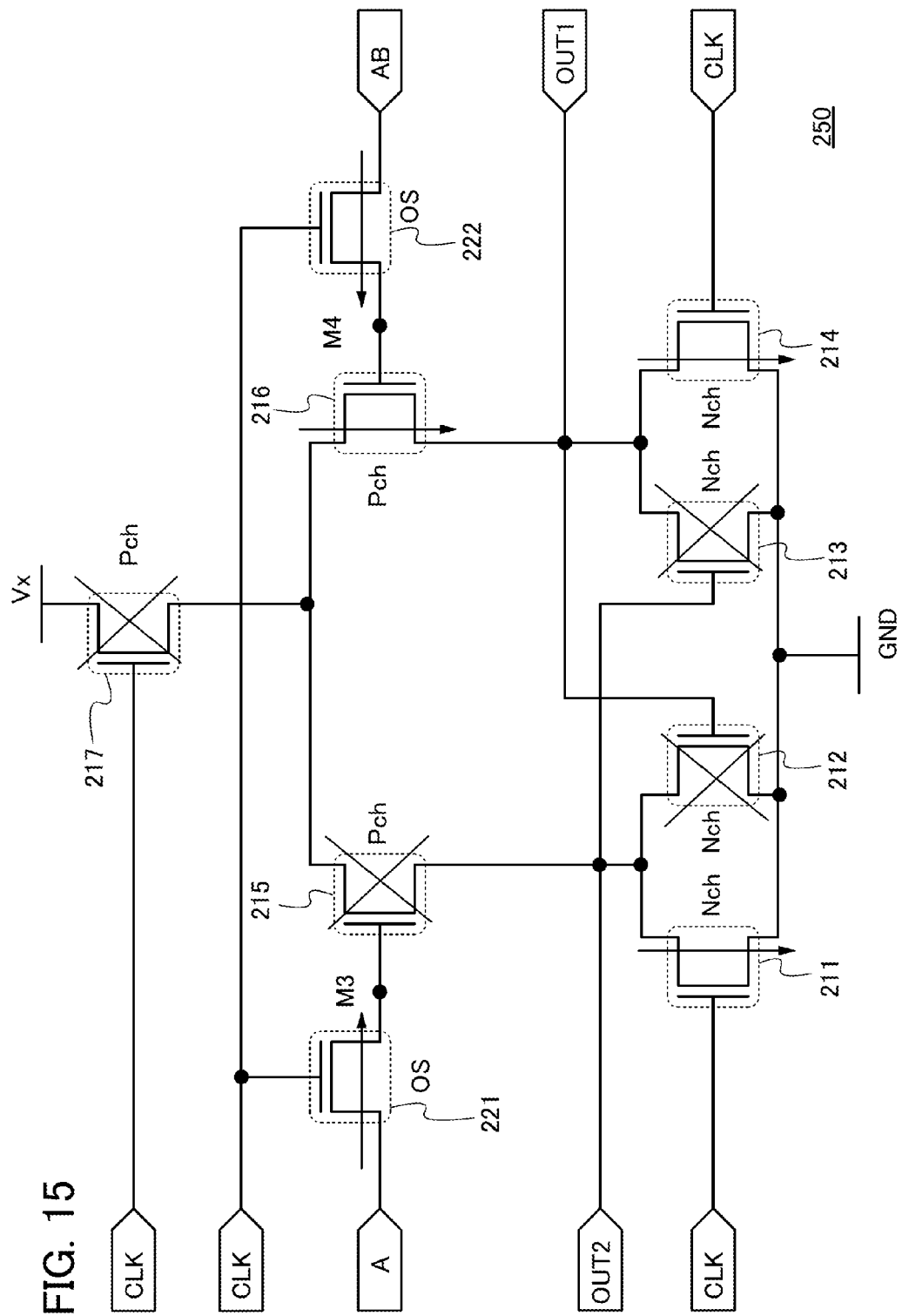
FIG. 15 shows operation of the memory device.

<Period T1 (FIG. 15)>

In the period T1 in FIG. 14, the potential of the clock signal CLK is the high-level potential (VDD), the potential of the input signal A is the high-level potential (VDD), and the potential of the signal AB whose phase is the inverse of that of the input signal A is the low-level potential (VSS). Note that in the memory device 250 in this embodiment, the potential of the power supply potential Vx that is the high-level reference potential is always the high-level potential (VDD), and the low-level reference potential is the low-level potential (VSS) (e.g., the ground potential GND).

Since the potential of the clock signal CLK is the high-level potential (VDD), the high-level potential (VDD) is supplied to gates of the transistors 211 and 214, which are n-channel transistors, whereby the transistor 211 and the transistor 214 are turned on. Thus, the potentials of the output signal OUT1 and the output signal OUT2 become the same potential as the low-level reference potential (e.g., the ground potential GND) (the low-level potential (VSS)).

Since the potentials of the output signal OUT1 and the output signal OUT2 are the low-level potentials (VSS), the low-level potentials (VSS) are supplied to gates of the transistors 212 and 213, which are n-channel transistors; thus, the transistors 212 and 213, which are n-channel transistors, are turned off.

Since the potential of the clock signal CLK is the high-level potential (VDD), the oxide semiconductor transistors 221 and 222 (n-channel transistors) are turned on; thus, the input signal A whose potential is the high-level potential (VDD) in the period T1, is supplied to the node M3 and the gate of the transistor 215 through the transistor 221.

In the case where the storage capacitor 261 and the storage capacitor 262 are provided as shown in FIG. 13, the input signal A is input to the node M3 and the capacitor 261 at the same time. Then, the input signal A is maintained in the node M3 and the storage capacitor 261.

In a similar manner, the signal AB whose potential is the low-level potential (VSS) in the period T1 is input to the node M4 and the gate of the transistor 216 through the transistor 222.

In the case where the storage capacitor 261 and the storage capacitor 262 are provided as shown in FIG. 13, the signal AB is input to the node M4 and the capacitor 262 at the same time. Then, the signal AB is maintained in the node M4 and the storage capacitor 262.

In this embodiment, when the storage capacitor 261 and the storage capacitor 262 are provided, an operation in which the input signal A and the signal AB are input to the storage capacitor 261 and the storage capacitor 262 in addition to the node M3 and the node M4, respectively, is referred to as precharge. In the period T1, the high-level potential (VDD) and the low-level potential (VSS) are input to the node M3 and the node M4, respectively.

In addition, the gate of the transistor 215, which is a p-channel transistor, is supplied with the input signal A whose potential is the high-level potential (VDD), so that the transistor 215 is turned off. The gate of the transistor 216, which is a p-channel transistor, is supplied with the signal AB whose potential is the low-level potential (VSS), so that the transistor 216 is turned on. The gate of the transistor 217, which is a p-channel transistor, is supplied with the clock signal CLK whose potential is the high-level potential (VDD), so that the transistor 217 is turned on.

As described above, in the period T1, the potentials of the output signal OUT1 and the output signal OUT2 are the low-level potentials (VSS). In addition, in the period T1, the input signal A and the signal AB are input to the node M3 and the node M4, respectively.

Figure 16:
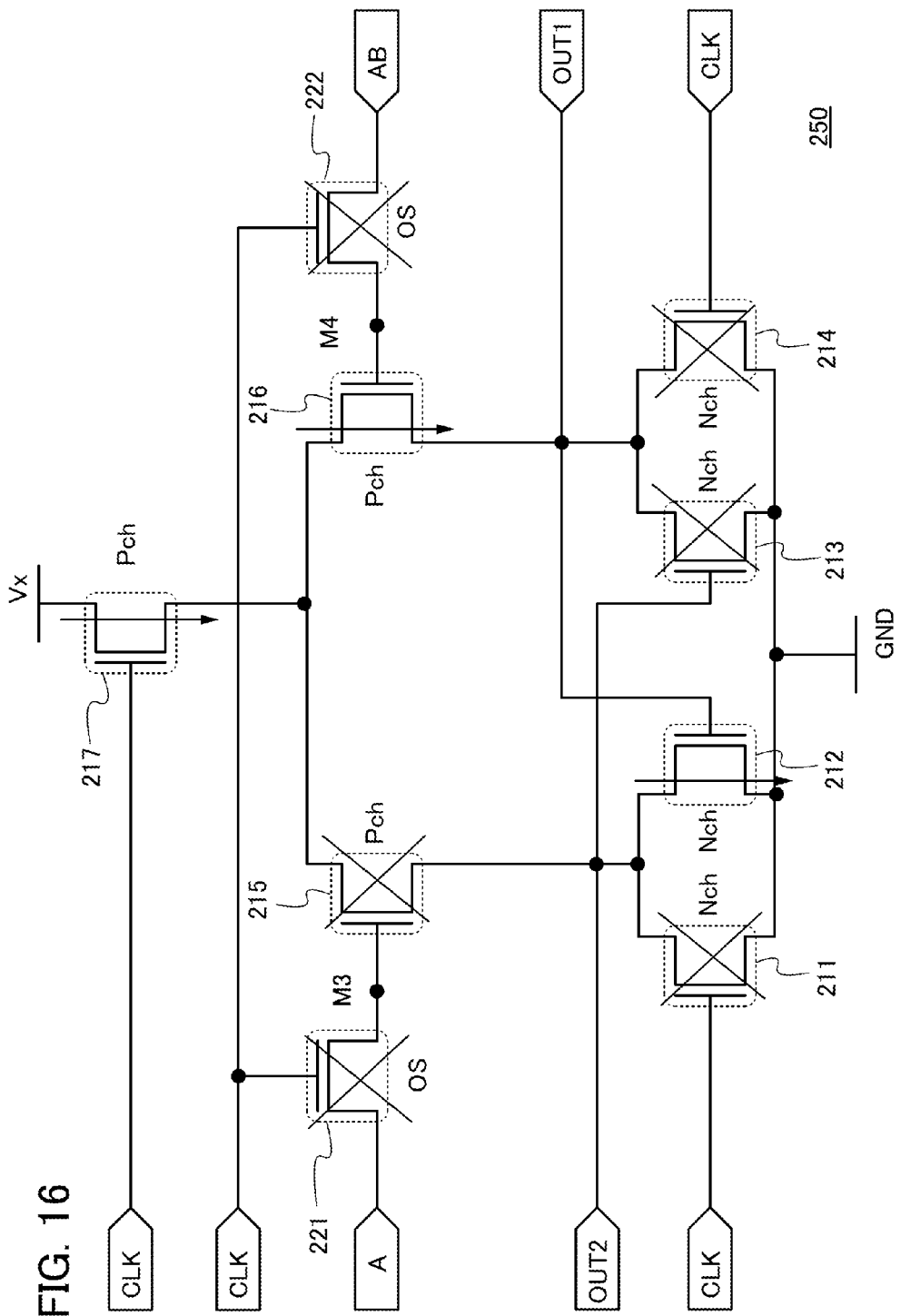
FIG. 16 shows operation of the memory device.

<Period T2 (FIG. 16)>

In the period T2, the potential of the clock signal CLK is the low-level potential (VSS).

Since the potential of the clock signal CLK is the low-level potential (VSS), the transistors 211 and 214, which are n-channel transistors, are turned off. Thus, the supply of the low-level reference potential (e.g., the ground potential GND) to the output signal OUT1 and the output signal OUT2 is stopped.

Since the potential of the clock signal CLK is the low-level potential (VSS), the oxide semiconductor transistors 221 and 222 (n-channel transistors) are turned off. As described above, since the oxide semiconductor transistor has an extremely small leakage current, charges of the node M3 and the node M4 are maintained. Since in the period T1, the potentials of the node M3 and the node M4 are the high-level potential (VDD) and the low-level potential (VSS), respectively, the transistor 215 whose gate is supplied with the high-level potential (VDD) remains off and the transistor 216 whose gate is supplied with the low-level potential (VSS) remains on.

When the storage capacitor 261 and the storage capacitor 262 are provided, like the node M3 and the node M4, the input signal A and the signal AB maintained in the storage capacitor 261 and the storage capacitor 262, respectively, are output to the gate of the transistor 215 and the gate of the transistor 216, respectively.

Further, the gate of the transistor 217, which is a p-channel transistor, is supplied with the clock signal CLK whose potential is the low-level potential (VSS), so that the transistor 217 is turned on.

Since the transistor 217 is on, the potential of the source or the drain of the transistor 217 is changed to the power supply potential Vx. In this embodiment, as described above, the power supply potential Vx is the high-level potential (VDD). Thus, the potential of the source or the drain of the transistor 217 is the high-level potential (VDD).

Since the potential of the one of the source and the drain of the transistor 217 is the high-level potential (VDD), the potential of the other of the source and the drain of the transistor 216 is also the high-level potential (VDD). As described above, since the transistor 216 is on, the potential of the one of the source and the drain of the transistor 216 is also the high-level potential (VDD).

Since the potential of the one of the source and the drain of the transistor 216 is the high-level potential (VDD), the potential of the output signal OUT1 is also the high-level potential (VDD).

Since the potential of the one of the source and the drain of the transistor 216 is the high-level potential (VDD), the high-level potential (VDD) is supplied to the gate of the transistor 212, which is an n-channel transistor; thus, the transistor 212 is turned on.

Since the transistor 212 is on, the low-level reference potential that is the low-level potential (VSS) (e.g., the ground potential GND) is output as the output signal OUT2 whose potential is the low-level potential (VSS) through the transistor 212.

Since the potential of the output signal OUT2 is the low-level potential (VSS), the potential of the gate of the transistor 213 is also the low-level potential (VSS); thus, the transistor 213 remains off.

In addition, the potential of the input signal A is changed from the high-level potential (VDD) to the low-level potential (VSS) during the period T2; however, the output signal OUT1 and the output signal OUT2 are not influenced by the change because the transistor 221 is off. Further, the potential of the signal AB is changed from the low-level potential (VSS) to the high-level potential (VDD) in response to the potential of the input signal A. Similarly to the above, the output signal OUT1 and the output signal OUT2 are not influenced by the change because the transistor 222 is off.

In this manner, the memory device 250 is operated according to the input signal A and the signal AB which are input to the node M3 and the node M4, respectively, in the period T2. In the period T2, the potentials of the output signal OUT1 and the output signal OUT2 are the high-level potential (VDD) and the low-level potential (VSS), respectively.

Note that in the period T2, the transistor 221 and the transistor 222 which are oxide semiconductor transistors are off; however, the output potentials of the output signal OUT1 and the output signal OUT2 are constant. Thus, the memory device 250 is in the standby state in the period T2.

Figure 17:
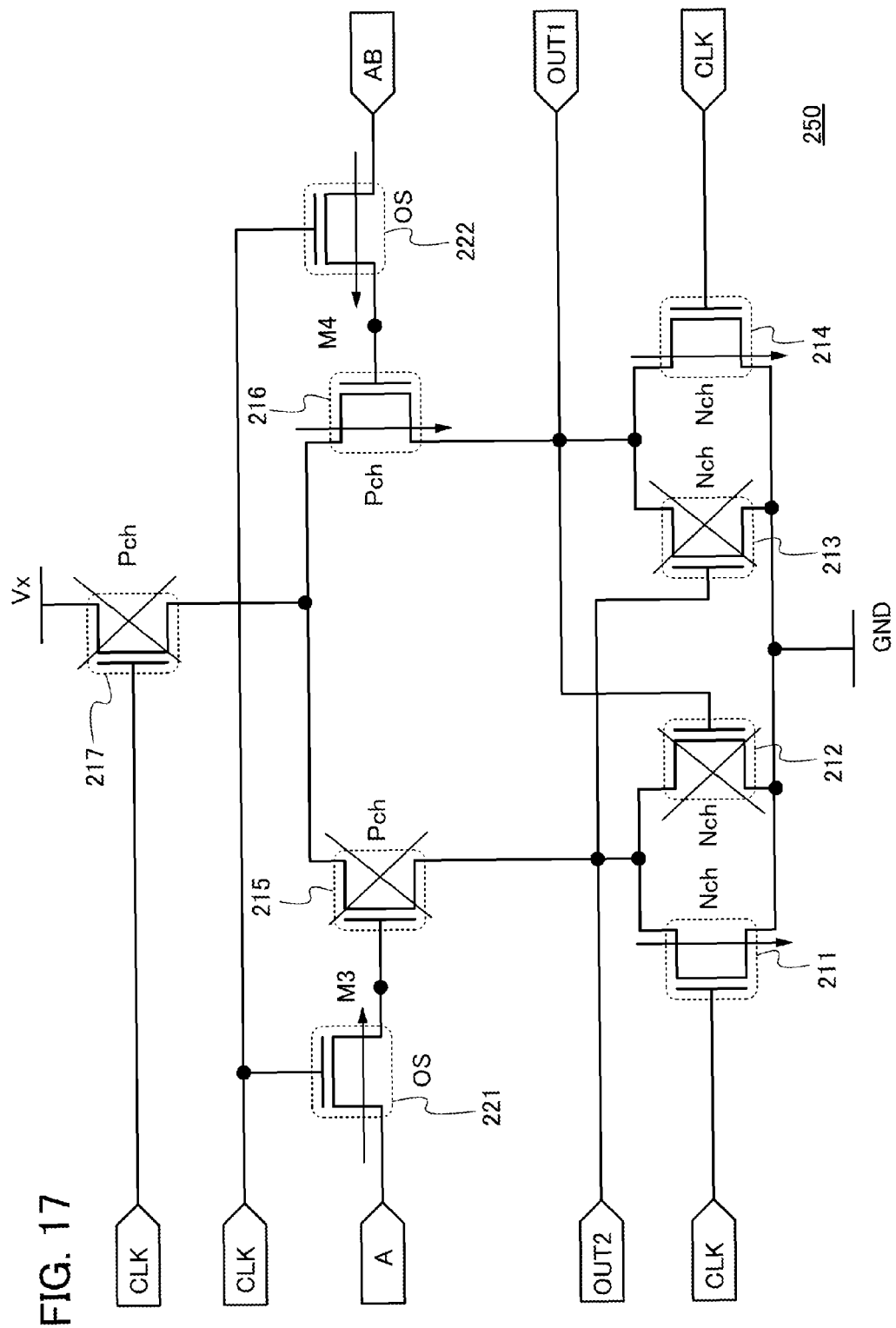
FIG. 17 shows operation of the memory device.

<Period T3 (FIG. 17)>

In the period T3, the potential of the clock signal CLK is the high level potential (VDD), as in the period T1. Note that in the period T3, the potentials of the input signal A and the signal AB are the low-level potential (VSS) and the high-level potential (VDD), respectively, and have phases which are the inverse of those in the period T1.

Operations of the transistor 221, the transistor 222, the transistor 211, the transistor 212, the transistor 213, the transistor 214, and the transistor 217 in the period T3 are similar to those in the period T1.

The input signal A whose potential is the low-level potential (VSS) is input to the gate of the transistor 215 and the node M3 through the transistor 221 which is on. In addition, the signal AB whose potential is the high-level potential (VDD) is input to the gate of the transistor 216 and the node M4 through the transistor 222 which is on.

That is, in the period T3, the potential whose phase is the inverse of that in the period T1 is input to the node M3 and the node M4 (precharge).

When the storage capacitor 261 and the storage capacitor 262 are provided as shown in FIG. 13, the same signals which are input to the node M3 and the node M4 are input to and maintained in the storage capacitor 261 and the storage capacitor 262, respectively.

Figure 18:
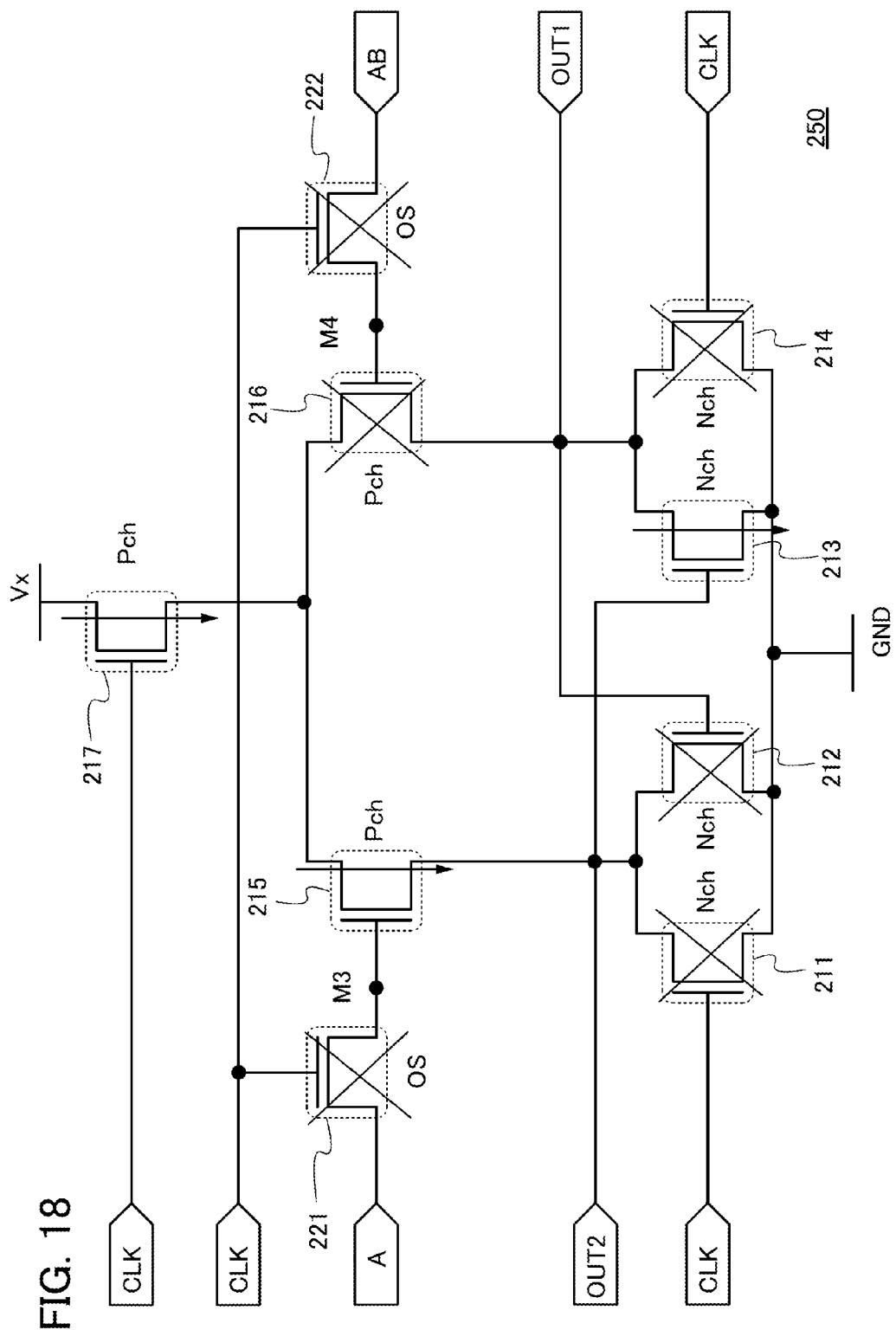
FIG. 18 shows operation of the memory device.

<Period T4 (FIG. 18)>

In the period T4, the potential of the clock signal CLK is the low-level potential (VSS), as in the period T2. Note that at the end of the period T3, the potentials of the node M3 and the node M4 change to the low-level potential (VSS) and the high-level potential (VDD), respectively.

Operations of the transistor 221, the transistor 222, the transistor 211, the transistor 214, and the transistor 217 in the period T4 are similar to those in the period T2.

In the period T4, the oxide semiconductor transistors 221 and 222 (n-channel transistors) are off. As described above, since the oxide semiconductor transistor has an extremely small leakage current, charges of the node M3 and the node M4 are maintained.

In the period T3, the potentials of the node M3 and the node M4 are the low-level potential (VSS) and the high-level potential (VDD), respectively; thus, the transistor 215 whose gate is supplied with the low-level potential (VSS) is on and the transistor 216 whose gate is supplied with the high-level potential (VDD) is off.

When the storage capacitor 261 and the storage capacitor 262 are provided, like the node M3 and the node M4, the input signal A and the signal AB held in the storage capacitor 261 and the storage capacitor 262, respectively, are output to the gate of the transistor 215 and the gate of the transistor 216, respectively.

As in the period T2, the transistor 217 is on. Since the potential of the one of the source and the drain of the transistor 217 is the high-level potential (VDD), the potential of the other of the source and the drain of the transistor 217 is also the high-level potential (VDD). As described above, since the transistor 215 is on, the potential of the one of the source and the drain of the transistor 215 is also the high-level potential (VDD).

Since the potential of the one of the source and the drain of the transistor 215 is the high-level potential (VDD), the potential of the output signal OUT2 is also the high-level potential (VDD).

Since the potential of the one of the source and the drain of the transistor 215 is the high-level potential (VDD), the high-level potential (VDD) is supplied to the gate of the transistor 213, which is a p-channel transistor; thus, the transistor 213 is turned on.

Since the transistor 213 is on, the low-level reference potential that is the low-level potential (VSS) (the ground potential GND) is output as the output signal OUT1 whose potential is the low-level potential (VSS) through the transistor 213.

Since the potential of the output signal OUT1 is the low-level potential (VSS), the potential of the gate of the transistor 212 is also the low-level potential (VSS); thus, the transistor 212 remains off.

In this manner, the memory device 250 is operated according to the input signal

A and the signal AB which are input to the node M3 and the node M4, respectively, in the period T3. In the period T4, the potentials of the output signal OUT1 and the output signal OUT2 are the low-level potential (VSS) and the high-level potential (VDD), respectively.

Note that also in the period T4, the transistor 221 and the transistor 222 which are oxide semiconductor transistors are off; however, the output potentials of the output signal OUT1 and the output signal OUT2 are constant. Thus, also in the period T4, the memory device 250 is in the standby state.

The memory device 250 according to this embodiment can operate without the storage capacitor 261 and the storage capacitor 262. Note that the memory device 250 provided with the storage capacitor 261 and the storage capacitor 262 operates more stably than the memory device 250 without the storage capacitor 261 and the storage capacitor 262.

In this manner, paths of leakage current of the memory device can be reduced according to this embodiment.

Further, power consumption of the memory device can be reduced according to this embodiment.

Furthermore, the area of the memory device can be reduced according to this embodiment.

Furthermore, the number of transistors included in the memory device can be reduced according to this embodiment.

[Embodiment 3]

In this embodiment, an oxide semiconductor transistor is described.

Figure 19A:
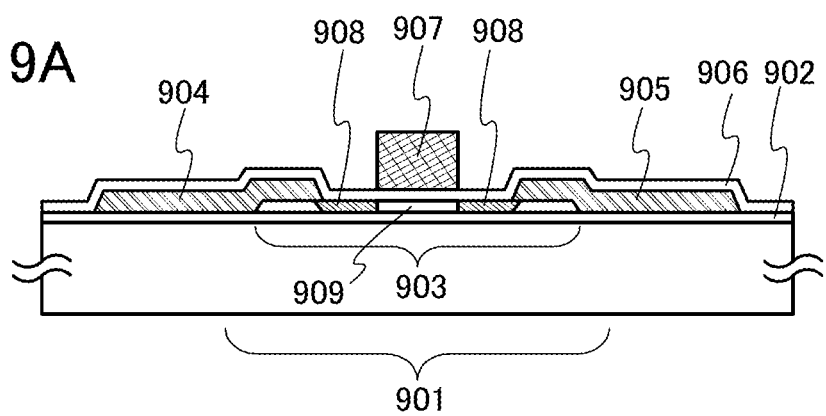
FIGS. 19A and 19B are cross-sectional views of oxide semiconductor transistors.

An oxide semiconductor transistor 901 shown in FIG. 19A includes an oxide semiconductor layer 903 that serves as an active layer and is formed over an insulating film 902; a source electrode 904 and a drain electrode 905 formed over the oxide semiconductor layer 903; a gate insulating film 906 over the oxide semiconductor layer 903, the source electrode 904, and the drain electrode 905; and a gate electrode 907 that is over the gate insulating film 906 and overlaps with the oxide semiconductor layer 903.

The oxide semiconductor transistor 901 shown in FIG. 19A has a top-gate structure where the gate electrode 907 is formed over the oxide semiconductor layer 903 and has a top-contact structure where the source electrode 904 and the drain electrode 905 are formed over the oxide semiconductor layer 903. In the oxide semiconductor transistor 901, the source electrode 904 and the drain electrode 905 do not overlap with the gate electrode 907. In other words, there is a space, which is larger than the thickness of the gate insulating film 906, between the source electrode 904 and the gate electrode 907 and between the drain electrode 905 and the gate electrode 907. Thus, the oxide semiconductor transistor 901 has low parasitic capacitance between the source electrode 904 and the gate electrode 907 and between the drain electrode 905 and the gate electrode 907, thereby achieving high-speed operation.

The oxide semiconductor layer 903 includes a pair of heavily-doped regions 908 obtained by adding a dopant producing n-type conductivity to the oxide semiconductor layer 903 after the gate electrode 907 is formed. A region of the oxide semiconductor layer 903 which overlaps with the gate electrode 907 with the gate insulating film 906 interposed therebetween is a channel formation region 909. In the oxide semiconductor layer 903, the channel formation region 909 is formed between the pair of heavily-doped regions 908. The dopant is added to the heavily-doped regions 908 by ion implantation. The dopant is, for example, a rare gas such as helium, argon, or xenon, or a group 15 element such as nitrogen, phosphorus, arsenic, or antimony.

For example, in the case where nitrogen is used as the dopant, the concentration of nitrogen atoms in the high-concentration regions 908 is preferably higher than or equal to $5 \times 10^{19}/\text{cm}^3$ and lower than or equal to $1 \times 10^{22}/\text{cm}^3$.

The high-concentration regions 908 to which the dopant producing n-type conductivity is added have higher conductivity than the other regions in the oxide semiconductor layer 903. Therefore, by providing the high-concentration regions 908 in the oxide semiconductor layer 903, the resistance between the source electrode 904 and the drain electrode 905 can be decreased.

In the case where an In—Ga—Zn-based oxide semiconductor is used for the oxide semiconductor layer 903, heat treatment is performed at a temperature higher than or equal to 300° C. and lower than or equal to 600° C. for one hour after nitrogen is added. Consequently, the oxide semiconductor in the high-concentration regions 908 has a wurtzite crystal structure. Since the oxide semiconductor in the high-concentration regions 908 has a wurtzite crystal structure, the conductivity of the high-concentration regions 908 can be further increased and the resistance between the source electrode 904 and the drain electrode 905 can be decreased. Note that in order to effectively decrease the resistance between the source electrode 904 and the drain electrode 905 by forming an oxide semiconductor having a wurtzite crystal structure, in the case of using nitrogen as the dopant, the concentration of nitrogen atoms in the high-concentration regions 908 is preferably higher than or equal to $1 \times 10^{20}/\text{cm}^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 903 may be composed of a c-axis aligned crystalline oxide semiconductor (CAAC-OS). The oxide semiconductor layer 903 composed of a CAAC-OS has a higher conductivity than that of an amorphous oxide semiconductor layer; thus, the resistance between the source electrode 904 and the drain electrode 905 can be decreased. Note that a CAAC-OS is described below.

By decreasing the resistance between the source electrode 904 and the drain electrode 905, a high on-state current and high-speed operation can be ensured even when the oxide semiconductor transistor 901 is miniaturized. With the miniaturization of the oxide semiconductor transistor 901, the area occupied by the memory element including the transistor can be reduced and the storage capacity per unit area can be increased.

Note that the oxide semiconductor transistor 901 illustrated in FIG. 19A may include sidewalls formed using an insulating film on a side surface of the gate electrode 907. With the sidewall, a low-concentration region may be formed between the channel formation region 909 and the high-concentration region 908. With the low-concentration region, a negative shift of the threshold voltage due to a short-channel effect can be reduced.

Figure 19B:
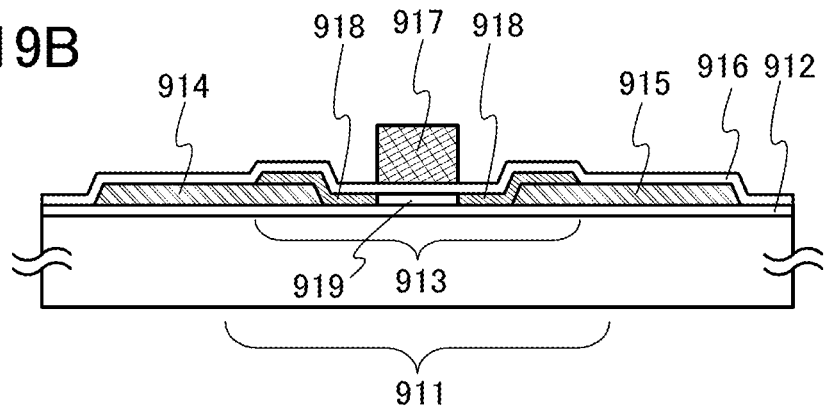

An oxide semiconductor transistor 911 illustrated in FIG. 19B includes a source electrode 914 and a drain electrode 915 formed over an insulating film 912; an oxide semiconductor layer 913 which is formed over the source electrode 914 and the drain electrode 915 and functions as an active layer; a gate insulating film 916 over the oxide semiconductor layer 913, and the source electrode 914 and the drain electrode 915; and a gate electrode 917 which is provided over the gate insulating film 916 so as to overlap with the oxide semiconductor layer 913.

The oxide semiconductor transistor 911 illustrated in FIG. 19B is of a top-gate type where the gate electrode 917 is formed over the oxide semiconductor layer 913, and is also of a bottom-contact type where the source electrode 914 and the drain electrode 915 are formed below the oxide semiconductor layer 913. In the oxide semiconductor transistor 911, the source electrode 914 and the drain electrode 915 do not overlap with the gate electrode 917 as in the oxide semiconductor transistor 901; thus, the parasitic capacitance generated between the gate electrode 917 and each of the source electrode 914 and the drain electrode 915 can be small, so that high speed operation can be achieved.

The oxide semiconductor layer 913 includes a pair of high-concentration regions 918 which are obtained by addition of dopant producing n-type conductivity to the oxide semiconductor layer 913 after formation of the gate electrode 917.

Further, the oxide semiconductor layer 913 includes a channel formation region 919 which overlaps with the gate electrode 917 with the gate insulating film 916 interposed therebetween. In the oxide semiconductor layer 913, the channel formation region 919 is provided between the pair of high-concentration regions 918.

Like the above-described high-concentration regions 908 included in the oxide semiconductor transistor 901, the high-concentration regions 918 can be formed by an ion implantation method. Examples of the kinds of a dopant used to form the high-concentration regions 908 are the same as those of the kinds of a dopant used to form the high-concentration regions 918.

For example, in the case where nitrogen is used as the dopant, the concentration of nitrogen atoms in the high-concentration regions 918 is preferably higher than or equal to $5 \times 10^{19}/cm^3$ and lower than or equal to $1 \times 10^{22}/cm^3$.

The high-concentration regions 918 to which the dopant producing n-type conductivity is added have higher conductivity than the other regions in the oxide semiconductor layer 913. Therefore, by providing the high-concentration regions 918 in the oxide semiconductor layer 913, the resistance between the source electrode 914 and the drain electrode 915 can be decreased.

In the case where an In—Ga—Zn-based oxide semiconductor is used for the oxide semiconductor layer 913, heat treatment is performed at a temperature higher than or equal to 300° C. and lower than or equal to 600° C. after nitrogen is added. Consequently, the oxide semiconductor in the high-concentration regions 918 has a wurtzite crystal structure. Since the oxide semiconductor in the high-concentration regions 918 has a wurtzite crystal structure, the conductivity of the high-concentration regions 918 can be further increased and the resistance between the source electrode 914 and the drain electrode 915 can be decreased. Note that in order to effectively decrease the resistance between the source electrode 914 and the drain electrode 915 by forming an oxide semiconductor having a wurtzite crystal structure, in the case of using nitrogen as the dopant, the concentration of nitrogen atoms in the high-concentration regions 918 is preferably higher than or equal to $1 \times 10^{20}/cm^3$ and lower than or equal to 7 atoms %. However, there is also a case where an oxide semiconductor having a wurtzite crystal structure can be obtained even when the concentration of nitrogen atoms is lower than the above range.

The oxide semiconductor layer 913 may be composed of a CAAC-OS. The oxide semiconductor layer 913 composed of a CAAC-OS has a higher conductivity than that of an amorphous oxide semiconductor layer; thus, the resistance between the source electrode 914 and the drain electrode 915 can be decreased.

By decreasing the resistance between the source electrode 914 and the drain electrode 915, a high on-state current and high-speed operation can be ensured even when the oxide semiconductor transistor 911 is miniaturized. With the miniaturization of the oxide semiconductor transistor 911, the area occupied by the memory element including the transistor can be reduced and the storage capacity per unit area can be increased.

Note that the oxide semiconductor transistor 911 illustrated in FIG. 19B may include sidewalls formed using an insulating film on a side surface of the gate electrode 917. With the sidewall, a low-concentration region may be formed between the channel formation region 919 and the high-concentration region 918. With the low-concentration region, a negative shift of the threshold voltage due to a short-channel effect can be reduced.

The oxide semiconductor transistor 901 or the oxide semiconductor transistor 911 described above can be used as either or both of the transistor 101 and the transistor 102 described in Embodiment 1 and either or both of the transistor 221 and the transistor 222 described in Embodiment 2.

In addition, either or both of the transistor 101 and the transistor 102 described in Embodiment 1 and either or both of the transistor 221 and the transistor 222 described in Embodiment 2 are not limited to the oxide semiconductor transistors described in this embodiment and may be an oxide semiconductor transistor formed in a groove (also referred to as trench).

The methods and structures described in this embodiment can be combined as appropriate with any of the methods and structures described in the other embodiments.

[Embodiment 4]

One mode of a structure of a memory device is described in this embodiment.

Figure 20:
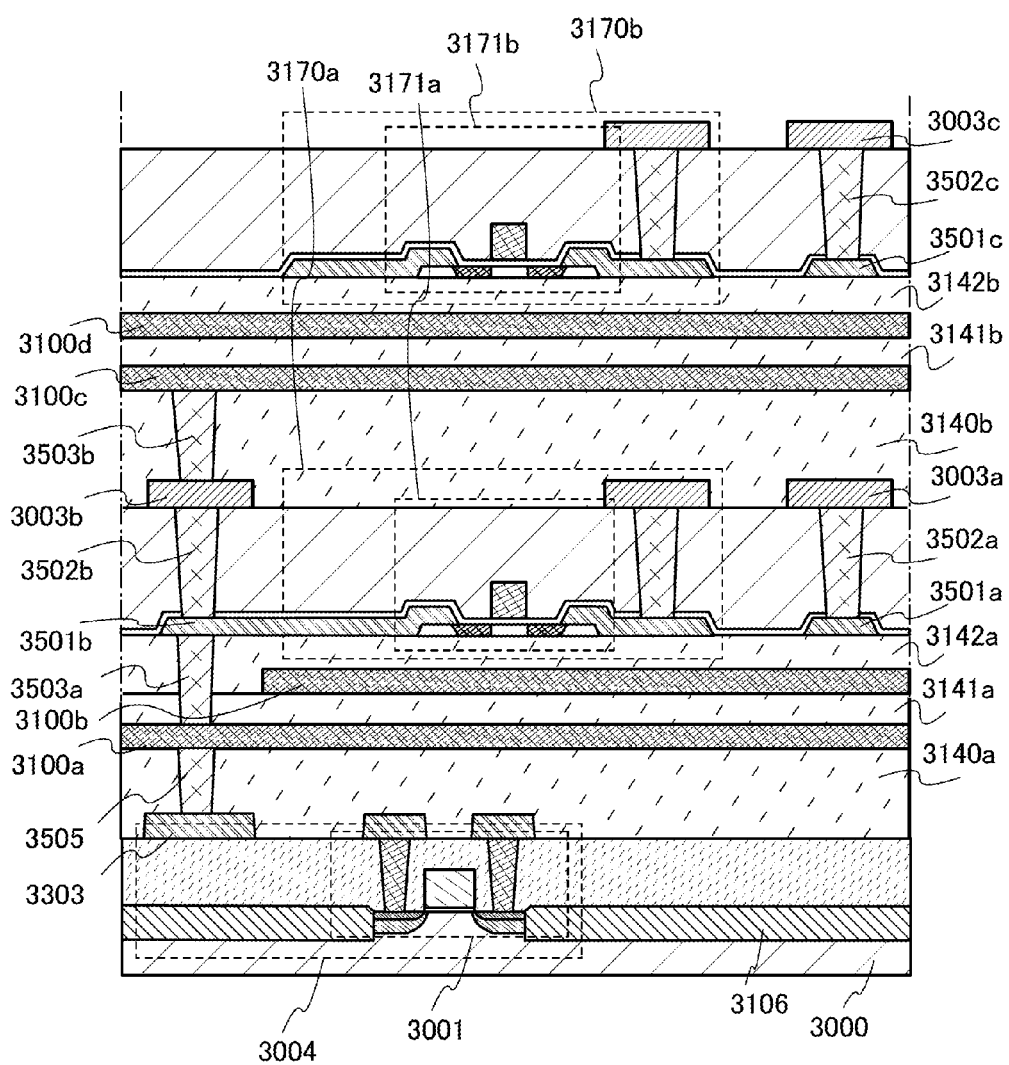
FIG. 20 is a cross-sectional view illustrating a structure of a memory device.

FIG. 20 is a cross-sectional view of a memory device. In the memory device illustrated in FIG. 20, a plurality of memory elements in a plurality of layers are formed in the upper portion, and a logic circuit 3004 is formed in the lower portion. As examples of the plurality of memory elements, a memory element 3170a and a memory element 3170b are illustrated. The memory element 3170a and the memory element 3170b can have the same configuration as, for example, that of the memory device 100 or the memory device 250 in the above embodiments.

Note that a transistor 3171a in the storage element 3170a is illustrated as a representative. A transistor 3171b in the storage element 3170b is illustrated as a representative. In the transistor 3171a and the transistor 3171b, a channel formation region is formed in an oxide semiconductor layer. The transistor 3171a or the transistor 3171b can be used as either or both of the transistor 101 and the transistor 102 which are oxide semiconductor transistors described in Embodiment 1 or either or both of the transistor 221 and the transistor 222 which are oxide semiconductor transistors described in Embodiment 2.

Note that the transistor 3171a and the transistor 3171b in FIG. 20 each have a structure similar to that of the oxide semiconductor transistor 901 in FIG. 19A; however, there is no limitation thereon. The transistor 3171a and the transistor 3171b in FIG. 20 may each have a structure similar to that of the oxide semiconductor transistor 911 in FIG. 19B. The structure of the transistor in which a channel formation region is formed in an oxide semiconductor layer is similar to the structure described in any of the above embodiments; thus, description thereof is omitted.

An electrode 3501a which is formed in the same layer as a source electrode and a drain electrode of the transistor 3171a is electrically connected to an electrode 3003a through an electrode 3502a. An electrode 3501c which is formed in the same layer as a source electrode and a drain electrode of the transistor 3171b is electrically connected to an electrode 3003c through an electrode 3502c.

The logic circuit 3004 includes a transistor 3001 in which a semiconductor material other than an oxide semiconductor is used as a channel formation region. The transistor 3001 can be obtained in such a manner that an element isolation insulating film 3106 is provided over a substrate 3000 including a semiconductor material (e.g., silicon) and a region which is to be a channel formation region is formed in a region surrounded by the element isolation insulating film 3106. Note that the transistor 3001 may be a transistor in which a channel formation region is formed in a semiconductor film such as a silicon film formed on an insulating surface or a silicon film in an SOI substrate. A known structure can be employed for the structure of the transistor 3001; thus, the description thereof is omitted here.

A wiring 3100*a* and a wiring 3100*b* are formed between layers in which the transistor 3171*a* is formed and layers in which the transistor 3001 is formed. An insulating film 3140*a* is provided between the wiring 3100*a* and the layers in which the transistor 3001 is formed, an insulating film 3141*a* is provided between the wiring 3100*a* and the wiring 3100*b*, and an insulating film 3142*a* is provided between the wiring 3100*b* and the layers in which the transistor 3171*a* is formed.

Similarly, a wiring 3100*c* and a wiring 3100*d* are formed between the layers in which the transistor 3171*b* is formed and the layers in which the transistor 3171*a* is formed. An insulating film 3140*b* is provided between the wiring 3100*c* and the layers in which the transistor 3171*a* is formed, an insulating film 3141*b* is provided between the wiring 3100*c* and the wiring 3100*d*, and an insulating film 3142*b* is provided between the wiring 3100*d* and the layers in which the transistor 3171*b* is formed.

The insulating film 3140*a*, the insulating film 3141*a*, the insulating film 3142*a*, the insulating film 3140*b*, the insulating film 3141*b*, and the insulating film 3142*b* function as interlayer insulating films, and their surfaces are planarized.

Through the wiring 3100*a*, the wiring 3100*b*, the wiring 3100*c*, and the wiring 3100*d*, electrical connection between the memory elements, electrical connection between the logic circuit 3004 and the memory element, and the like can be established.

An electrode 3303 included in the logic circuit 3004 can be electrically connected to a circuit provided in the upper portion.

For example, as illustrated in FIG. 20, the electrode 3303 can be electrically connected to the wiring 3100*a* through an electrode 3505. The wiring 3100*a* can be electrically connected to an electrode 3501*b* through an electrode 3503*a*. In this manner, the wiring 3100*a* and the electrode 3303 can be electrically connected to the source or the drain of the transistor 3171*a*. The electrode 3501*b* can be electrically connected to an electrode 3003*b* through an electrode 3502*b*. The electrode 3003*b* can be electrically connected to the wiring 3100*c* through an electrode 3503*b*.

FIG. 20 illustrates an example in which the electrode 3303 and the transistor 3171*a* are electrically connected to each other through the wiring 3100*a*; however, there is no limitation thereon. The electrode 3303 and the transistor 3171*a* may be electrically connected to each other through the wiring 3100*b*, or may be electrically connected to each other through both the wiring 3100*a* and the wiring 3100*b*.

Note that FIG. 20 illustrates an example in which the two memory elements (the memory element 3170*a* and the memory element 3170*b*) overlap each other; however, the number of stacked memory elements is not limited to two.

FIG. 20 illustrates an example where two wiring layers, i.e., a wiring layer in which the wiring 3100*a* is formed and a wiring layer in which the wiring 3100*b* is formed are provided between the layers in which the transistor 3171*a* is formed and the layers in which the transistor 3001 is formed; however, the structure is not limited thereto. One wiring layer may be provided or three or more wiring layers may be provided between the layers in which the transistor 3171*a* is formed and the layers in which the transistor 3001 is formed.

FIG. 20 illustrates an example where two wiring layers, i.e., a wiring layer in which the wiring 3100*c* is formed and a wiring layer in which the wiring 3100*d* is formed are provided between the layers in which the transistor 3171*b* is formed and the layers in which the transistor 3171*a* is formed; however, the structure is not limited thereto. One wiring layer may be provided or three or more wiring layers may be provided between the layers in which the transistor 3171*b* is formed and the layers in which the transistor 3171*a* is formed.

This embodiment can be implemented in appropriate combination with any of the above embodiments.

[Embodiment 5]

In this embodiment, description is given of a configuration of a central processing unit (CPU) which is one of signal processing circuits according to one embodiment of the disclosed invention.

Figure 21:
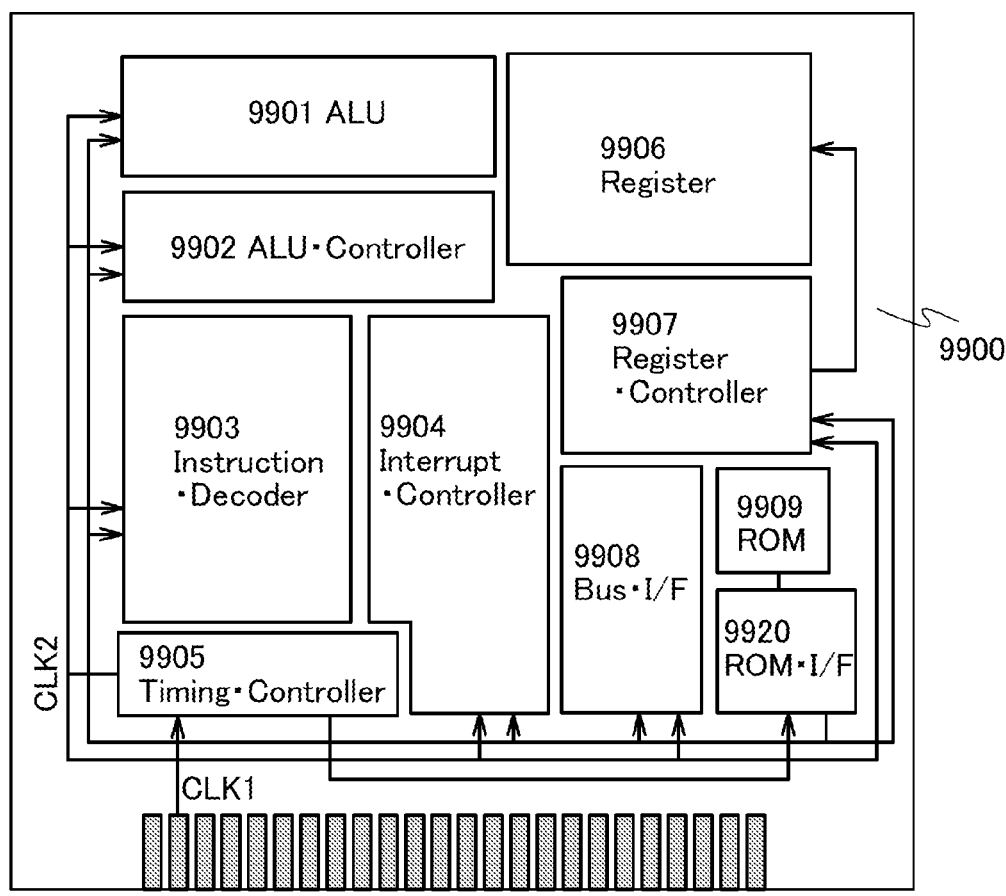
FIG. 21 is a block diagram of a CPU including a memory device.

FIG. 21 illustrates the configuration of the CPU according to this embodiment. The CPU illustrated in FIG. 21 mainly includes, over a substrate 9900, an arithmetic logic unit (ALU) 9901, an ALU controller 9902, an instruction decoder 9903, an interrupt controller 9904, a timing controller 9905, a register 9906, a register controller 9907, a bus interface (Bus I/F) 9908, a rewritable ROM 9909, and a ROM interface (ROM I/F) 9920. The ROM 9909 and the ROM I/F 9920 may be provided over another chip. It is needless to say that the CPU in FIG. 21 is only an example in which the configuration is simplified, and actual CPUs have various configurations depending on the application.

An instruction input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit depending on its priority or a mask state. The register controller 9907 generates an address of the register 9906, and reads/writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, the memory device 100 or the memory device 250 having the structure described in any of the above embodiments is provided in the register 9906. As described above, a memory device in which power consumption, the area, and the number of transistors included therein are reduced is used, so that in the CPU of this embodiment, power consumption, the area, and the number of transistors included therein can be reduced.

Although the CPU is described as an example in this embodiment, the signal processing circuit of one embodiment of the disclosed invention is not limited to the CPU and can be applied to an LSI such as a microprocessor, an image processing circuit, a DSP, or an FPGA.

This embodiment can be implemented in combination with any of the above embodiments.

[Embodiment 6]

In this embodiment, an oxide semiconductor transistor used in one embodiment of the disclosed invention is specifically described. Note that the oxide semiconductor transistor in Embodiment 3 can be referred to for the description of the oxide semiconductor transistor in this embodiment.

An oxide semiconductor used for the oxide semiconductor transistor in this embodiment preferably contains at least indium (In) or zinc (Zn). In particular, In and Zn are preferably contained. As a stabilizer for reducing variation in electric characteristics of a transistor using the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

Alternatively, a material represented by $InMO_3(ZnO)_m$, (m>0 is satisfied, and m is not an integer) may be used as an oxide semiconductor. Note that M represents one or more metal elements selected from Ga, Fe, Mn, and Co. For example, M can be Ga, Ga and Al, Ga and Mn, Ga and Co, or the like. Still alternatively, a material represented by $In_3SnO_5(ZnO)_n$ (n>0 is satisfied, and n is an integer) may be used as an oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or any of oxides whose composition is in the neighborhood of the above compositions may be used.

Note that one embodiment of the disclosed invention is not limited thereto, and a material having appropriate composition depending on semiconductor characteristics (mobility, threshold, variation, and the like) may be used. Further, it is preferable to appropriately set the carrier density, the impurity concentration, the defect density, the atomic ratio of a metal element and oxygen, the interatomic distance, the density, or the like in order to obtain necessary semiconductor characteristics.

For example, with an In—Sn—Zn-based oxide, high mobility can be realized relatively easily. However, even with an In—Ga—Zn-based oxide, mobility can be increased by reducing the defect density in the bulk.

Note that for example, the expression "the composition of an oxide with an atomic ratio of In:Ga:Zn=a:b:c (a+b+c=1) is in the neighborhood of the composition of an oxide with an atomic ratio of In:Ga:Zn=A:B:C (A+B+C=1)" means that a, b, and c satisfy the following relation: $(a-A)^2+(b-B)^2+(c-C)^2 \leq r^2$. A variable r may be 0.05, for example. The same can be applied to other oxides.

The oxide semiconductor may be either a single crystal oxide semiconductor or a non-single-crystal oxide semiconductor. In the latter case, the non-single-crystal oxide semiconductor may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be suppressed, and relatively high mobility can be obtained with relative ease.

In an oxide semiconductor having crystallinity, defects in the bulk can be further reduced, and when surface evenness is improved, mobility higher than that of an oxide semiconductor in an amorphous state can be realized. In order to improve the surface evenness, the oxide semiconductor is preferably deposited over a flat surface. Specifically, the oxide semiconductor is preferably deposited over a surface with an average surface roughness (Ra) of less than or equal to 1 nm, preferably less than or equal to 0.3 nm, more preferably less than or equal to 0.1 nm.

Note that Ra in this specification refers to a centerline average roughness obtained by three-dimensionally expanding a centerline average roughness defined by JIS B0601 so as to be applied to a plane to be measured. The Ra can be expressed as an "average value of absolute values of deviations from a reference plane to a designated plane", and is defined with the following equation.

$$Ra = \frac{1}{S_0}\int_{y_1}^{y_2}\int_{x_1}^{x_2}|f(x,y)-Z_0|dxdy \qquad \text{[EQUATION 1]}$$

Note that in Equation 1, $S_0$ represents the area of a measurement surface (a rectangular region which is defined by four points represented by the coordinates $(x_1, y_1)$, $(x_1, y_2)$, $(x_2, y_1)$, and $(x_2, y_2)$), and $Z_0$ represents the average height of a measurement surface. Ra can be measured using an atomic force microscope (AFM).

When an oxide semiconductor film of one embodiment of the disclosed invention has crystallinity, the above-described CAAC-OS may be used. A CAAC-OS is described below.

In this embodiment, an oxide including CAAC (c-axis aligned crystal), which has a triangular or hexagonal atomic arrangement when seen from the direction of an a-b plane, a surface, or an interface, is described. In the crystal, metal atoms are arranged in a layered manner, or metal atoms and oxygen atoms are arranged in a layered manner along the c-axis, and the direction of the a-axis or the b-axis is varied in the a-b plane (the crystal rotates around the c-axis).

In a broad sense, an "oxide including CAAC" means a non-single-crystal oxide including a phase which has a triangular, hexagonal, regular triangular, or regular hexagonal atomic arrangement when seen from the direction perpendicular to the a-b plane and in which metal atoms are arranged in a layered manner or metal atoms and oxygen atoms are arranged in a layered manner when seen from the direction perpendicular to the c-axis direction.

The CAAC is not a single crystal, but this does not mean that the CAAC is composed of only an amorphous component. Although the CAAC includes a crystallized portion (crystalline portion), a boundary between one crystalline portion and another crystalline portion is not clear in some cases.

In the case where oxygen is included in the CAAC, nitrogen may be substituted for part of oxygen included in the CAAC. The c-axes of individual crystalline portions included in the CAAC may be aligned in one direction (e.g., the direction perpendicular to a surface of a substrate over which the CAAC is formed or a surface of the CAAC). Alternatively, the normals of the a-b planes of the individual crystalline portions included in the CAAC may be aligned in one direction (e.g., the direction perpendicular to a surface of a substrate over which the CAAC is formed or a surface of the CAAC).

The CAAC can be a conductor, a semiconductor, or an insulator, depending on its composition or the like. The CAAC transmits or does not transmit visible light depending on its composition or the like.

As an example of such a CAAC, there is a crystal which is formed into a film shape and has a triangular or hexagonal atomic arrangement when observed from the direction perpendicular to a surface of the film or a surface of a substrate over which the CAAC is formed, and in which metal atoms are arranged in a layered manner or metal atoms and oxygen atoms (or nitrogen atoms) are arranged in a layered manner when a cross section of the film is observed.

An example of a crystal structure of the CAAC is described in detail with reference to FIGS. 22A to 22E, FIGS. 23A to 23C, and FIGS. 24A to 24C. In FIGS. 22A to 22E, FIGS. 23A to 23C, and FIGS. 24A to 24C, the vertical direction corresponds to the c-axis direction and a plane perpendicular to the c-axis direction corresponds to the a-b plane, unless otherwise specified. When the expressions "upper half" and "lower half" are simply used, they refer to the upper half above the a-b plane and the lower half below the a-b plane (the upper half and the lower half with respect to the a-b plane). Further, in FIGS. 22A to 22E, O surrounded by a circle represents tetracoordinate O and O surrounded by a double circle represents tricoordinate O.

Figure 22A:
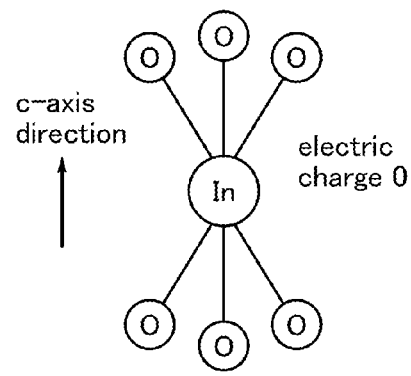
FIGS. 22A to 22E each illustrate a structure of an oxide material.

FIG. 22A illustrates a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 22A is actually an octahedral structure, but is illustrated as a planar structure for simplicity. Note that three tetracoordinate O atoms exist in each of the upper half and the lower half in FIG. 22A. In the small group illustrated in FIG. 22A, electric charge is 0.

Figure 22D:
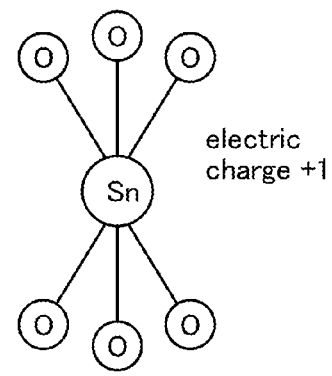
Figure 22B:
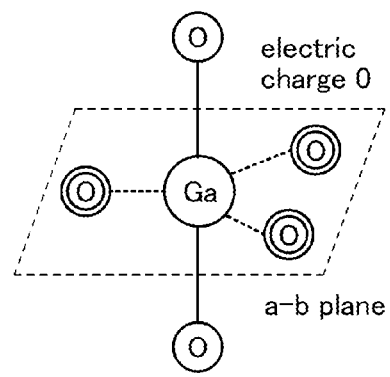

FIG. 22B illustrates a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of the upper half and the lower half in FIG. 22B. An In atom can also have the structure illustrated in FIG. 22B because an In atom can have five ligands. In the small group illustrated in FIG. 22B, electric charge is 0.

Figure 22E:
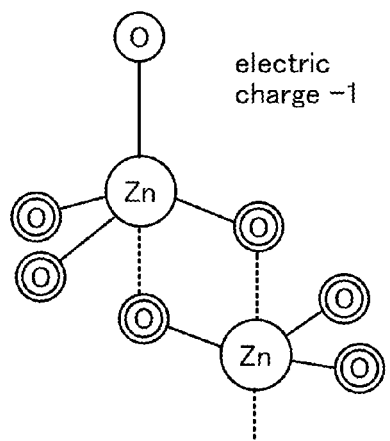
Figure 22C:
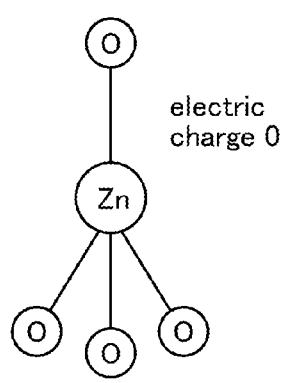

FIG. 22C illustrates a structure including one tetracoordinate Zn atom and four tetracoordinate O atoms proximate to the Zn atom. In FIG. 22C, one tetracoordinate O atom exists in the upper half and three tetracoordinate O atoms exist in the lower half Alternatively, three tetracoordinate O atoms may exist in the upper half and one tetracoordinate O atom may exist in the lower half in FIG. 22C. In the small group illustrated in FIG. 22C, electric charge is 0.

FIG. 22D illustrates a structure including one hexacoordinate Sn atom and six tetracoordinate O atoms proximate to the Sn atom. In FIG. 22D, three tetracoordinate O atoms exist in each of the upper half and the lower half. In the small group illustrated in FIG. 22D, electric charge is +1.

FIG. 22E illustrates a small group including two Zn atoms. In FIG. 22E, one tetracoordinate O atom exists in each of the upper half and the lower half. In the small group illustrated in FIG. 22E, electric charge is −1.

Here, a plurality of small groups form a medium group, and a plurality of medium groups form a large group (also referred to as a unit cell).

Now, a rule of bonding between the small groups is described. The three O atoms in the upper half with respect to the hexacoordinate In atom each have three proximate In atoms in the downward direction, and the three O atoms in the lower half each have three proximate In atoms in the upward direction. The one O atom in the upper half with respect to the pentacoordinate Ga atom has one proximate Ga atom in the downward direction, and the one O atom in the lower half has one proximate Ga atom in the upward direction. The one O atom in the upper half with respect to the tetracoordinate Zn atom has one proximate Zn atom in the downward direction, and the three O atoms in the lower half each have three proximate Zn atoms in the upward direction. In this manner, the number of the tetracoordinate O atoms above the metal atom is equal to the number of the metal atoms proximate to and below each of the tetracoordinate O atoms. Similarly, the number of the tetracoordinate O atoms below the metal atom is equal to the number of the metal atoms proximate to and above each of the tetracoordinate O atoms. Since the coordination number of the tetracoordinate O atom is 4, the sum of the number of the metal atoms proximate to and below the O atom and the number of the metal atoms proximate to and above the O atom is 4. Accordingly, when the sum of the number of tetracoordinate O atoms above a metal atom and the number of tetracoordinate O atoms below another metal atom is 4, the two kinds of small groups including the metal atoms can be bonded. For example, in the case where the hexacoordinate metal (In or Sn) atom is bonded through three tetracoordinate O atoms in the lower half, it is bonded to the pentacoordinate metal (Ga or In) atom or the tetracoordinate metal (Zn) atom.

A metal atom whose coordination number is 4, 5, or 6 is bonded to another metal atom through a tetracoordinate O atom in the c-axis direction. In addition to the above, a medium group can be formed in a different manner by combining a plurality of small groups so that the total electric charge of the layered structure is 0.

Figure 23A:
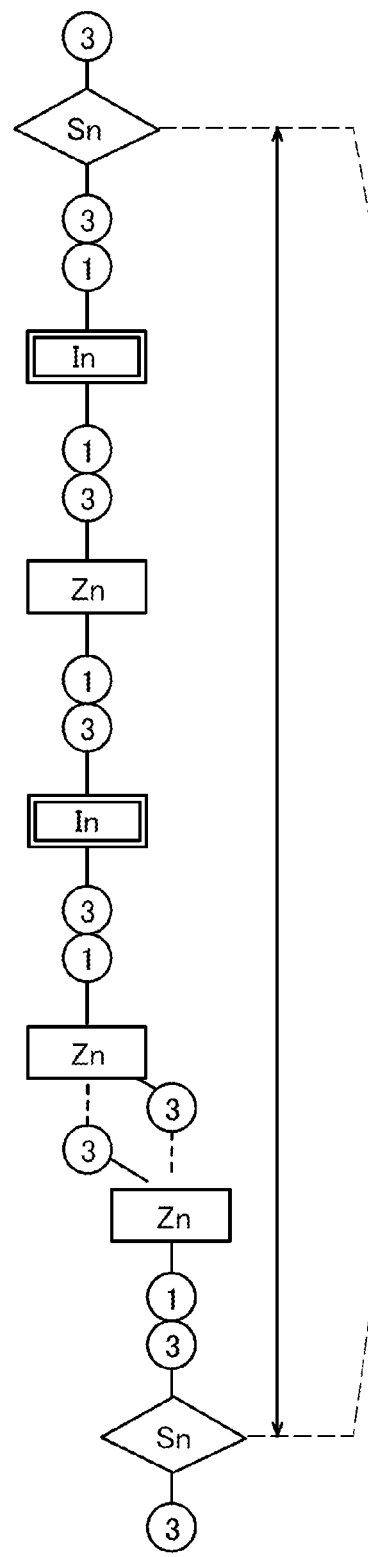
FIGS. 23A to 23C illustrate a structure of an oxide material.
Figure 23B:
Figure 23C:
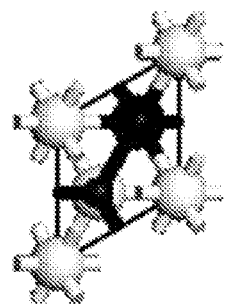

FIG. 23A illustrates a model of a medium group included in a layered structure of an In—Sn—Zn—O-based material. FIG. 23B illustrates a large group including three medium groups. Note that FIG. 23C illustrates an atomic arrangement in the case where the layered structure in FIG. 23B is observed from the c-axis direction.

In FIG. 23A, a tricoordinate O atom is omitted for simplicity, and a tetracoordinate O atom is illustrated by a circle; the number in the circle shows the number of tetracoordinate O atoms. For example, three tetracoordinate O atoms existing in each of the upper half and the lower half with respect to a Sn atom are denoted by circled 3. Similarly, in FIG. 23A, one tetracoordinate O atom existing in each of the upper half and the lower half with respect to an In atom is denoted by circled 1. FIG. 23A also illustrates a Zn atom proximate to one tetracoordinate O atom in the lower half and three tetracoordinate O atoms in the upper half, and a Zn atom proximate to one tetracoordinate O atom in the upper half and three tetracoordinate O atoms in the lower half.

In the medium group included in the layered structure of the In—Sn—Zn—O-based material in FIG. 23A, in the order starting from the top, a Sn atom proximate to three tetracoordinate O atoms in each of the upper half and the lower half is bonded to an In atom proximate to one tetracoordinate O atom in each of the upper half and the lower half, the In atom is bonded to a Zn atom proximate to three tetracoordinate O atoms in the upper half, the Zn atom is bonded to an In atom proximate to three tetracoordinate 0 atoms in each of the upper half and the lower half through one tetracoordinate O atom in the lower half with respect to the Zn atom, the In atom is bonded to a small group that includes two Zn atoms and is proximate to one tetracoordinate O atom in the upper half, and the small group is bonded to a Sn atom proximate to three tetracoordinate O atoms in each of the upper half and the lower half through one tetracoordinate O atom in the lower half with respect to the small group. A plurality of such medium groups is bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracooridnate) Zn atom, and electric charge of a (pentacoordinate or hexacoordinate) Sn atom are +3, +2, and +4, respectively. Accordingly, electric charge in a small group including a Sn atom is +1. Therefore, electric charge of −1, which cancels +1, is needed to form a layered structure including a Sn atom. As a structure having electric charge of −1, the small group including two Zn atoms as illustrated in FIG. 22E can be given. For example, with one small group including two Zn atoms, electric charge of one small group including a Sn atom can be cancelled, so that the total electric charge of the layered structure can be 0.

Specifically, when the large group illustrated in FIG. 23B is repeated, an In—Sn—Zn—O-based crystal ($In_2SnZn_3O_8$) can be obtained. Note that a layered structure of the obtained In—Sn—Zn—O-based crystal can be expressed by a composition formula, $In_2SnZn_2O_7(ZnO)_m$ (m is 0 or a natural number).

The above-described rule also applies to the following oxides: a four-component metal oxide such as an In—Sn—Ga—Zn-based oxide; a three-component metal oxide such as an In—Ga—Zn-based oxide (also referred to as IGZO), an In—Al—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a single-component metal oxide, such as an In—based oxide, a Sn-based oxide, or a Zn-based oxide; and the like.

Figure 24A:
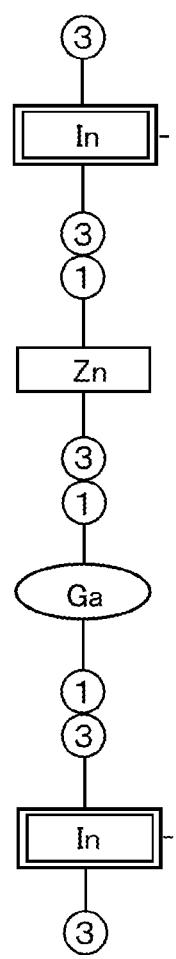
FIGS. 24A to 24C illustrate a structure of an oxide material.

As an example, FIG. 24A illustrates a model of a medium group included in a layered structure of an In—Ga—Zn—O-based material.

In the medium group included in the layered structure of the In—Ga—Zn—O-based material in FIG. 24A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups is bonded, so that a large group is formed.

Figure 24B:
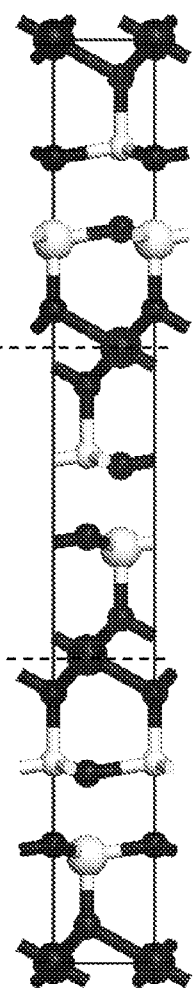
Figure 24C:
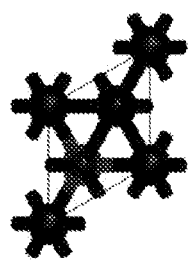

FIG. 24B illustrates a large group including three medium groups. Note that FIG. 24C illustrates an atomic arrangement in the case where the layered structure in FIG. 24B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of the In—Ga—Zn—O-based material, a large group can be formed using not only the medium group illustrated in FIG. 24A but also a medium group in which the arrangement of the In atom, the Ga atom, and the Zn atom is different from that in FIG. 24A.

Specifically, when the large group illustrated in FIG. 24B is repeated, an In—Ga—Zn—O-based crystal can be obtained. Note that a layered structure of the obtained In—Ga—Zn—O-based crystal can be expressed by a composition formula, $InGaO_3(ZnO)_n$ (n is a natural number).

Figure 39A:
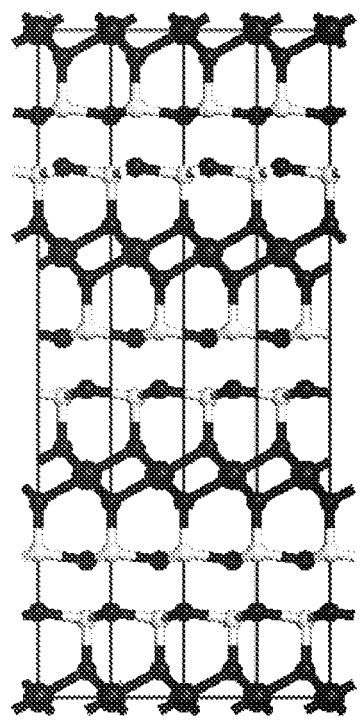
FIGS. 39A and 39B illustrate structures of oxide materials.

In the case where n is 1 ($InGaZnO_4$), a crystal structure illustrated in FIG. 39A can be obtained, for example. Note that in the crystal structure in FIG. 39A, since a Ga atom and an In atom each have five ligands as described in FIG. 22B, a structure in which Ga is replaced with In can be obtained.

Figure 39B:
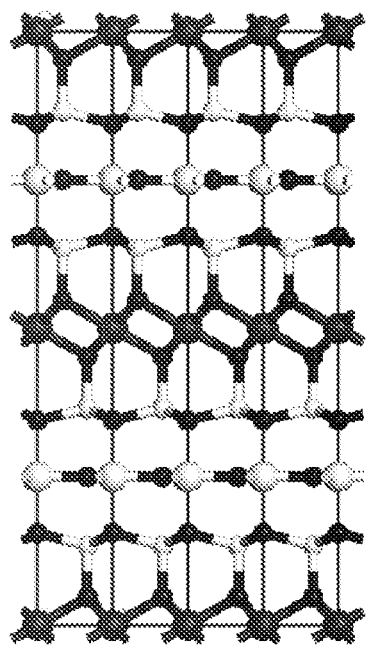

In the case where n is 2 ($InGaZn_2O_5$), a crystal structure illustrated in FIG. 39B can be obtained, for example. Note that in the crystal structure in FIG. 39B, since a Ga atom and an In atom each have five ligands as described in FIG. 22B, a structure in which Ga is replaced with In can be obtained.

In the case of forming a film of an In—Ga—Zn—O-based material as the oxide semiconductor film by a sputtering method, it is preferable to use an In—Ga—Zn—O target having the following atomic ratio: the atomic ratio of In:Ga:Zn is 1:1:1, 4:2:3, 3:1:2, 1:1:2, 2:1:3, or 3:1:4. When an oxide semiconductor film is formed using an In—Ga—Zn—O target having the aforementioned atomic ratio, a polycrystal or a CAAC is easily formed.

In the case of forming a film of an In—Sn—Zn—O-based material as an oxide semiconductor film by a sputtering method, it is preferable to use an In—Sn—Zn—O target having an atomic ratio of In:Sn:Zn=1:1:1, 2:1:3, 1:2:2, or 20:45:35. When an oxide semiconductor film is formed using an In—Sn—Zn—O target having the aforementioned atomic ratio, a polycrystal or a CAAC is easily formed.

The actually measured field-effect mobility of an insulated gate transistor can be lower than its original mobility because of a variety of reasons; this phenomenon occurs not only in the case of using an oxide semiconductor. One of the reasons that reduce the mobility is a defect inside a semiconductor or a defect at an interface between the semiconductor and an insulating film. When a Levinson model is used, the field-effect mobility on the assumption that no defect exists inside the semiconductor can be calculated theoretically.

Assuming that the original mobility and the measured field-effect mobility of a semiconductor are $\mu_0$ and $\mu$, respectively, and a potential barrier (such as a grain boundary) exists in the semiconductor, the field-effect mobility $\mu$ can be expressed by the following equation.

$$\mu = \mu_0 \exp\left(-\frac{E}{kT}\right) \qquad \text{[EQUATION 2]}$$

Here, E represents the height of the potential barrier, k represents the Boltzmann constant, and T represents the absolute temperature. When the potential barrier is assumed to be attributed to a defect, the height of the potential barrier can be expressed by the following equation according to the Levinson model.

$$E = \frac{e^2 N^2}{8\varepsilon n} = \frac{e^3 N^2 t}{8\varepsilon C_{ox} V_g} \qquad \text{[EQUATION 3]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer. The drain current $I_d$ in a linear region can be expressed by the following equation.

$$I_d = \frac{W \mu V_g V_d C_{ox}}{L} \exp\left(-\frac{E}{kT}\right) \qquad \text{[EQUATION 4]}$$

Here, L represents the channel length and W represents the channel width, and L and W are each 10 μm here. In addition, $V_d$ represents the drain voltage (the voltage between a source and a drain).

When dividing both sides of the above equation by $V_g$ and then taking logarithms of both sides, the following equation can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \qquad \text{[EQUATION 5]}$$

The right side of Equation 5 is a function of $V_g$. From Equation 5, it is found that the defect density N can be obtained from the slope of a line in a graph which is obtained by plotting actual measured values with $\ln(I_d/V_g)$ as the ordinate and $1/V_g$ as the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1 \times 10^{12}/\text{cm}^2$.

On the basis of the defect density obtained in this manner, or the like, $\mu_0$ can be calculated to be 120 cm$^2$/Vs from Equation 2 and Equation 3. The measured mobility of an In—Sn—Zn-based oxide including a defect is approximately 35 cm$^2$/Vs. However, assuming that no defect exists inside the semiconductor and at the interface between the semiconductor and an insulating film, the mobility $\mu_0$ of the oxide semiconductor is expected to be 120 cm$^2$/Vs.

Note that even when no defect exists inside a semiconductor, scattering at the interface between a channel and a gate insulating film affects the transport property of the transistor. In other words, the mobility $\mu_1$ at a position that is distance x away from the interface between the channel and the gate insulating film can be expressed by the following equation.

$$\frac{1}{\mu_1} = \frac{1}{\mu_0} + \frac{D}{B}\exp\left(-\frac{x}{G}\right) \qquad \text{[EQUATION 6]}$$

Here, D represents the electric field in the gate direction, and B and G are constants. B and G can be obtained from actual measurement results; according to the above measurement results, B is $4.75 \times 10^7$ cm/s and G is 10 nm (the depth to which the influence of interface scattering reaches). When D is increased (i.e., when the gate voltage $V_g$ is increased), the second term of Equation 6 is increased and accordingly the mobility $\mu_1$ is decreased.

Figure 25:
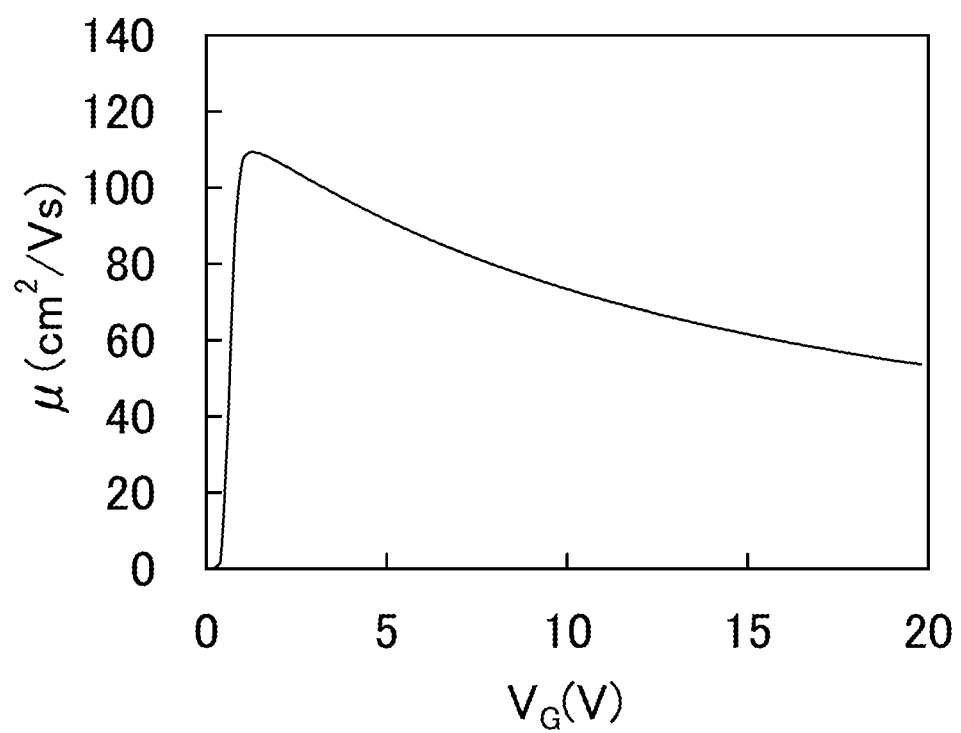
FIG. 25 shows dependence of mobility on gate voltage, obtained by calculation.

Calculation results of the mobility $\mu_2$ of a transistor in which a channel includes an ideal oxide semiconductor without a defect inside the semiconductor are shown in FIG. 25. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. These values were obtained by measurement of a thin film that was formed by a sputtering method.

Further, the work functions of a gate, a source, and a drain were assumed to be 5.5 eV, 4.6 eV, and 4.6 eV, respectively. The thickness of a gate insulating film was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 25, the mobility has a peak of more than 100 cm$^2$/Vs at a gate voltage $V_g$ that is a little over 1 V and is decreased as the gate voltage $V_g$ becomes higher because the influence of interface scattering is increased. Note that in order to reduce interface scattering, it is preferable that a surface of the semiconductor layer be flat at the atomic level (atomic layer flatness).

Calculation results of characteristics of minute transistors which are manufactured using an oxide semiconductor having such a mobility are shown in FIGS. 26A to 26C, FIGS. 27A to 27C, and FIGS. 28A to 28C. FIGS. 29A and 29B illustrate cross-sectional structures of the transistors used for the calculation. The transistors illustrated in FIGS. 29A and 29B each include a semiconductor region 503a and a semiconductor region 503c which have n type conductivity in an oxide semiconductor layer. The resistivities of the semiconductor region 503a and the semiconductor region 503c are $2 \times 10^{-3}$ Ωcm.

The transistor illustrated in FIG. 29A is formed over a base insulating film 501 and an embedded insulator 502 which is embedded in the base insulating film 501 and formed of aluminum oxide. The transistor includes the semiconductor region 503a, the semiconductor region 503c, an intrinsic semiconductor region 503b serving as a channel formation region therebetween, and a gate electrode 505. The width of the gate electrode 505 is 33 nm.

A gate insulating film 504 is formed between the gate electrode 505 and the semiconductor region 503b. In addition, a sidewall insulator 506a and a sidewall insulator 506b are formed on both side surfaces of the gate electrode 505, and an insulator 507 is formed over the gate electrode 505 so as to prevent a short circuit between the gate electrode 505 and another wiring. The sidewall insulator has a width of 5 nm. A source electrode 508a and a drain electrode 508b are provided in contact with the semiconductor region 503a and the semiconductor region 503c, respectively. Note that the channel width of this transistor is 40 nm.

The transistor of FIG. 29B is the same as the transistor of FIG. 29A in that it is formed over the base insulating film 501 and the embedded insulator 502 formed of aluminum oxide and that it includes the semiconductor region 503a, the semiconductor region 503c, the intrinsic semiconductor region 503b provided therebetween, the gate electrode 505 having a width of 33 nm, the gate insulating film 504, the sidewall insulator 506a, the sidewall insulator 506b, the insulator 507, the source electrode 508a, and the drain electrode 508b.

The transistor illustrated in FIG. 29A is different from the transistor illustrated in FIG. 29B in the conductivity type of semiconductor regions under the sidewall insulator 506a and the sidewall insulator 506b. In the transistor illustrated in FIG. 29A, the semiconductor regions under the sidewall insulator 506a and the sidewall insulator 506b are part of the semiconductor region 503a having n⁺-type conductivity and part of the semiconductor region 503c having n⁺-type conductivity, whereas in the transistor illustrated in FIG. 29B, the semiconductor regions under the sidewall insulator 506a and the sidewall insulator 506b are parts of the intrinsic semiconductor region 503b. In other words, in the semiconductor layer of FIG. 29A a region having a width of $L_{off}$ which overlaps with neither the semiconductor region 503a (the semiconductor region 503c) nor the gate electrode 505 is provided. This region is called an offset region, and the width $L_{off}$ is called an offset length. As is seen from FIGS. 29A and 29B, the offset length is equal to the width of the sidewall insulator 506a (the sidewall insulator 506b).

Figure 26A:
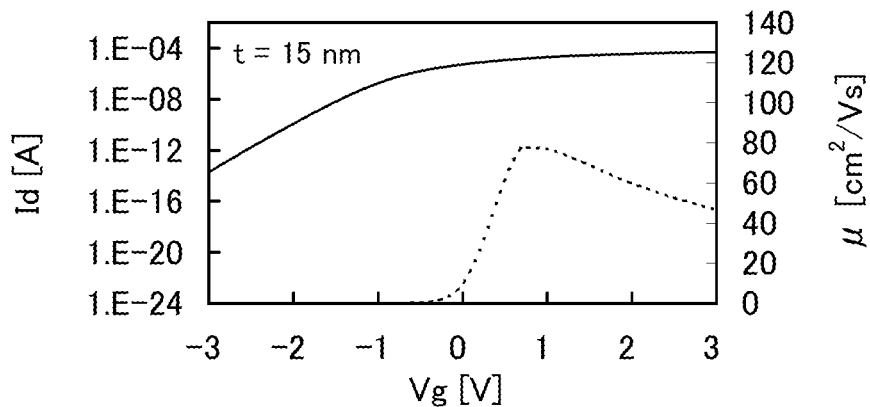
FIGS. 26A to 26C each show gate voltage dependence of drain current and mobility, obtained by calculation.
Figure 26B:
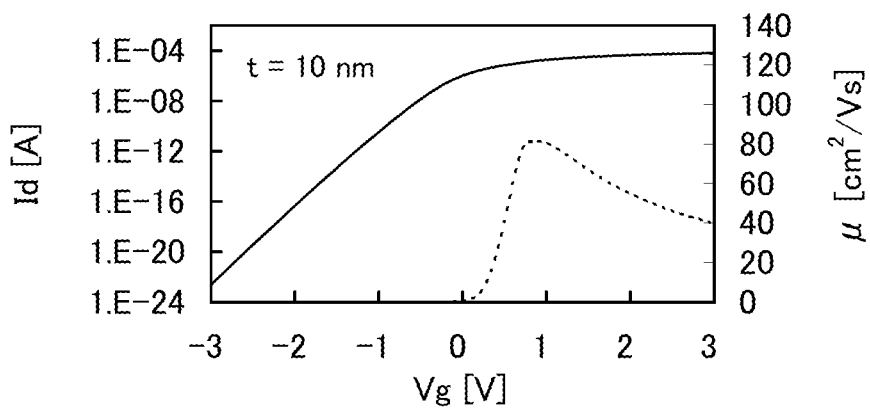
Figure 26C:
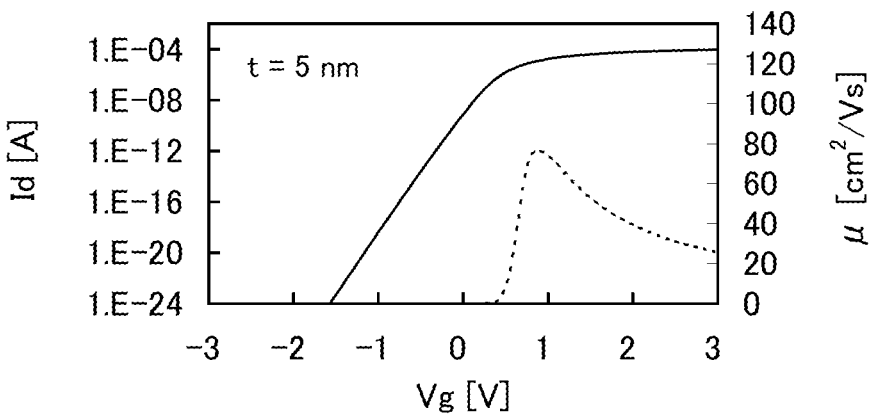

The other parameters used in calculation are as described above. For the calculation, device simulation software Sentaurus Device manufactured by Synopsys, Inc. was used. FIGS. 26A to 26C show the gate voltage ($V_g$: a potential difference between the gate and the source) dependence of the drain current ($I_d$, solid line) and the mobility (μ, dotted line) of the transistor having the structure illustrated in FIG. 29A. The drain current $I_d$ is obtained by calculation under the assumption that the drain voltage (a potential difference between the drain and the source) is +1 V and the mobility μ is obtained by calculation under the assumption that the drain voltage is +0.1 V.

FIG. 26A shows the gate voltage dependence of the transistor in the case where the thickness of the gate insulating film is 15 nm, FIG. 26B shows that of the transistor in the case where the thickness of the gate insulating film is 10 nm, and FIG. 26C shows that of the transistor in the case where the thickness of the gate insulating film is 5 nm. As the thickness of the gate insulating film is smaller, the drain current $I_d$ (off-state current) particularly in an off state is significantly decreased. In contrast, there is no noticeable change in the peak value of the mobility μ and the drain current $I_d$ in an on state (on-state current). The graphs show that the drain current exceeds 10 μA, which is required in a memory element and the like, at a gate voltage of around 1 V.

Figure 27A:
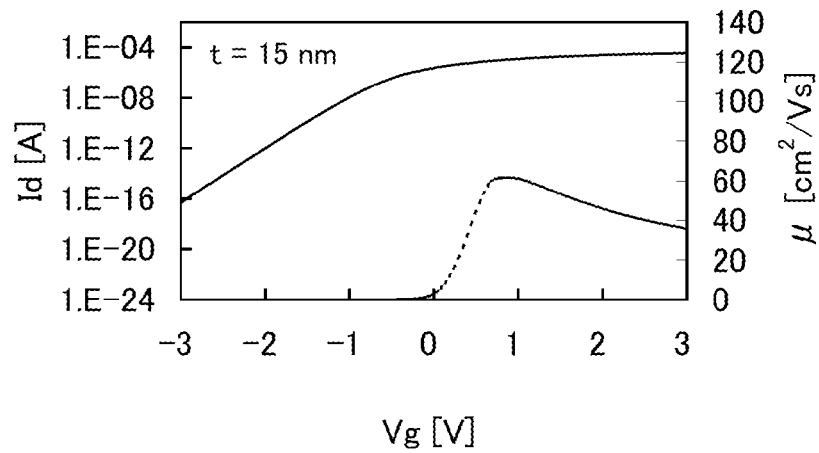
FIGS. 27A to 27C each show gate voltage dependence of drain current and mobility, obtained by calculation.
Figure 27B:
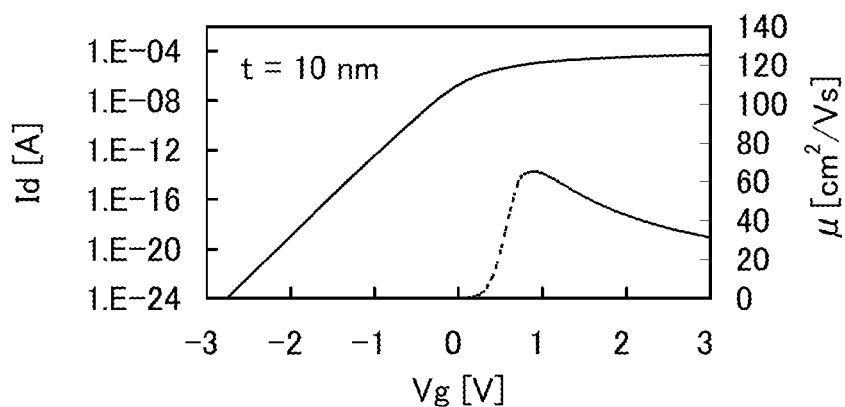
Figure 27C:
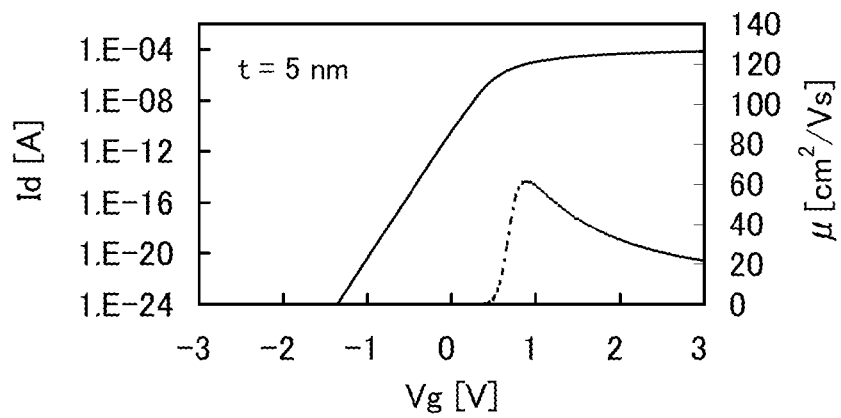

FIGS. 27A to 27C show the gate voltage $V_g$ dependence of the drain current $I_d$ (solid line) and the mobility μ (dotted line) of the transistor having the structure illustrated in FIG. 29B where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. FIG. 27A shows the gate voltage dependence of the transistor in the case where the thickness of the gate insulating film is 15 nm, FIG. 27B shows that of the transistor in the case where the thickness of the gate insulating film is 10 nm, and FIG. 27C shows that of the transistor in the case where the thickness of the gate insulating film is 5 nm.

Figure 28A:
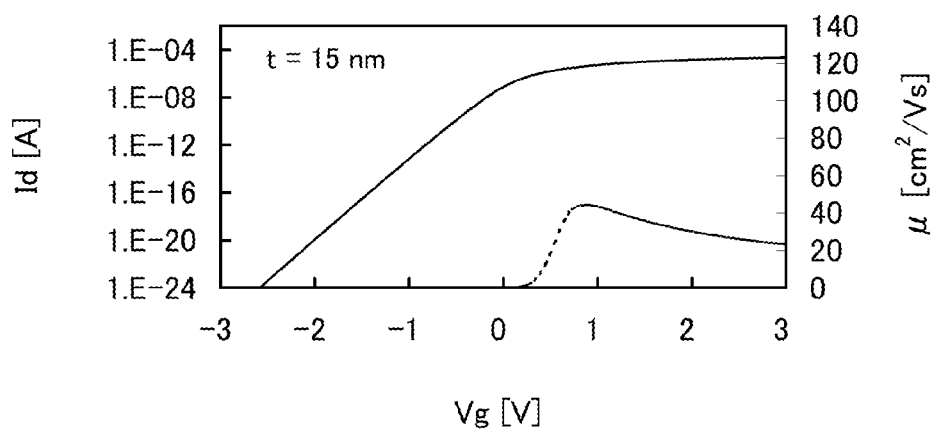
FIGS. 28A to 28C each show dependence of drain current and mobility on gate voltage, obtained by calculation.
Figure 28B:
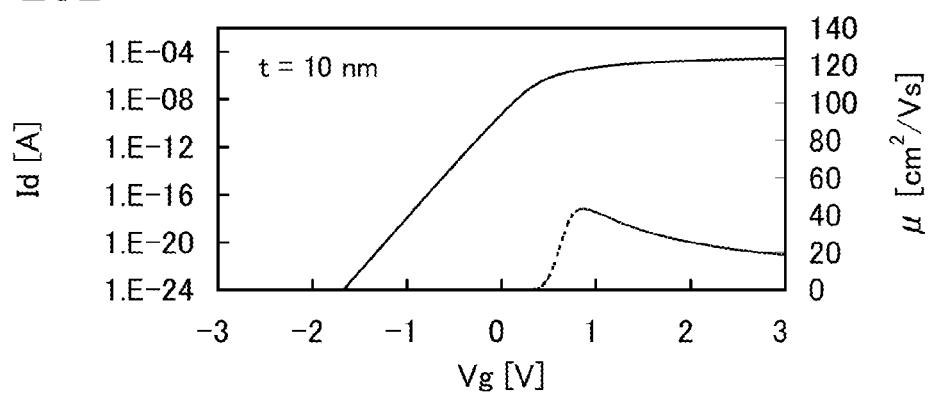
Figure 28C:
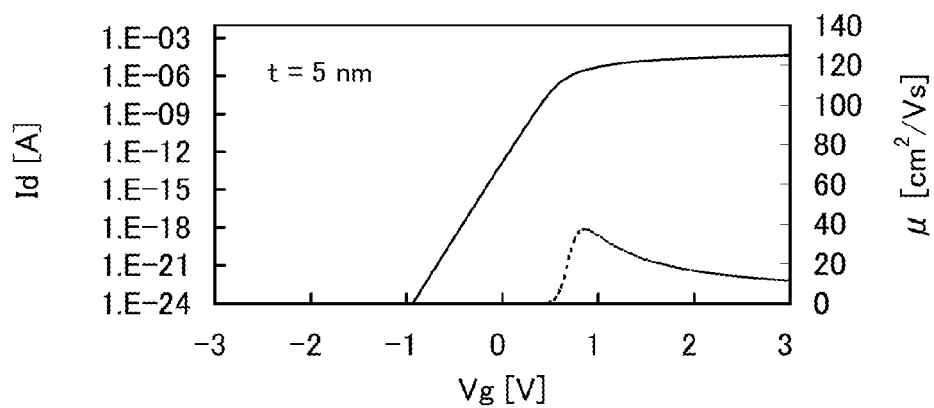
Figure 29A:
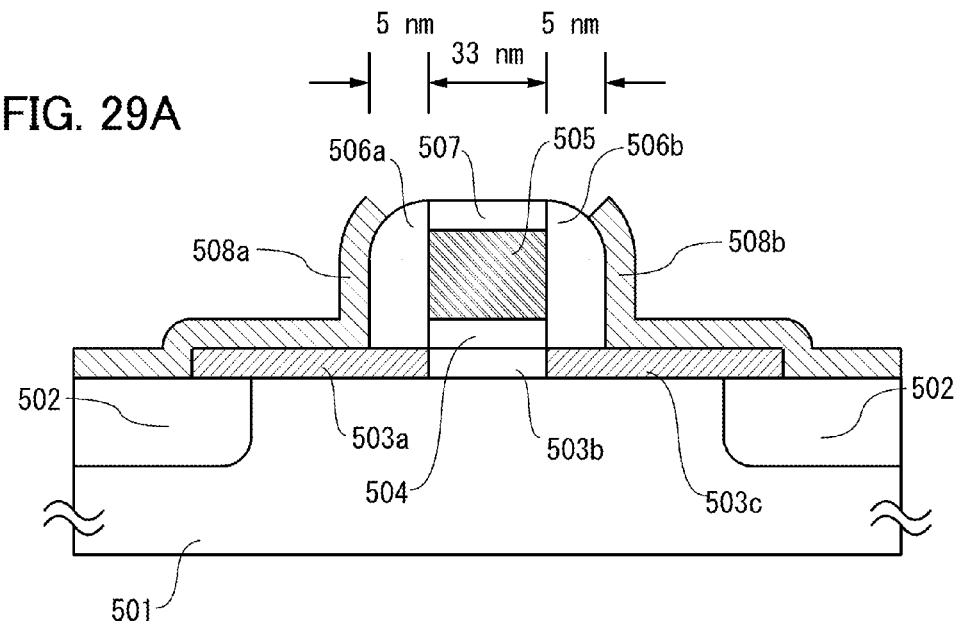
FIGS. 29A and 29B each illustrate a cross-sectional structure of the transistor used for calculation.
Figure 29B:
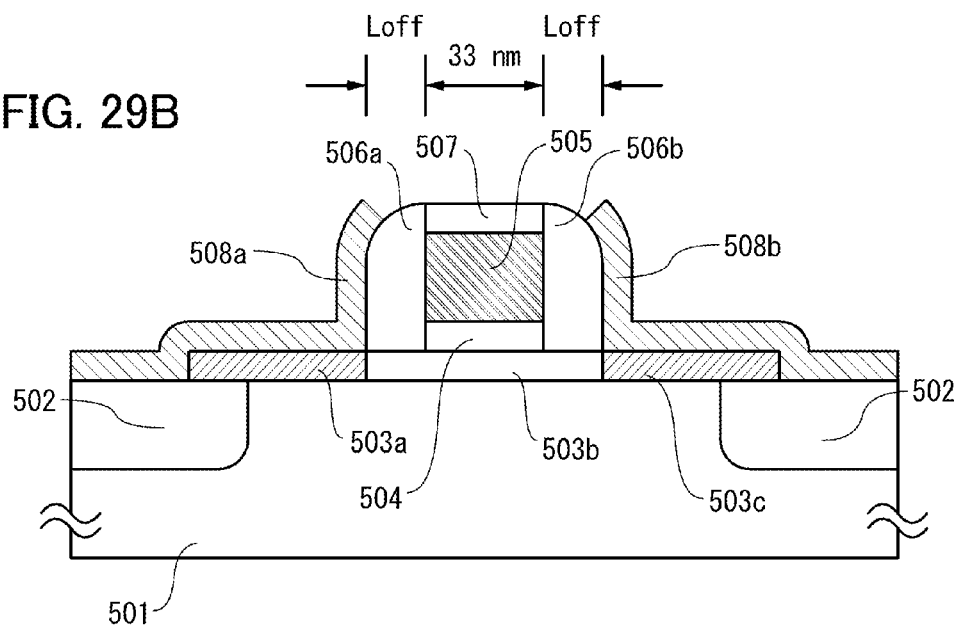

Further, FIGS. 28A to 28C show the gate voltage $V_g$ dependence of the drain current $I_d$ (solid line) and the mobility μ (dotted line) of the transistor having the structure illustrated in FIG. 29B where the offset length $L_{off}$ is 15 nm. The drain current $I_d$ is obtained by calculation under the assumption that the drain voltage $V_d$ is +1 V and the mobility μ is obtained by calculation under the assumption that the drain voltage $V_d$ is +0.1 V. FIG. 28A shows the gate voltage dependence of the transistor in the case where the thickness of the gate insulating film is 15 nm, FIG. 28B shows that of the transistor in the case where the thickness of the gate insulating film is 10 nm, and FIG. 28C shows that of the transistor in the case where the thickness of the gate insulating film is 5 nm.

In either of the structures, as the gate insulating film is thinner, the off-state current is significantly decreased, whereas no noticeable change arises in the peak value of the mobility μ and the on-state current.

Note that the peak of the mobility μ is approximately 80 cm²/Vs in FIGS. 26A to 26C, approximately 60 cm²/Vs in FIGS. 27A to 27C, and approximately 40 cm²/Vs in FIGS. 28A to 28C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current. Further, the graphs show that in either of the structures, the drain current exceeds 10 mA at a gate voltage of around 1 V.

A transistor in which an oxide semiconductor containing In, Sn, and Zn as main components is used for a channel formation region can have favorable characteristics by forming the oxide semiconductor while heating a substrate or by performing heat treatment after the oxide semiconductor film is formed. Note that a main component refers to an element contained in a composition at 5 atomic % or more.

When the oxide semiconductor film containing In, Sn, and Zn as main components is formed while the substrate is intentionally heated, the field-effect mobility of the transistor can be improved. Further, the threshold voltage of the transistor can be positively shifted to make the transistor normally off.

Figure 30A:
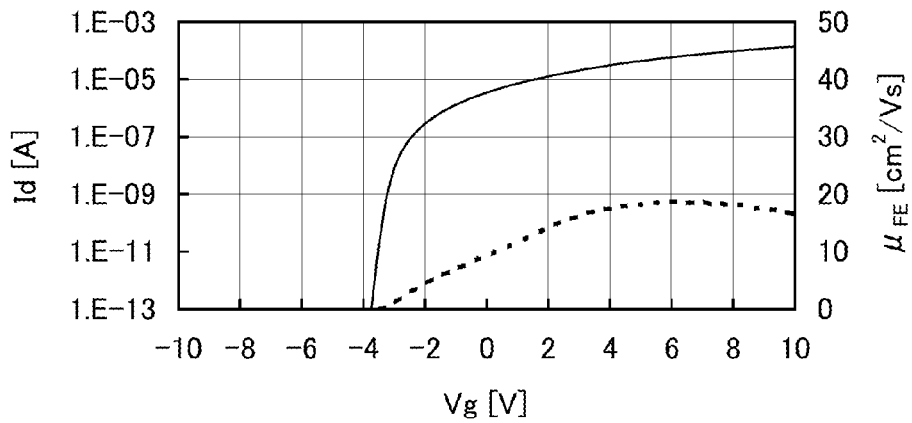
FIGS. 30A to 30C are graphs each showing characteristics of a transistor including an oxide semiconductor film.
Figure 30B:
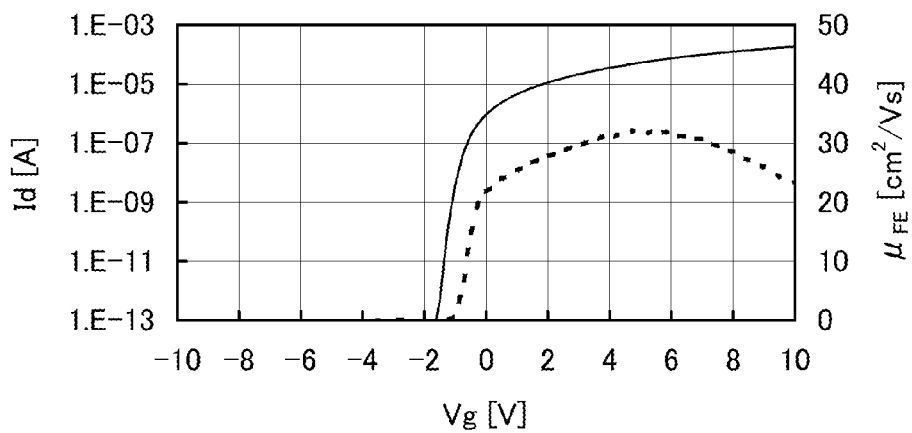
Figure 30C:
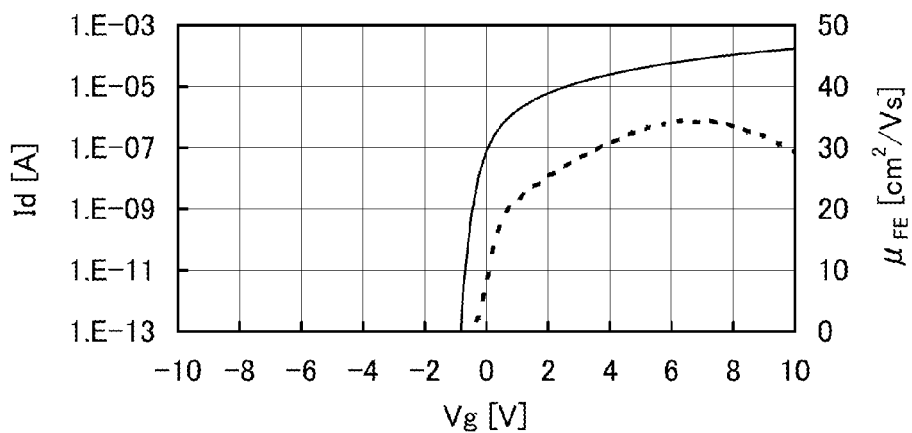

More specifically, FIGS. 30A to 30C each show the gate voltage $V_g$ dependence of the drain current $I_d$ (solid line) and the mobility μ (dotted line) of the transistor.

As an example, FIGS. 30A to 30C are graphs each showing electric characteristics of a transistor in which an oxide semiconductor film containing In, Sn, and Zn as main components and having a channel length L of 3 μm and a channel width W of 10 μm, and a gate insulating film with a thickness of 100 nm are used. Note that $V_d$ was set to 10 V.

FIG. 30A is a graph showing electric characteristics of a transistor whose oxide semiconductor film containing In, Sn, and Zn as main components was formed by a sputtering method without heating a substrate intentionally. The field-effect mobility of the transistor is 18.8 cm²/Vs. On the other hand, when the oxide semiconductor film containing In, Sn, and Zn as main components is formed while heating the substrate intentionally, the field-effect mobility can be improved. FIG. 30B shows electric characteristics of a transistor whose oxide semiconductor film containing In, Sn, and Zn as main components was formed while heating a substrate at 200° C. The mobility of the transistor is 32.2 cm²/Vs.

The field-effect mobility can be further improved by performing heat treatment after formation of the oxide semiconductor film containing In, Sn, and Zn as main components. FIG. 30C shows electric characteristics of a transistor whose oxide semiconductor film containing In, Sn, and Zn as main components was formed by a sputtering method at 200° C. and then subjected to heat treatment at 650° C. The field-effect mobility of the transistor is 34.5 cm²/Vs.

The intentional heating of the substrate can reduce moisture taken into the oxide semiconductor film during the formation by a sputtering method. Further, the heat treatment after film formation enables hydrogen, a hydroxyl group, and moisture to be released and removed from the oxide semiconductor. In this manner, the field-effect mobility can be improved. Such an improvement in field-effect mobility is presumed to be achieved not only by removal of impurities by dehydration or dehydrogenation but also by a reduction in interatomic distance due to an increase in density. The oxide semiconductor can be crystallized by being highly purified by removal of impurities from the oxide semiconductor. In the case of using such a highly purified non-single-crystal oxide semiconductor, ideally, a field-effect mobility exceeding 100 cm²/Vsec is expected to be realized.

The oxide semiconductor containing In, Sn, and Zn as main components may be crystallized in the following manner: oxygen ions are implanted into the oxide semiconductor film, hydrogen, a hydroxyl group, and moisture contained in the oxide semiconductor is released by heat treatment, and the oxide semiconductor is crystallized through the heat treatment or by another heat treatment performed later. By such crystallization treatment or recrystallization treatment, a non-single-crystal oxide semiconductor having favorable crystallinity can be obtained.

The intentional heating of the substrate during film formation and/or the heat treatment after the film formation contributes not only to improving field-effect mobility but also to making the transistor normally off. In a transistor in which an oxide semiconductor film that contains In, Sn, and Zn as main components and is formed without heating a substrate intentionally is used as a channel formation region, the threshold voltage tends to be shifted negatively. However, when the oxide semiconductor film formed while heating the substrate intentionally is used, the problem of the negative shift of the threshold voltage can be solved. That is, the threshold voltage is shifted so that the transistor becomes normally off; this tendency can be confirmed by comparison between FIGS. 30A and 30B.

Note that the threshold voltage can also be controlled by changing the ratio of In, Sn, and Zn; when the composition ratio of In, Sn, and Zn is 2:1:3, a transistor can be normally off. In addition, an oxide semiconductor film having high crystallinity can be obtained when the composition ratio of a target is set as follows: In:Sn:Zn=2:1:3.

The temperature of the intentional heating of the substrate or the temperature of the heat treatment is 150° C. or higher, preferably 200° C. or higher, more preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an intensity of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, 20 V of $V_g$ was applied so that the intensity of an electric field applied to gate insulating films 608 was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, −20 V of $V_g$ was applied so that the intensity of an electric field applied to the gate insulating films 608 was −2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a negative BT test.

Figure 31A:
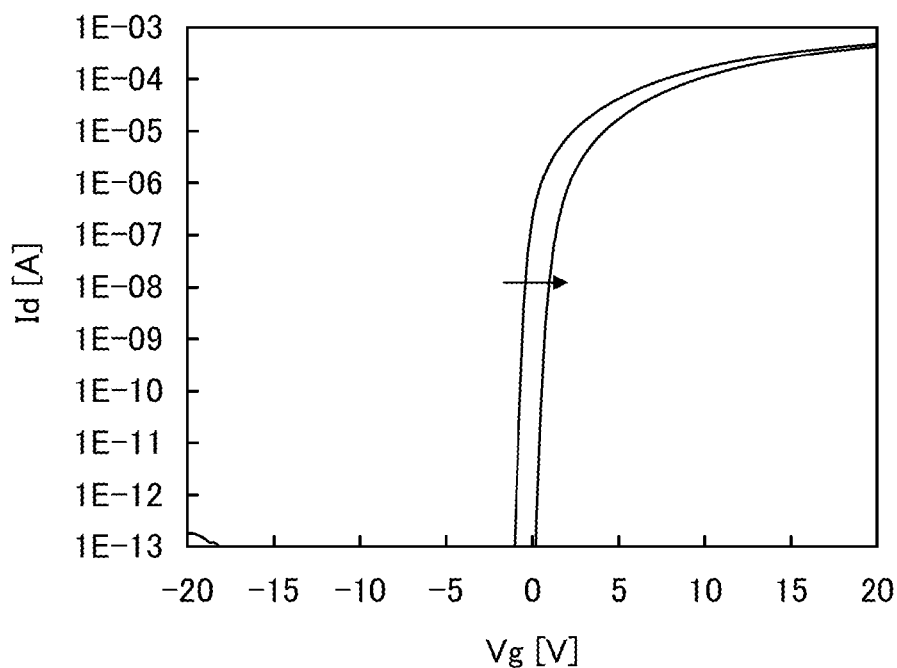
FIGS. 31A and 31B are graphs each showing $V_g$-$I_d$ characteristics of a transistor of Sample 1 which is subjected to a BT test.
Figure 31B:
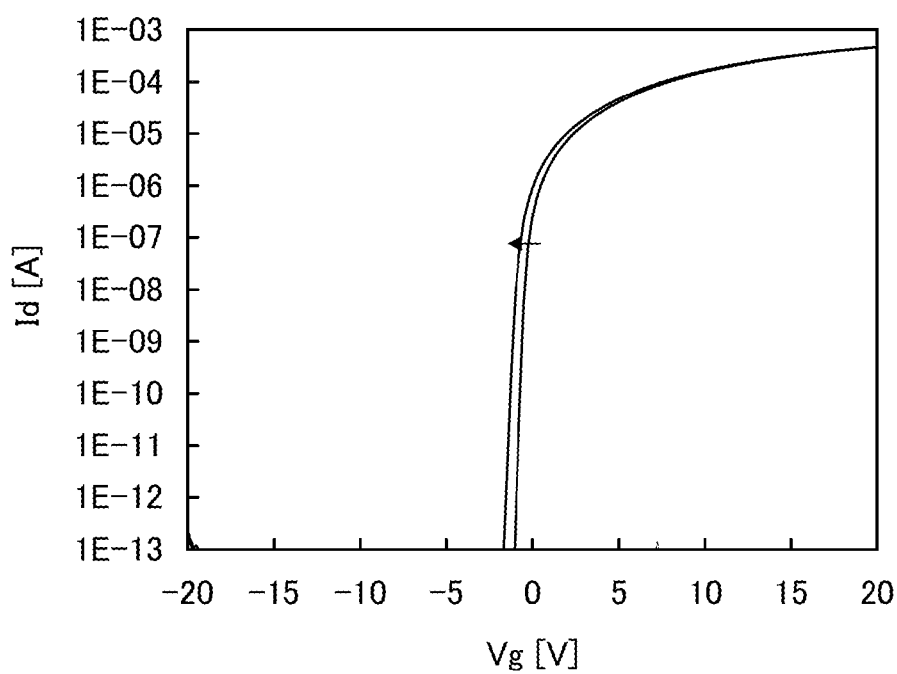
Figure 32A:
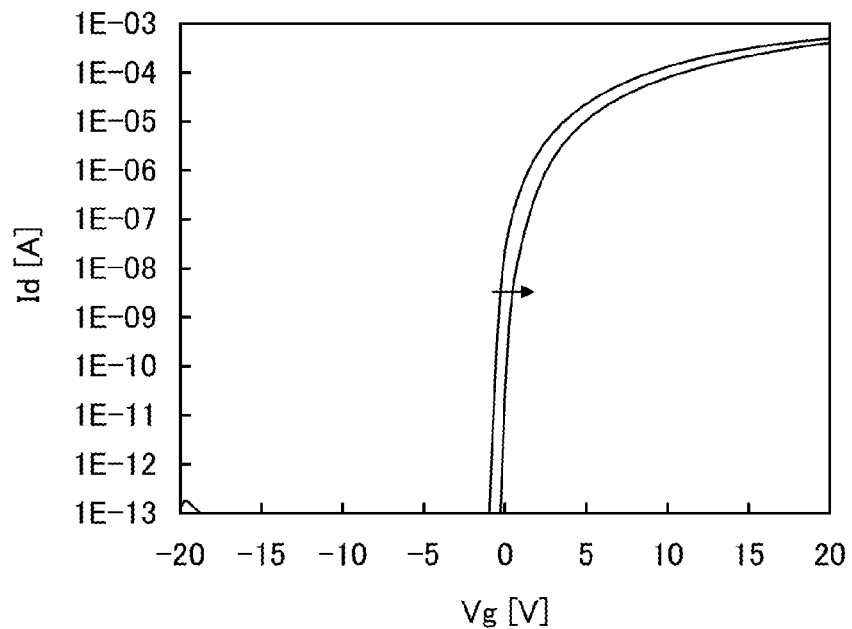
FIGS. 32A and 32B are graphs showing $V_g$-$I_d$ characteristics after a BT test of a transistor of Sample 2.
Figure 32B:
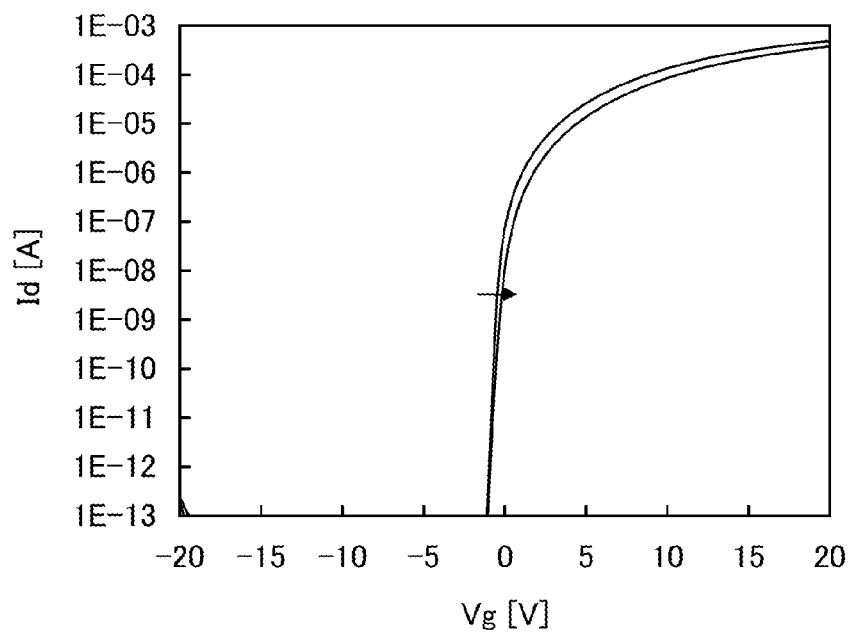

FIGS. 31A and 31B show a result of the positive BT test of Sample 1 and a result of the negative BT test of Sample 1, respectively. FIGS. 32A and 32B show a result of the positive BT test of Sample 2 and a result of the negative BT test of Sample 2, respectively.

The amount of shift in the threshold voltage of Sample 1 due to the positive BT test and that due to the negative BT test were 1.80 V and −0.42 V, respectively. The amount of shift in the threshold voltage of Sample 2 due to the positive BT test and that due to the negative BT test were 0.79 V and 0.76 V, respectively.

It is found that, in each of Sample 1 and Sample 2, the amount of shift in the threshold voltage between before and after the BT tests is small and the reliability thereof is high.

The heat treatment can be performed in an oxygen atmosphere; alternatively, the heat treatment may be performed first in an atmosphere of nitrogen or an inert gas or under reduced pressure, and then in an atmosphere containing oxygen. Oxygen is supplied to the oxide semiconductor after dehydration or dehydrogenation, whereby an effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen vacancies is easily caused in the oxide semiconductor or at the interface between the oxide semiconductor and a film in contact with the oxide semiconductor; however, when excess oxygen is contained in the oxide semiconductor by the heat treatment, oxygen vacancies caused constantly can be filled with excess oxygen. The excess oxygen is oxygen existing mainly between lattices. When the concentration of excess oxygen is set to higher than or equal to $1\times10^{16}/cm^3$ and lower than or equal to $2\times10^{20}/cm^3$, excess oxygen can be contained in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by a sputtering method using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in an X-ray diffraction analysis.

An XRD analysis of an In—Sn—Zn-based oxide film was conducted. The XRD analysis was conducted using an X-ray diffractometer D8 ADVANCE manufactured by Bruker AXS, and measurement was performed by an out-of-plane method.

Sample A and Sample B were prepared and the XRD analysis was performed thereon. Methods for forming Sample A and Sample B are described below.

An In—Sn—Zn-based oxide film with a thickness of 100 nm was formed over a quartz substrate subjected to dehydrogenation treatment.

The In—Sn—Zn-based oxide film was formed with a sputtering apparatus with a power of 100 W (DC) in an oxygen atmosphere. An In—Sn—Zn—O-based target with an atomic ratio of In:Sn:Zn=1:1:1 was used as a target. Note that the substrate heating temperature in film formation was set to 200° C. A sample formed in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample formed in this manner was used as Sample B.

Figure 35:
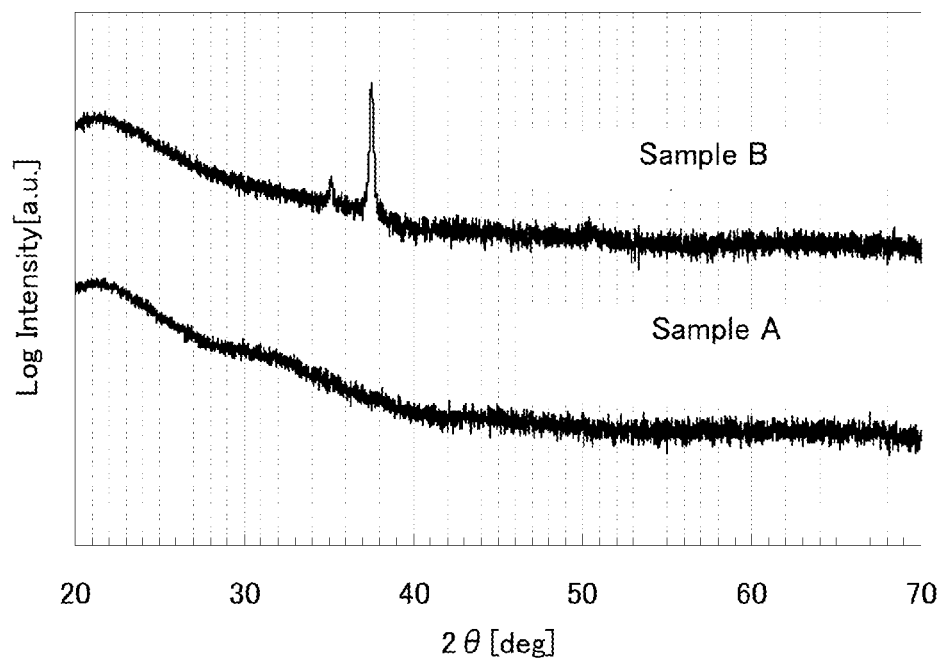
FIG. 35 is a graph showing XRD spectra of Sample A and Sample B.

FIG. 35 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during deposition of an oxide semiconductor containing In, Sn, and Zn as main components and/or by performing heat treatment after the deposition, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by reducing hydrogen serving as a donor impurity from the oxide semiconductor, whereby a transistor can be normally off. The high purification of an oxide semiconductor enables the off-state current of the transistor to be 1 aA/μm or lower. Here, the unit of the off-state current is used to indicate current per micrometer in channel width.

Figure 36:
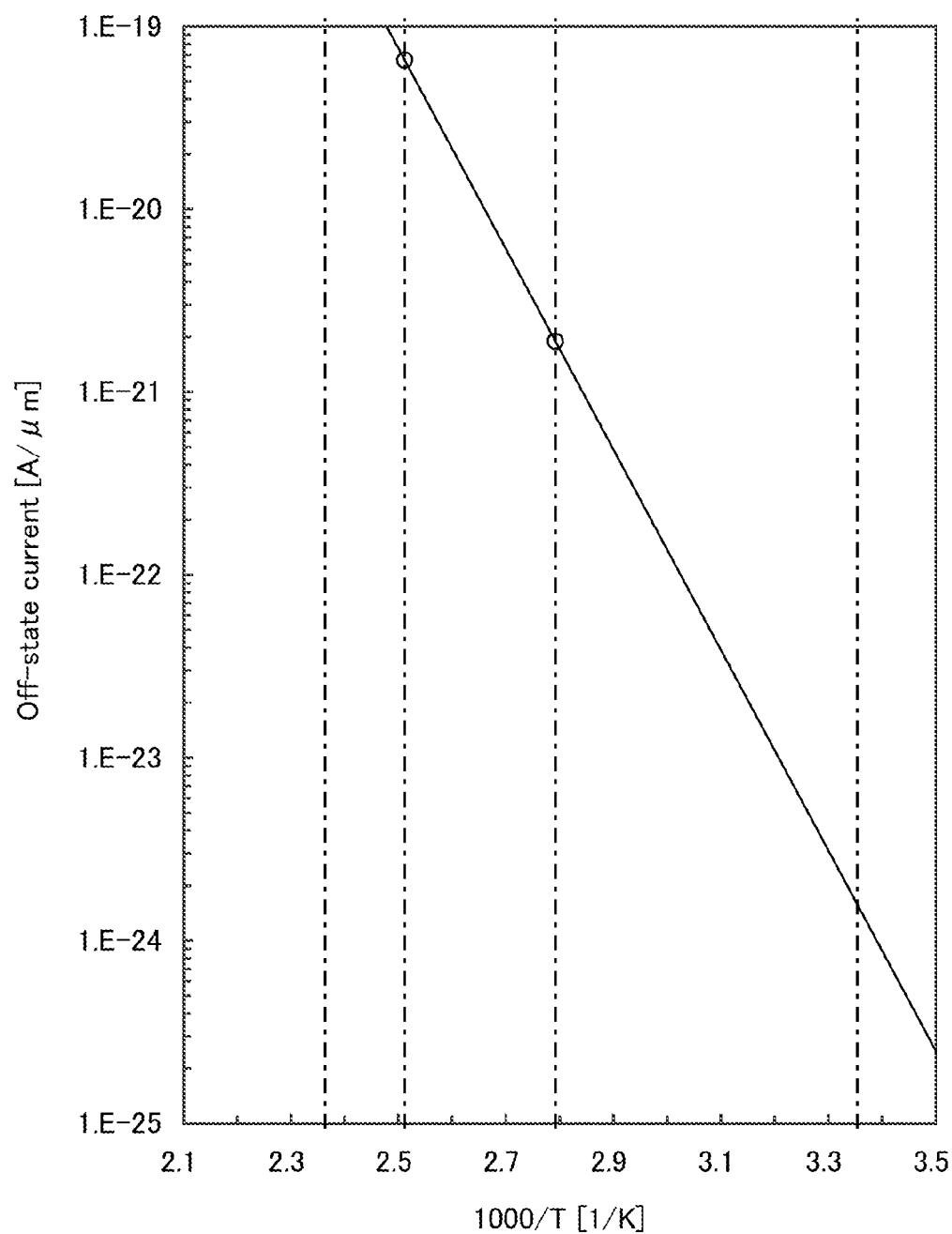
FIG. 36 is a graph showing relation between off-state current and substrate temperature in measurement of a transistor.

FIG. 36 shows the relation between the off-state current of a transistor and the inverse of substrate temperature (absolute temperature) at measurement of the off-state current. In FIG. 36, the horizontal axis represents a value (1000/T) obtained by multiplying an inverse of substrate temperature at measurement by 1000, for the sake of simplicity.

As shown in FIG. 36, the off-state current was 0.1 aA/μm ($1\times10^{-19}$ A/μm) or smaller and 10 zA/μm ($1\times10^{-20}$ A/μm) or smaller when the substrate temperature was 125° C. and 85° C., respectively. The proportional relation between the logarithm of the off-state current and the inverse of the temperature suggests that the off-state current at room temperature (27° C.) is 0.1 zA/μm ($1\times10^{-22}$ A/μm) or smaller. Hence, the off-state current can be 1 aA/μm ($1\times10^{-18}$ A/μm) or smaller, 100 zA/μm ($1\times10^{-19}$ A/μm) or smaller, and 1 zA/μm ($1\times10^{-21}$ A/μm) or smaller at 125° C., 85° C., and room temperature, respectively.

In order to prevent hydrogen and moisture from being contained in the oxide semiconductor film during formation thereof, it is naturally preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being contained in the film. In addition, it is preferable to use a target which is highly purified so as not to contain impurities such as hydrogen and moisture. Although it is possible to remove moisture from a film of an oxide semiconductor containing In, Sn, and Zn as main components by heat treatment, a film which does not contain moisture originally is preferably formed because moisture is released from the oxide semiconductor containing In, Sn, and Zn as main components at a higher temperature than from an oxide semiconductor containing In, Ga, and Zn as main components.

The relation between the substrate temperature and electric characteristics of a transistor formed using Sample B, on which heat treatment at 650° C. was performed after formation of the oxide semiconductor film, was evaluated.

The transistor used for the measurement has a channel length L of 3 μm, a channel width W of 10 μm, Lov on one side of 0 μm, and dW of 0 μm. Note that $V_d$ was set to 10 V. Note that the substrate temperature was −40° C., −25° C., 25° C., 75° C., 125° C., and 150° C. In the transistor, the width of a portion where a gate electrode overlaps with one of a pair of electrodes is referred to as Lov, and the width of a portion of the pair of electrodes, which does not overlap with an oxide semiconductor film, is referred to as dW.

Figure 33:
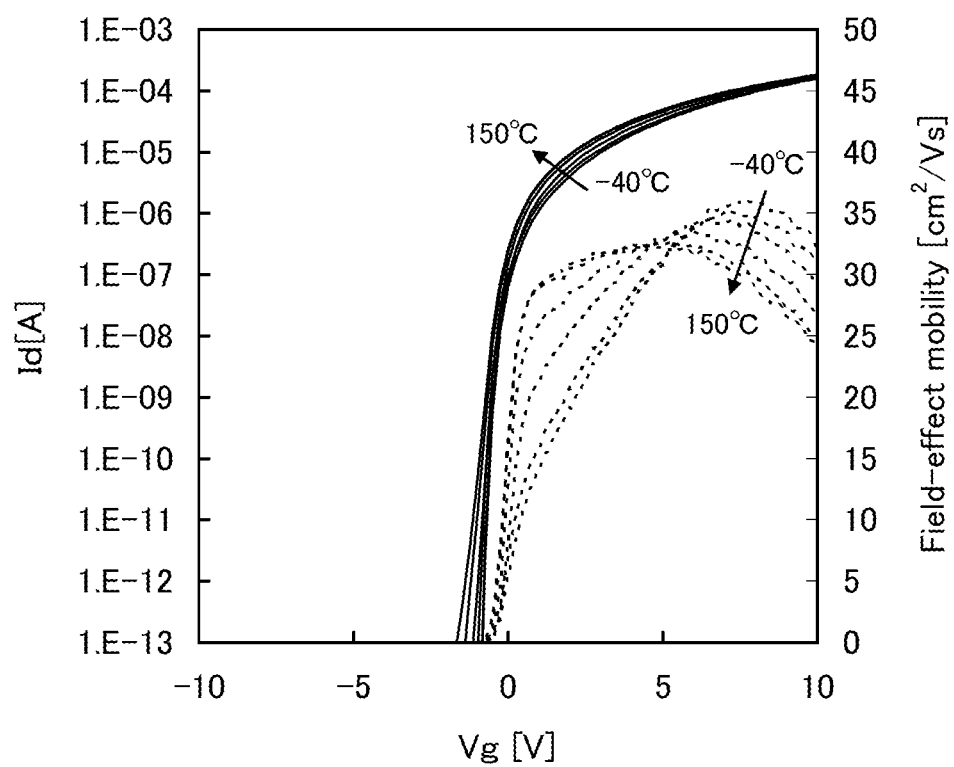
FIG. 33 is a graph showing $V_g$ dependence of $I_d$ and field-effect mobility.

FIG. 33 shows the $V_g$ dependence of $I_d$ (solid line) and field-effect mobility (dotted line). FIG. 29A shows the relation between the substrate temperature and the threshold voltage, and FIG. 29B shows the relation between the substrate temperature and the field-effect mobility.

Figure 34A:
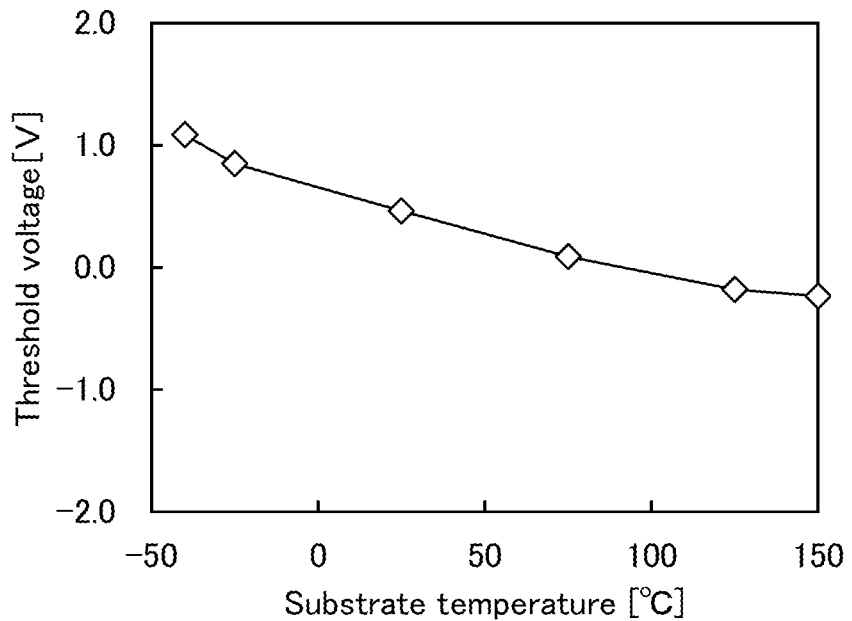
FIG. 34A is a graph showing relation between substrate temperature and threshold voltage.

From FIG. 34A, it is found that the threshold voltage gets lower as the substrate temperature increases. Note that the threshold voltage is decreased from 1.09 V to −0.23 V in the range from −40° C. to 150° C.

Figure 34B:
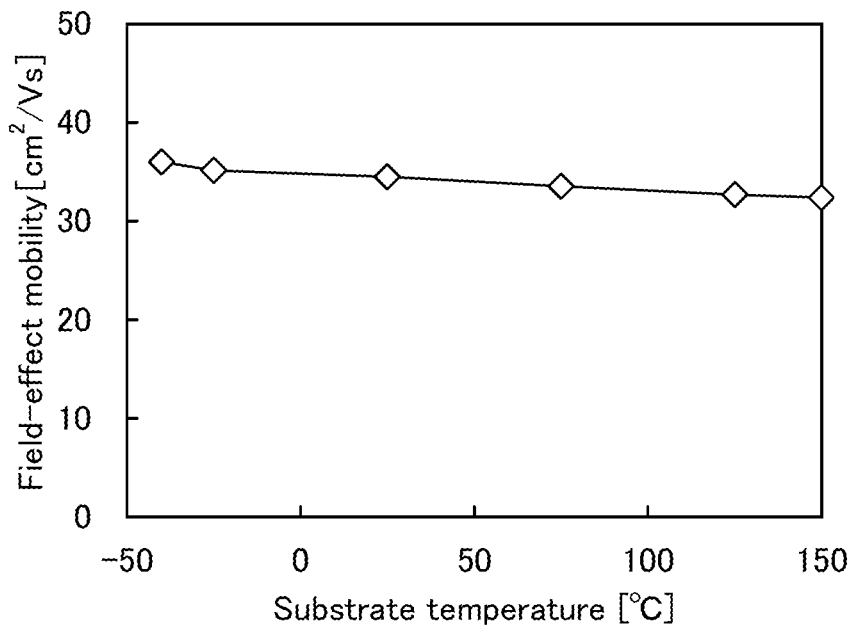
FIG. 34B is a graph showing relation between substrate temperature and field-effect mobility.

From FIG. 34B, it is found that the field-effect mobility gets lower as the substrate temperature increases. Note that the mobility is decreased from 36 cm²/Vs to 32 cm²/Vs in the range from −40° C. to 150° C. Thus, it is found that variation in electric characteristics is small in the above temperature range.

In a transistor in which such an oxide semiconductor containing In, Sn, and Zn as main components is used for a channel formation region, a field-effect mobility of 30 cm²/Vs or higher, preferably 40 cm²/Vs or higher, more preferably 60 cm²/Vs or higher can be obtained with the off-state current maintained at 1 aA/μm or lower, which makes it possible to achieve an on-state current needed for an LSI. For example, in an FET where L/W is 33 nm/40 nm, an on-state current of 12 µA or higher can flow when the gate voltage is 2.7 V and the drain voltage is 1.0 V. In addition, sufficient electric characteristics can be ensured in a temperature range needed for operation of a transistor. With such characteristics, an integrated circuit having a novel function can be realized without decreasing the operation speed even when a transistor including an oxide semiconductor is also provided in an integrated circuit formed using a Si semiconductor.

This embodiment can be implemented in appropriate combination with any of the other embodiments.

EXAMPLE 1

In this example, an example of a transistor in which an In—Sn—Zn—O film is used as an oxide semiconductor film is described with reference to FIGS. 37A and 37B and the like.

Figure 37A:
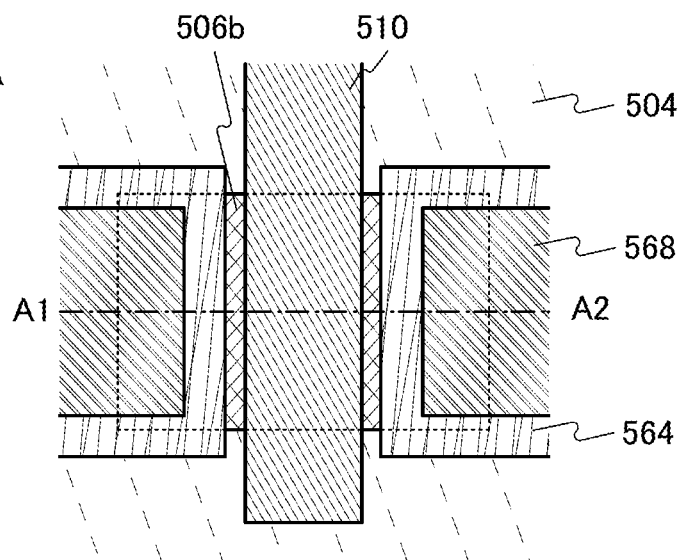
FIGS. 37A and 37B are diagrams illustrating a structure of a transistor.
Figure 37B:
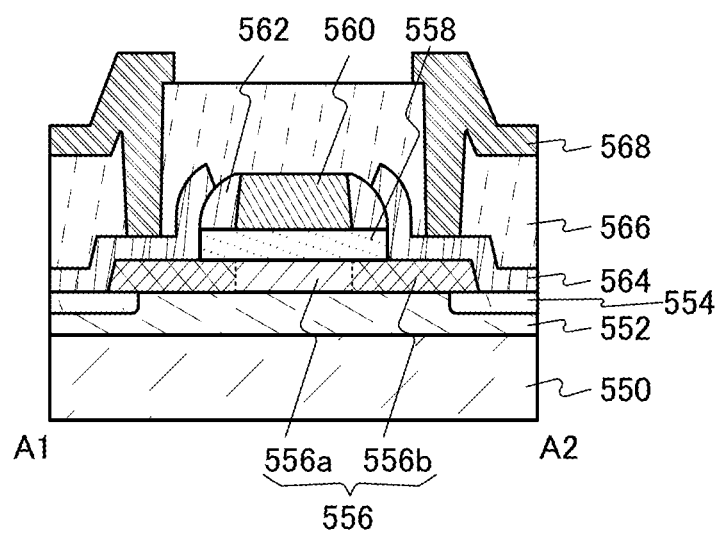

FIGS. 37A and 37B are a top view and a cross-sectional view of a coplanar transistor having a top-gate top-contact structure. FIG. 37A is the top view of the transistor. FIG. 37B is a cross section A1-A2 along dashed-dotted line A1-A2 in FIG. 37A.

The transistor illustrated in FIG. 37B includes a substrate 550; a base insulating layer 552 provided over the substrate 550; a protective insulating film 554 provided in the periphery of the base insulating layer 552; an oxide semiconductor film 556 provided over the base insulating layer 552 and the protective insulating film 554 and including a high-resistance region 556a and low-resistance regions 556b; a gate insulating film 558 provided over the oxide semiconductor film 556; a gate electrode 560 provided to overlap with the oxide semiconductor film 556 with the gate insulating film 558 positioned therebetween; a sidewall insulating film 562 provided in contact with a side surface of the gate electrode 560; a pair of electrodes 564 provided in contact with at least the low-resistance regions 556b; an interlayer insulating film 566 provided to cover at least the oxide semiconductor film 556, the gate electrode 560, and the pair of electrodes 564; and a wiring 568 provided to be connected to at least one of the pair of electrodes 564 through an opening formed in the interlayer insulating film 566.

Although not illustrated, a protective film may be provided to cover the interlayer insulating film 566 and the wiring 568. With the protective film, a minute amount of leakage current generated due to surface conduction of the interlayer insulating film 566 can be reduced and thus the off-state current of the transistor can be reduced.

EXAMPLE 2

In this example, another example of a transistor in which an In—Sn—Zn—O film is used as an oxide semiconductor film is described.

Figure 38A:
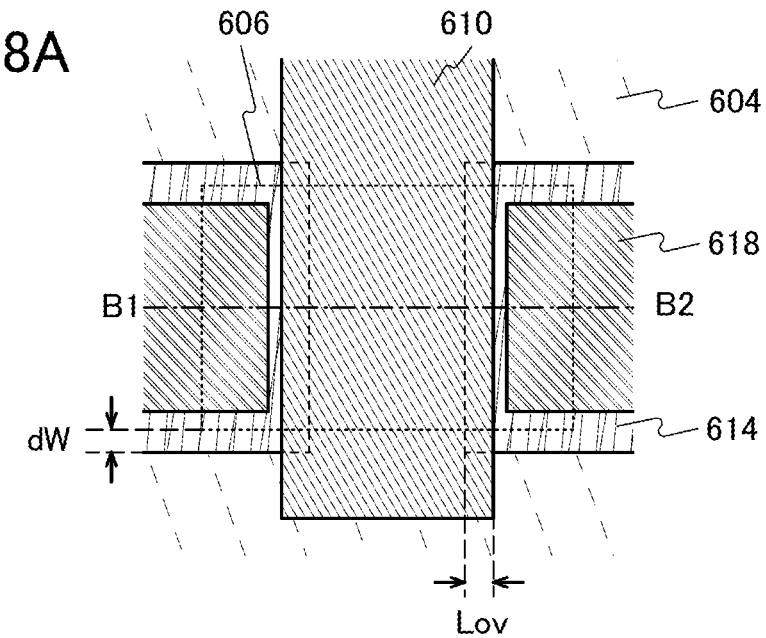
FIGS. 38A and 38B are diagrams illustrating a structure of a transistor.
Figure 38B:
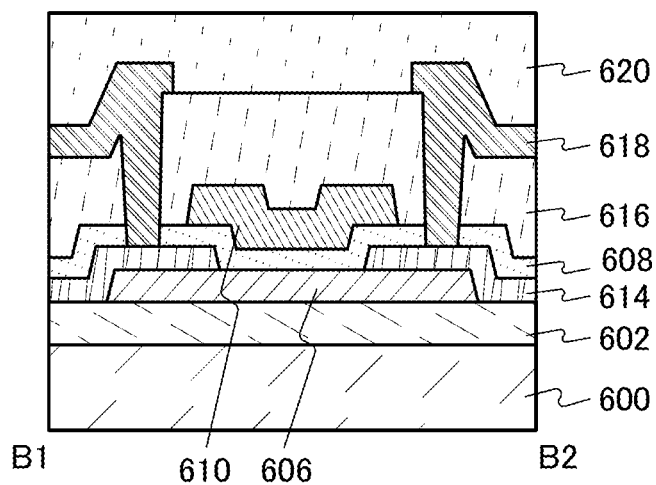

FIGS. 38A and 38B are a top view and a cross-sectional view, which illustrate a structure of a transistor manufactured in this example. FIG. 38A is the top view of the transistor. FIG. 38B is a cross-sectional view along dashed-dotted line B1-B2 in FIG. 38A.

The transistor illustrated in FIG. 38B includes a substrate 600; a base insulating layer 602 provided over the substrate 600; an oxide semiconductor film 606 provided over the base insulating layer 602; a pair of electrodes 614 in contact with the oxide semiconductor film 606; a gate insulating film 608 provided over the oxide semiconductor film 606 and the pair of electrodes 614; a gate electrode 610 provided to overlap with the oxide semiconductor film 606 with the gate insulating film 608 positioned therebetween; an interlayer insulating film 616 provided to cover the gate insulating film 608 and the gate electrode 610; wirings 618 connected to the pair of electrodes 614 through openings formed in the interlayer insulating film 616; and a protective film 620 provided to cover the interlayer insulating film 616 and the wirings 618.

As the substrate 600, a glass substrate can be used. As the base insulating layer 602, a silicon oxide film can be used. As the oxide semiconductor film 606, an In—Sn—Zn—O film can be used. As the pair of electrodes 614, a tungsten film can be used. As the gate insulating film 608, a silicon oxide film can be used. The gate electrode 610 can have a layered structure of a tantalum nitride film and a tungsten film. The interlayer insulating film 616 can have a layered structure of a silicon oxynitride film and a polyimide film. The wirings 618 can each have a layered structure in which a titanium film, an aluminum film, and a titanium film are formed in this order. As the protective film 620, a polyimide film can be used.

Note that in the transistor having the structure illustrated in FIG. 31A, the width of a portion where the gate electrode 610 overlaps with one of the pair of electrodes 614 is referred to as Lov. Similarly, the width of a portion of the pair of electrodes 614, which does not overlap with the oxide semiconductor film 606, is referred to as dW.

This application is based on Japanese Patent Application serial no. 2011-113651 filed with Japan Patent Office on May 20, 2011, the entire contents of which are hereby incorporated by reference.

What is claimed is:

1. A semiconductor device comprising:
   a comparator comprising a first terminal and a second terminal;
   a first memory portion comprising:
      a first transistor comprising a semiconductor layer including an oxide semiconductor; and
      a second transistor comprising a gate electrically connected to one of a source and a drain of the first transistor;
   a second memory portion comprising:
      a third transistor comprising a semiconductor layer including an oxide semiconductor; and
      a fourth transistor comprising a gate electrically connected to one of a source and a drain of the third transistor; and
   a circuit comprising a terminal electrically connected to one of a source and a drain of the second transistor and one of a source and a drain of the fourth transistor,
   wherein:
   the first terminal is electrically connected to the other of the source and the drain of the second transistor; and
   the second terminal is electrically connected to the other of the source and the drain of the fourth transistor.

2. A semiconductor device according to claim 1, wherein:
   the comparator is configured to compare a first output signal with a second output signal;
   the first output signal is outputted from a first output terminal electrically connected to the first terminal; and
   the second output signal is outputted from a second output terminal electrically connected to the second terminal.

3. A semiconductor device according to claim 2,
   wherein the circuit is configured to determine a potential of the first output signal and a potential of the second output signal.

4. A semiconductor device according to claim 1, wherein:
   the second transistor comprises a semiconductor layer including silicon; and the fourth transistor comprises a semiconductor layer including silicon.

5. A semiconductor device according to claim 1, wherein:
the comparator is electrically connected to a high-level reference potential; and
the circuit is electrically connected to a low-level reference potential.

6. A semiconductor device according to claim 1, wherein:
the comparator is electrically connected to a low-level reference potential; and
the circuit is electrically connected to a high-level reference potential.

7. A semiconductor device according to claim 1, further comprising:
a first capacitor comprising an electrode electrically connected to the one of the source and the drain of the first transistor and the gate of the second transistor; and
a second capacitor comprising an electrode electrically connected to the one of the source and the drain of the third transistor and the gate of the fourth transistor.

8. A semiconductor device according to claim 1,
wherein the comparator comprises a transistor comprising a semiconductor layer including silicon.

9. A semiconductor device according to claim 1,
wherein the comparator comprises a transistor comprising a semiconductor layer including an oxide semiconductor.

10. A semiconductor device according to claim 1,
wherein the circuit comprises a transistor comprising a semiconductor layer including silicon.

11. A semiconductor device according to claim 1,
wherein the circuit comprises a transistor comprising a semiconductor layer including an oxide semiconductor layer.

12. A central processing unit comprising the semiconductor device according to claim 1.

13. A semiconductor device comprising:
a comparator configured to compare a first output signal with a second output signal, the comparator comprising a first terminal and a second terminal;
a first memory portion comprising:
  a first transistor comprising a semiconductor layer including an oxide semiconductor; and
  a second transistor comprising a gate electrically connected to one of a source and a drain of the first transistor, the second transistor comprising a semiconductor layer including an oxide semiconductor;
a second memory portion comprising:
  a third transistor comprising a semiconductor layer including an oxide semiconductor; and
  a fourth transistor comprising a gate electrically connected to one of a source and a drain of the third transistor, the fourth transistor comprising a semiconductor layer including an oxide semiconductor; and
a circuit comprising a terminal electrically connected to one of a source and a drain of the second transistor and one of a source and a drain of the fourth transistor,
wherein:
the first terminal is electrically connected to the other of the source and the drain of the second transistor; and
the second terminal is electrically connected to the other of the source and the drain of the fourth transistor.

14. A semiconductor device according to claim 13, wherein:
the comparator is configured to compare a first output signal with a second output signal;
the first output signal is outputted from a first output terminal electrically connected to the first terminal; and
the second output signal is outputted from a second output terminal electrically connected to the second terminal.

15. A semiconductor device according to claim 14,
wherein the circuit is configured to determine a potential of the first output signal and a potential of the second output signal.

16. A semiconductor device according to claim 13, wherein:
the comparator is electrically connected to a high-level reference potential; and
the circuit is electrically connected to a low-level reference potential.

17. A semiconductor device according to claim 13, wherein:
the comparator is electrically connected to a low-level reference potential; and
the circuit is electrically connected to a high-level reference potential.

18. A semiconductor device according to claim 13, further comprising:
a first capacitor comprising an electrode electrically connected to the one of the source and the drain of the first transistor and the gate of the second transistor; and
a second capacitor comprising an electrode electrically connected to the one of the source and the drain of the third transistor and the gate of the fourth transistor.

19. A semiconductor device according to claim 13,
wherein the comparator comprises a transistor comprising a semiconductor layer including silicon.

20. A semiconductor device according to claim 13,
wherein the comparator comprises a transistor comprising a semiconductor layer including an oxide semiconductor.

21. A semiconductor device according to claim 13,
wherein the circuit comprises a transistor comprising a semiconductor layer including silicon.

22. A semiconductor device according to claim 13,
wherein the circuit comprises a transistor comprising a semiconductor layer including an oxide semiconductor layer.

23. A central processing unit comprising the semiconductor device according to claim 13.

* * * * *